United States Patent
Hidaka et al.

(10) Patent No.: US 6,699,726 B2
(45) Date of Patent: Mar. 2, 2004

(54) SEMICONDUCTOR DEVICE AND METHOD FOR THE MANUFACTURE THEREOF

(75) Inventors: Osamu Hidaka, Tokyo (JP); Sumito Ootsuki, Yokohama (JP); Hiroshi Mochizuki, Tokyo (JP); Hiroyuki Kanaya, Yokohama (JP); Kumi Okuwada, Kawasaki (JP); Tomio Katata, Yokohama (JP); Norihisa Arai, Omiya (JP); Hiroyuki Takenaka, Kamakura (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 28 days.

(21) Appl. No.: 10/336,012

(22) Filed: Jan. 3, 2003

(65) Prior Publication Data

US 2003/0134464 A1 Jul. 17, 2003

Related U.S. Application Data

(62) Division of application No. 09/102,616, filed on Jun. 23, 1998, now Pat. No. 6,521,927.

(30) Foreign Application Priority Data

Jun. 24, 1997 (JP) ............................................. 9-166750

(51) Int. Cl.[7] .................................................. H01G 7/06
(52) U.S. Cl. .............................. 438/3; 438/240; 438/253
(58) Field of Search ..................... 438/3, 240, 253–256, 438/396–399

(56) References Cited

U.S. PATENT DOCUMENTS

| | | | |
|---|---|---|---|
| 4,271,582 A | 6/1981 | Shirai et al. ................ 438/301 |
| 4,707,897 A | 11/1987 | Rohrer et al. .............. 29/25.42 |
| 4,873,664 A | 10/1989 | Eaton, Jr. .................... 365/145 |
| 5,146,299 A | 9/1992 | Lampe et al. ............... 257/295 |
| 5,214,300 A | 5/1993 | Rohrer et al. ............... 257/295 |
| 5,335,138 A | 8/1994 | Sandhu et al. .............. 257/310 |
| 5,416,042 A | 5/1995 | Beach et al. ................ 257/295 |
| 5,591,663 A | * 1/1997 | Arita et al. |
| 5,627,391 A | 5/1997 | Shimada et al. ............ 257/295 |
| 5,638,319 A | 6/1997 | Onishi et al. ............... 257/295 |
| 5,892,255 A | 4/1999 | Evans, Jr. et al. .......... 257/295 |

* cited by examiner

Primary Examiner—H. Jey Tsai
(74) Attorney, Agent, or Firm—Banner & Witcoff, Ltd.

(57) ABSTRACT

The semiconductor device is constituted in such a manner that a switching transistor having a drain region and a source region which are comprised of an impurity-diffused region is formed in the surface layer portion of a semiconductor substrate. On the semiconductor substrate containing the transistor, a first insulation film is formed, and, at the upper layer side of the first insulation film, a capacitor is formed. The capacitor is comprised of a lower electrode, an inter-electrode insulation film comprising one of ferroelectric and high-permittivity dielectric, and an upper electrode. Before the inter-electrode insulation film is formed, a second insulation film is formed so as to cover the side face portion of the inter-electrode insulation film, the second insulation film protecting the side face portion of the inter-electrode insulation film. One of the drain region and the source region and one of the upper electrode and the lower electrode of the capacitor are connected to each other by an electrode wiring. A wiring connected to the other one of the drain region and the source region is formed on the semiconductor substrate.

2 Claims, 31 Drawing Sheets

SEMICONDUCTOR DEVICE AND METHOD FOR THE MANUFACTURE THEREOF

This application is a Divisional of U.S. application Ser. No. 09/102,616 filed on Jun. 23, 1998 now U.S. Pat. No. 6,521,927.

BACKGROUND OF THE INVENTION

The present invention relates to a semiconductor device comprising an array of memory cells in each of which a composite oxide film is used as the insulation film of an information storage capacitor and a method for the manufacture of the semiconductor device and, more particularly, a semiconductor device and a method for the manufacture of the semiconductor device, the semiconductor device being applied to a semiconductor integrated circuit including FRAM or DRAM and improved in respect of the protective structure—and the steps of forming the structure—for protecting the capacitor insulator film and the wiring in a ferroelectric memory (FRAM) comprising an array of memory cells each using an ferroelectric film as the capacitor insulation film or in a dynamic random access memory (DRAM) comprising an array of dynamic memory cells each using an ferromagnetic film as the capacitor insulator film.

Recently, attention is being drawn to a non-volatile ferroelectric memory cells (FRAM cells) using, as the interelectrode insulation films, ferroelectric films composed of a material the perofskite structure or the lamellar perofskite structure and also to FRAM including an array consisting of the cells.

A ferroelectric film possesses the characteristic that the electric polarization once generated when an electric field is applied thereto remains even after the electric field ceases to be applied, and, when an electric field having an intensity higher than a certain value is applied, the direction of the electric polarization is reversed.

By paying attention to this polarization characteristic of this dielectric that the direction of the electric polarization thereof reverses, the technique of realizing FRAM cells by the use of ferroelectric for the insulator films of the information recording capacitors of the memory cells has been developed.

These FRAM cells are constituted in such a manner that the capacitors of the DRAM cells are replaced by ferroelectric capacitors and thus based on the method (data destructive read system) according to which, through the switching MOS transistors, the charges when the direction of the polarization is reversed or non-reversed are derived through the switching MOS transistors from the ferroelectric capacitors, and this system has the characteristic that, even if the operating power supply is turned off, the storage data written in the memory cells is not lost.

The FRAM has the feature, in view of the comparison thereof with the DRAM which is a representative of the large-capacity memories, that, since the FRAM is non-volatile, no refresh operation is needed for holding the data thereof, and no power is consumed during standby. Further, in view of the comparison of the FRAM with the flash memory which is another non-volatile memory, the FRAM has the feature that the frequency of data rewriting can be larger, and the data rewriting speed is markedly higher. Moreover, in view of the comparison thereof with the SRAM which is used for memory cards etc. and can be backed up by battery, the FRAM has the feature that the power consumption thereof is smaller, and the cell area can be decreased to a substantial degree.

The FRAM which has features as mentioned above are expected much connection with the replacement thereby of the existing DRAM, flash memory and SRAM, the application thereof to logic hybrid devices, etc. Further, the FRAM can operate at high speed without the use of a battery and, therefore, the development thereof into non-contact cards such as RF-ID: Radio Frequency-Identification etc, is being started.

As mentioned above, the FRAM cell can operate at high speed and yet with a low power consumption and, thus, is expected to be integrated at a high degree of integration. Thus, the reduction in area of the memory cell and a manufacturing process accompanied by a reduced deterioration of the ferromagnetic need to be examined. Further, the multi-layer wiring technique which is indispensably necessary in case of mounting the existing FRAM device compositely with other devices and for realization of a high-degree integration thereof has not been established yet at present.

The reason why it is difficult for semiconductor integrated circuits with FRAM devices mounted thereon to be realized in a multi-layer wiring structure lies in the fact that the ferroelectric material is very weak to a reducing atmosphere (particularly, a hydrogen atmosphere). Most of the existing LSI processes are of the type in which hydrogen is mixed in, which gives a serious problem to the manufacture of FRAM.

That is, according to the conventional technique of forming FRAM cells, as shown in, e.g. FIG. 1, after an element isolation region 102 is formed in a silicon substrate 101, a gate insulation film 103 is formed, a gate electrode 104, a gate protecting insulation film 105, and drain-source regions (diffused layer regions) 106 and 107 are successively formed, whereby a pass transistor (switching MOS transistor) is formed. Thereafter, a BPSG film 201 or the like is deposited and flattened, and, on the upper layer thereof, a lower electrode 401, a ferroelectric film 402 and an upper electrode 402 are deposited in this order and subjected to patterning, respectively, to dispose a ferroelectric capacitor, on the upper layer thereof, an insulation film (such as, e.g. plasma TEOS) 207 is deposited, through a contact hole bored in the insulation film 207 and the BPSG film 201, a local wiring 301 is provided, further, on the upper layer thereof, an insulation film 203 is deposited, and through contact holes bored in this insulation film 203 etc., metal wirings 302 and 303 are provided, after which a passivation film is provided for protection.

Here, as the ferroelectric of the FRAM cell capacitor, there are used oxides containing the perofskite structure such as PZT (Pb (Zr, Ti) $O_3$, lead zirconate titanate), SBT ($SrBi_2Ta_2O_9$: strontium bismuth tantalum), BIT ($Bi_4Ti_3O_{12}$), etc. or such oxides which have each been partially replaced by a substitute element.

Further, generally in case PZT or SBT is used as the ferroelectric material, a rare metal or an electrically conductive oxide such as Pt (platinum), Ir, Ir oxide ($IrO_2$), Ru, Ru oxide ($RuO_2$), LSCO or the like. is used as the electrode material of the ferroelectric capacitor.

As described above, in case of forming the ferroelectric capacitor, generally the lower electrode is formed by the use of Pt, and thereafter, the ferroelectric thin-film is formed, in which case, when the ferroelectric thin-film is formed and crystallized, a high-temperature oxygen annealing is needed.

Here, in case PZT is used as the ferroelectric material, the capacitor characteristics are deteriorated by the occurrence of a defect due to the diffusion of Pb in the PZT in case the oxidation is insufficient. The oxygen annealing temperature necessary to effect a sufficient oxidation so as to avoid the above-mentioned deterioration is ordinarily 600° C. to 700° C.

Further, in case a bismuth lamellar compound such as SBT or the like is used as the ferroelectric material, the necessary oxygen annealing temperature is ordinarily so high as 800° C.

However, in case of the structure in which the lower electrode (such as, e.g. Pt) of the ferroelectric capacitor and the transfer gate (pass transistor) are connected to each other by means of a polycrystalline silicon plug, there arises the problem that, when the oxygen annealing of a high temperature as mentioned above is performed, the lower electrode composed of Pt reacts with the polycrystalline silicon plug into a silicide or the problem that the polycrystalline silicon plug is oxidized.

On the other hand, in case of the structure in which the upper electrode of the ferroelectric capacitor and the transfer gate are connected to each other directly by a local electrode wiring comprising a buried contact, it becomes difficult to form the local electrode wiring for directly connecting the upper electrode and the pass transistor to each other in respect of the aspect ratio or the step coverage related to the miniaturization. Further, in case PZT or SBT is used as the ferroelectric material, the problem to be taken up is the reducing atmosphere at the respective CVD (chemical vapor deposition) steps carried out for the formation of electrode wirings after the formation of ferroelectric thin-film, that is, there arises the problem that the characteristics of the ferroelectric material are deteriorate by the reducing reaction.

In other words, if, in case of forming the local electrode wiring for connecting the upper electrode and the transfer gate to each other, it is attempted to effect the burying of the tungsten plug by forming a W (tungsten) film in a strong reducing atmosphere (a hydrogen-based gas) using a metal CVD apparatus as is used in connection with DRAM, then the characteristics (electric characteristics such as the amount of remanent polarization etc.) of the ferroelectric capacitor are deteriorated, so that this technical measure cannot be employed.

In contrast, if, in case of forming the local electrode wiring for connecting the upper electrode and the transfer gate to each other, it is tried to form an aluminum wiring film by the use of a MO (Metal Organic) CVD method, the deterioration in characteristics of the ferroelectric capacitor is also caused since it is not probable that there is no reducing atmosphere at all (the hydrogen group component including the source material cannot be perfectly removed).

That is, in case of the conventional Si semiconductor manufacturing method, a step for depositing an insulation film and a process needing a hydrogen atmosphere from the necessity of stabilizing the contact of the contact point between Al the contact and Si have been regarded as indispensable. However, the ferroelectric film has the weak point that it is weak to a hydrogen atmosphere and water as mentioned above. It is because, if the hydrogen gas or water reaches the ferroelectric, oxygen, then voids of oxygen are caused in the crystal structure of the ferroelectric being an oxide, and thus, the use of a step in which hydrogen or water is produced must be avoided after the formation of the capacitor. Further, the step of depositing, as the insulation film on the capacitor, plasma TEOS as mentioned above is employed reluctantly for the reason that the damage inflicted on the ferroelectric by the hydrogen produced in this step is relatively small as compared the damage caused by water.

On the other hand, in the case of DRAM, recently it has been tried to use a high-permittivity dielectric material having the perofskite structure or the lamellar perofskite structure for the capacitor insulation film, but the high-permittivity dielectric material used in DRAM is likewise not free from the problem that its characteristics are deteriorated by a reducing reaction.

That is, the degree of integration of DRAM is enhanced year by year, but, even if the size thereof is decreased, the electric capacity of the respective dielectric capacitor which stores charges must be kept at about 30 fF or higher.

For this, the effective area of the capacitor must be increased, the thickness of the dielectric film must be decreased, or the dielectric constant of the dielectric material must be enhanced. According to the conventional technique, improvements are made in respect mainly of the first and second cases of the above-mentioned three cases, and examinations have been made for forming the capacitor into a three dimensional structure and making it thinner, but in case of the conventional $SiO_2$ dielectric films, the improvement in three-dimensional structuring and thinning of the capacitors are reaching the limit. Thus, expectations for thin films of high-permittivity dielectric which have a relative permittivity of 50 or higher such as, e.g. thin films of BST ((Ba, Sr) $TiO_3$) are increasing, but, in case of such thin films, it is desired to remove the after-steps in which hydrogen or water is produced, exactly as in the case of the aforementioned ferroelectric films.

Further, in case of forming a semiconductor device such as FRAM or DRAM using a ferroelectric material or a high-permittivity dielectric material, an annealing in an oxygen atmosphere (oxidation step) is needed, after the deposition or etching of the ferroelectric film or a high-permittivity dielectric film is performed, for the purpose of recovering from the characteristics change (the change in characteristics of the ferroelectric film or the high-permittivity dielectric film) due to the release of the stress at the time of deposition or due to the damage inflicted on at the time of etching.

So far, in fear of the fact that, as a result of the annealing in an oxygen atmosphere, the wiring and wiring electrodes which have already been formed may be oxidized to have higher resistance, rendered into abnormal shapes due to an abnormal oxidation to cause cracks, generally there has been formed a capacitor of the structure in which electrodes are provided on both surfaces of a ferroelectric film or a high-permittivity dielectric film, and, after it is annealed in an oxygen atmosphere, the wiring layer between the capacitor electrode and the diffused layer already formed on the semiconductor substrate and the wiring contact are formed.

The above-mentioned formation of the contact wiring was easy when the degree of integration was relatively low and the size of chips was relatively large, but as the degree of integration is becoming higher and higher, the vertical portion of the device becomes high in density, contact wiring layers with vary small diameters are formed, and a structure in which, on an element, another is formed in a stacked manner is required. In this case, the wiring layers must inevitably be formed before the formation of the high-permittivity element or the ferroelectric element.

However, in case the respective wiring layer was formed before the formation of the high-permittivity dielectric element or the ferroelectric element, the wiring layer was oxidized into high resistance in case the wiring layer was formed before the formation of the high-dielectric element or the ferroelectric element, and thus, a sufficiently low wiring resistance could not be obtained. Further, even if a metal wiring material which is generally regarded as strong or resistant to oxidation was used to form the wiring layer before the formation of the high-dielectric element or the ferroelectric element, an abnormal oxidation was caused notwithstanding, causing cracks. As stated above, there were various problems, so that a low wiring resistance could not be realized.

Further, the step of performing sintering at 450° C. by the use of a gas mixture of hydrogen and nitrogen as is performed in an ordinary semiconductor device manufacturing process in order to lower the contact resistance between the active layer of MOSFET and the contact wiring layer resulted in the fact that the high-permittivity dielectric film or ferroelectric film was reduced by the hydrogen, as a result of which the characteristics of the high-permittivity dielectric element or the ferroelectric element were deteriorated, and thus, the sintering step could not be adopted. Thus, it has been very difficult to control the characteristics of the MOSFET and the contact.

BRIEF SUMMARY OF THE INVENTION

It is the object of the present invention to provide a semiconductor device having a structure constituted in such a manner that the various problems mentioned above can be eliminated; and the ferroelectric film or the high-permittivity dielectric film can be protected from being damaged by hydrogen or water and also to provide a method for the manufacture of the semiconductor device.

Another object of the present invention is to provide a semiconductor device constituted in such a manner that the deterioration of the remanent polarization ($Q_{SW}$) of the ferroelectric film can be held down low and also to provide a method for the manufacture of the semiconductor device.

Still another object of the present invention is to provide a semiconductor device constituted in such a manner that the deterioration in characteristics of the high-permittivity dielectric film or the ferroelectric film due to a reducing atmosphere can be prevented and also to provide a method for the manufacture of the semiconductor device.

Still another object of the present invention is to provide a semiconductor device constituted in such a manner that the wiring layer and the element which have already been formed before the formation of the ferroelectric film or high-permittivity dielectric film can be protected from bering oxidized, and the good electrical conductivity and shapes of the wiring layer and the element can be maintained and supplied and also to provide a method for the manufacture of the semiconductor device.

Still another object of the present invention is to provide a semiconductor device constituted in such a manner that, in case of manufacturing the ferroelectric memory cells, the deterioration in characteristics of the ferroelectric capacitor can be prevented, and a process integration is made possible and also to provide a method for the manufacture of the semiconductor device.

Still another object of the present invention is to provide a semiconductor device constituted in such a manner that, in case of manufacturing a ferroelectric memory having a multi-layer wiring structure comprising at least two or more layers, the bit lines connected to the cells can be formed by the multi-layer wiring, and thus, the degree of integration can be enhanced, and the mounting of the semiconductor device compositely with other devices can be easily realized and also to provide a method for the manufacture of the semiconductor device.

In order to achieve the above-mentioned objects, the semiconductor device according to the present invention comprises:

a switching transistor including a drain region and a source region which are comprised of an impurity-diffused region formed in the surface layer portion of a semiconductor substrate;

a first insulation film formed above the semiconductor substrate containing the transistor;

a capacitor formed on the upper layer side of the first insulation film and comprised of a lower electrode, an inter-electrode insulation film composed of one of ferroelectric and high-permittivity dielectric, and an upper electrode;

a second insulation film which is formed, before the formation of the inter-electrode insulation film, so as to cover the side surface portion of the inter-electrode insulation film, whereby the side surface of the inter-electrode insulation film which is formed later is protected;

an electrode wiring which connects one of the drain region and the source region and one of the upper electrode and the lower electrode of the capacitor to each other; and a wiring formed above the semiconductor substrate and connected to the other one of the drain region and the source region.

Further, the semiconductor device according to the present invention comprises:

a switching transistor including a drain region and a source region which are comprised of an impurity-diffused region formed in the surface layer portion of a semiconductor substrate;

a first insulation film formed above the semiconductor substrate containing the transistor;

a capacitor formed on the upper layer side of the first insulation film and comprised of a lower electrode, an inter-electrode insulation film composed of one of ferroelectric and high-permittivity dielectric, and an upper electrode;

one of a silicon nitride film and a titanium oxide film formed, with respect to the capacitor so as to cover the side surface of the inter-electrode insulation film which is exposed between the lower electrode and the upper electrode;

an electrode wiring which connects one of the drain region and the source region and one of the upper electrode and the lower electrode of the capacitor to each other; and a wiring formed above the semiconductor substrate and connected to the other one of the drain region and the source region.

Further, the method for manufacturing a semiconductor device according to the present invention comprising the steps of forming, in the upper layer portion of a semiconductor substrate, a switching transistor including a drain region and a source region which are comprised of an impurity-diffused layer;

forming a first insulation film above the semiconductor substrate containing the transistor;

forming, on the first insulation film, a first electrically conductive film for a lower electrode;

forming a second insulation film on the first electrically conductive film;

forming a dielectric-film burying opening in the second insulation film selectively;

forming a dielectric film on the second insulation film containing said dielectric-film burying opening, the dielectric film constituting an inter-electrode insulation film composed of one of ferroelectric and high-permittivity dielectric;

removing the portion, lying on the second insulation film, of the dielectric film which is other than the dielectric film portion buried in the dielectric-film burying opening, the dielectric film portion buried in the dielectric-film burying opening being for a charge storage capacitor;

forming a second electrically conductive film for the upper electrode, on the second insulation film and the dielectric film; and forming the charge storage capacitor by successively patterning the second electrically conductive film, the second insulation film and the first electrically conductive film.

Further, the semiconductor device according to the present invention comprises:

a first diffused layer formed in a semiconductor substrate;

a first insulation film formed above the first diffused layer;

a first electrically conductive film formed above the first insulation film;

a first metal wiring buried in a first contact hole bored in the first insulation film to connect the first diffused layer and the first electrically conductive film; and a first wiring layer protecting film formed so as to cover the upper surface of at least one of the first electrically conductive film and the first metal wiring, the first wiring layer protecting film comprising one of a nitride-based film and a titanium oxide film.

Further, the semiconductor device according to the present invention comprises:

a first diffused layer formed on a semiconductor substrate;

a first insulation film formed above the first diffused layer;

a first contact wiring layer composed of a metal wiring material buried in a first contact hole bored in the first insulation film;

a first wiring layer protecting film formed so as to cover at least a part of the upper surface of the first contact wiring layer;

a first electrode wiring layer formed above the first insulation film;

a second insulation film formed, on the first electrode wiring layer, one of a high-permittivity dielectric film and a ferroelectric film;

a second electrode wiring layer formed on the second insulation film;

a third insulation film formed on the second electrode wiring layer; and a second contact wiring layer buried in a second contact hole bored above the first contact wiring layer of the third insulation film to connect the second electrode wiring layer and the first contact wiring layer.

Further, the semiconductor device according to the present invention comprises a first diffused layer formed on a semiconductor substrate;

a first insulation film formed above the first diffused layer;

a first electrically conductive film formed on the first insulation film;

a first metal wiring layer buried in a part of a plurality of first contact holes bored in the first insulation film and connecting the first diffused layer and the first electrically conductive film;

a first contact wiring layer comprised of the metal wiring material buried in another part of the plurality of first contact holes;

a first wiring layer protecting film formed so as to cover at least a part of the upper surface of the first electrically conductive film, the upper surface of the first metal wiring layer and the upper surface of the first contact wiring layer;

a second insulation film formed on the first wiring layer protecting film and the first insulation film;

a first electrode wiring layer formed above the second insulation film;

a third insulation film formed, on the first electrode wiring layer, of one of a high-permittivity dielectric film and a ferroelectric film;

a second electrode wiring layer formed on the third insulation film;

a fourth insulation film formed above the second electrode wiring layer; and a second contact wiring layer buried in a second contact hole bored above the first contact wiring layer of the fourth insulation film and the second insulation film to connect the second electrode wiring layer and the first contact wiring layer.

Further, the semiconductor device according to the present invention comprises:

a switching transistor including a drain region and a source region which are comprised of an impurity-diffused region formed in the surface layer portion of a semiconductor substrate;

a first insulation film formed above the semiconductor substrate containing the transistor;

a wiring which is connected to one of the drain region and the source region through a contact wiring formed in a state buried in the first insulation film, the wiring being formed on the first insulation film;

a capacitor contact wiring formed in the first insulation film, the lower end of the capacitor contact wiring being connected to the other one of the drain region and the source region;

a second insulation film comprised of one of a nitride-based film and a titanium oxide film formed on the first insulation film containing the wiring;

a third insulation film formed above the semiconductor substrate containing the second insulation film;

a capacitor formed above the third insulation film and comprising a lower electrode, an inter-electrode insulation film composed of one of ferroelectric and high-permittivity dielectric, and an upper electrode; and an electrode wiring which connects the upper electrode of the capacitor and the upper end of the capacitor contact wiring;

Further, the semiconductor device according to the present invention comprises:

a switching transistor including a drain region and a source region which are comprised of an impurity-diffused region formed in the surface layer portion of a semiconductor substrate;

a first insulation film formed above the semiconductor substrate containing the transistor;

a capacitor contact wiring formed in a state buried in the first insulation film, the lower end portion of the capacitor contact wiring being connected to one of the drain region and the source region;

a second insulation film comprised of one of a nitride-based film and a titanium oxide film formed on the first insulation film;

a capacitor formed above the second insulation film and comprising a lower electrode, an inter-electrode insulation film composed of one of a ferroelectric and high-permittivity dielectric, and an upper electrode;

an electrode wiring which connects the upper electrode of the capacitor and the upper end of the capacitor contact wiring to each other; and a wiring formed above the semiconductor substrate and connected to the other one of the drain region and the source region.

Further, the semiconductor device according to the present invention comprises:

a switching transistor including a drain region and a source region which are comprised of an impunity-diffused region formed in the surface layer portion of a semiconductor substrate;

a first insulation film formed on the semiconductor substrate containing the transistor;

a capacitor formed on the upper layer side of the first insulation film and comprising a lower electrode, an inter-electrode insulation film composed of one of ferroelectric and high-permittivity dielectric, and an upper electrode;

one of a silicon nitride film and a titanium oxide film formed directly on the capacitor;

an electrode wiring which connects one of the drain region and the source region and one of the upper electrode and the lower electrode of the capacitor to each other; and a wiring formed on the semiconductor substrate and connected to the other one of the drain region and the source region;

Due to the constitution described above, the semiconductor device and the method for the manufacture thereof according to the present invention, it becomes possible, in the manufacture of ferroelectric memory cells, to prevent the deterioration in characteristics of the ferroelectric capacitors and to realize process integration.

Further, means which can protect semiconductor device from being damaged by hydrogen or water is obtained.

Moreover, the deterioration in the amount of remanent polarization of ferroelectric films can be held down low.

Further, the deterioration of high-permittivity dielectric films or ferroelectric films due to reducing atmospheres can be prevented.

Further, the wiring layer and the element which have already been formed before the formation of a high-permittivity dielectric film or a ferroelectric film can be protected from oxidation, and thus, the conductivity and shapes thereof can be maintained and supplied in good condition.

In addition, in case of manufacturing ferroelectric memory having a multi-layer wiring structure consisting of at least two or more layers, the bit lines connected to the cells can be formed of multi-layer wirings, so that the composite or joint mounting thereof with other devices is facilitated.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

Figure 1:
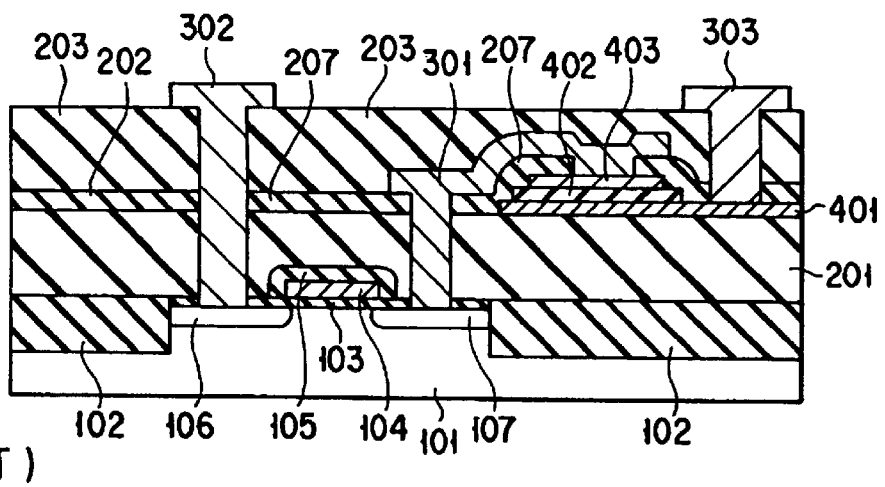
FIG. 1 is a sectional view showing a part of the step of manufacturing a memory device using a high-permittivity dielectric film or a ferroelectric film according to the conventional technique.

The semiconductor device and the method for the manufacture of the semiconductor device according to the present invention will now be described, referring to the drawings.

FIGS. 2A to 2H are sectional views showing in due order the manufacturing steps of a first embodiment of the method for the manufacture of a semiconductor device according to the present invention and also a sectional view showing the semiconductor device at the final manufacturing step.

This first embodiment is characterized in that an insulation film is formed beforehand in a portion opposed to the side wall of a ferroelectric film (before the formation of the ferroelectric film).

Figure 2A:
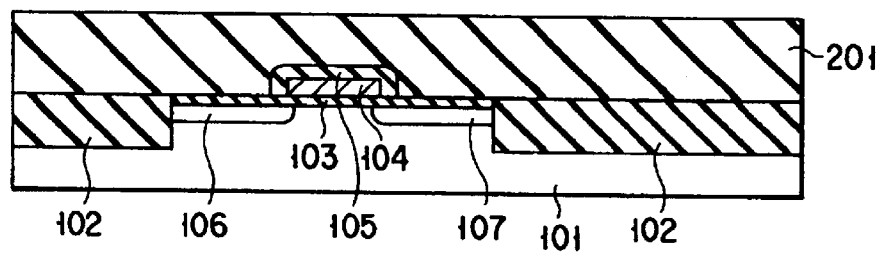
FIGS. 2A to 2H are sectional views showing in due order the manufacturing steps according to a first embodiment of the method for the manufacture of a semiconductor device according to the present invention.

First, in a P-type silicon substrate 101 which has the orientation of [001], an element isolation region 102 is formed as shown in FIG. 2A. The element isolation region 102 shown here is of the STI (Shallow Trench Isolation) structure formed in such a manner that, after a groove is formed in the silicon substrate, the groove is filled up with an insulator, but the element isolation region 102 can alternatively be made into an oxide film structure formed by the use of the LOCOS method. Further, as the silicon substrate, an N-type substrate can be used instead, as required by the characteristics of the element.

Subsequently, ion implantation is performed into the channel portion for threshold adjustment, and thereafter, a gate oxide film 103 is formed, an N-type polycrystalline silicon is deposited thereon, and further, a metal silicide such as WSi is deposited thereon as a gate material. Further, depending on the requirement for the characteristics of the element, it is alternatively possible to deposit a P-type polycrystalline silicon or omit the silicide depositing step. Next, the gate (word line) is patterned by a photolithography step, and a gate 104 is formed by anisotropic etching. Next, the surface of the polycrystalline silicon and the silicide constituting the gate is oxidized to form a protective film 105, but, as required, a deposition step is also performed. Thereafter, by the use of the gate 104 as a mask, an N-type or P-type impurity is ion-implanted into the silicon substrate for the formation of a source region 106 and a drain region 107, and a first inter-layer insulation film 201 is deposited.

Figure 2B:
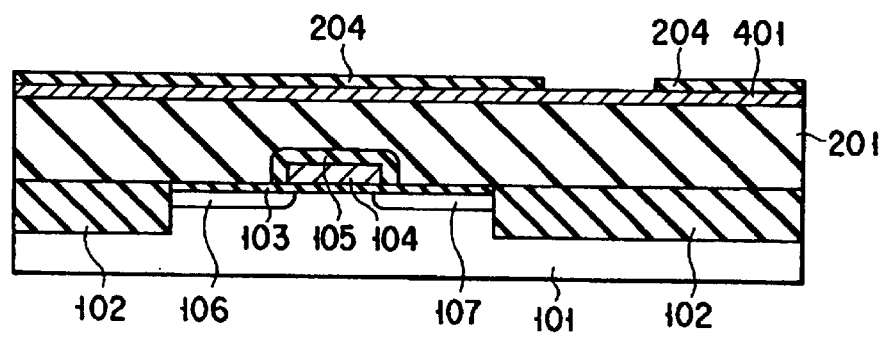

Next, as shown in FIG. 2B, on the first inter-layer insulation film 201, a lower electrode 401 with respect to ferroelectric is formed by deposition. As the material of this lower electrode 401, Pt or Ir is effective, but in case of depositing Pt, it is preferable to deposit Ti and TiN immediately before the deposition of the Pt.

In case Pt is directly deposited for the formation of the lower electrode 401 on the oxide film, the lower electrode 401 does not closely adhere to the oxide film, phenomena such as the peeling-off of the film are caused, so that the above-mentioned measure is taken to prevent the occurrence of such phenomena. Thereafter, an insulation film 204 is deposited. As for the formation of this insulation film 204, SixNy (x and y are optional integers which are each an optional integer standing for the atom composition ratio) deposited by the use of the CVD method or the sputtering method or $TiO_2$ is effective as a material which can constitute a dense film without the use of a reducing atmosphere.

Subsequently, by a lithography step, a ferroelectric region is patterned in the insulation film 204 and removed by anisotropical etching. In this case, the lower electrode 401 is left.

Figure 2C:
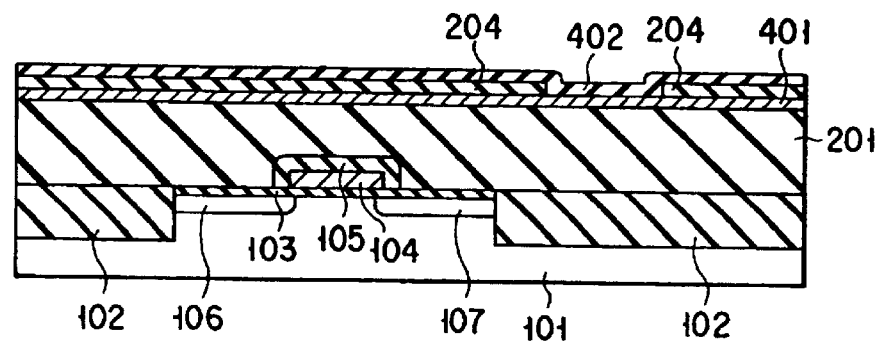

Next, a ferroelectric film 402 is deposited by sputtering as shown in FIG. 2C.

Effective as the material of this ferroelectric film 402 is PZT, strontium bismuth tantalate (hereinafter referred to as SBT) or the like.

Figure 2D:
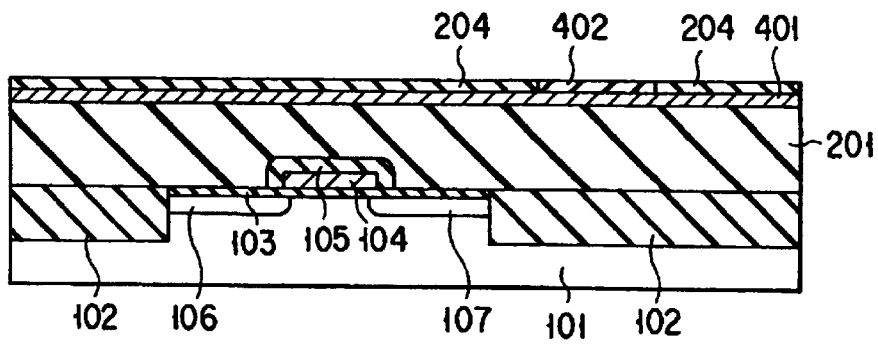

Thereafter, the ferroelectric film 402 is polished by chemical mechanical polishing (CMP) as shown in FIG. 2D, in which case the polishing is performed by the use of the insulation film 204 as a mask, whereby the ferroelectric film 402 turns out to be left only in the etched hole of the insulation film 204.

Figure 2E:
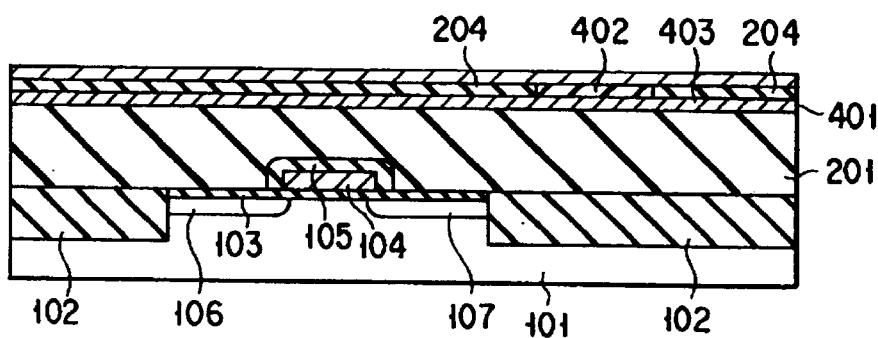

Next, an upper electrode 403 is deposited as shown in FIG. 2E. As the material of this upper electrode 403, the same material as that of the lower electrode 401 is used.

Next, the upper electrode 403 is patterned by a photolithography step and etched by anisotropical etching. Subsequently, the insulation film 204 is patterned by a photolithography step so that the ferroelectric film 402 may be contained within it and then etched by anisotropical etching.

Figure 2F:
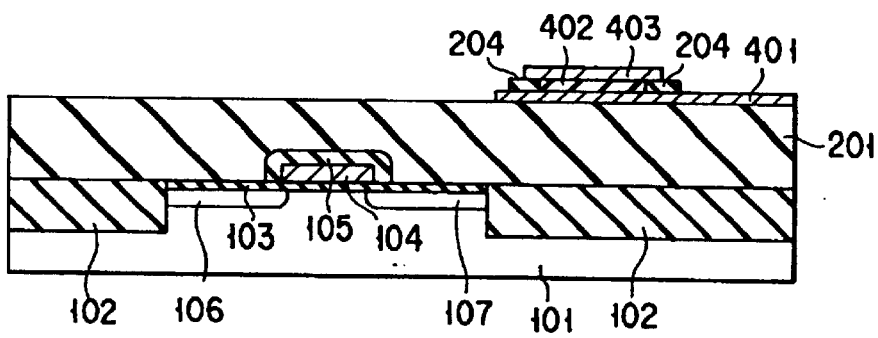

Next, as shown in FIG. 2F, the lower electrode 401 is patterned by a photolithography step and etched by anisotropical etching. As a result, adjacent to the ferroelectric film 402 are the lower electrode 401, the upper electrode 403 and the insulation film 204 which constitutes a side wall; and thus, there is left no part affected by the atmosphere from outside. The etching of the insulation film 204 can also be performed by self-alignment at the same time when the upper electrode 403 is etched.

Figure 2G:
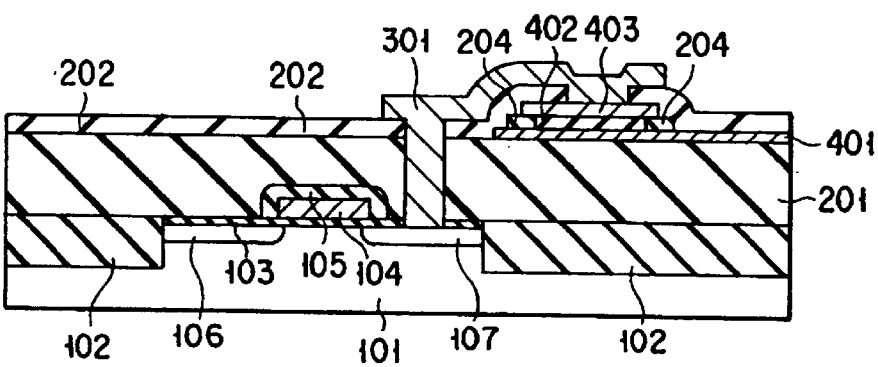

Next, as shown in FIG. 2G, a second inter-layer insulation film 202 is deposited, and an opening for contact with the source-drain portions 106 and 107 and the upper electrode 403 is patterned by photolithography step and etched by anisotropic etching. Thereafter, between the drain 107 of the transistor and capacitor, a local wiring material (local interconnect) (such as, e.g. Ti/TiN) which constitutes a local wiring 301 is deposited.

Here, the above-mentioned capacitor is comprised of the lower electrode 401, the ferroelectric film 402 provided with the insulation film 204 which serves as the side wall, and the upper electrode 403.

Next, by photolithography step, the local wiring 01 is patterned and etched by anisotropical etching. Although, in the case shown in FIG. 2G, the ocal wiring 301 is contacted with the drain 107, the local wiring 301 can be contacted with the source, instead, as required by the circuit.

Figure 2H:
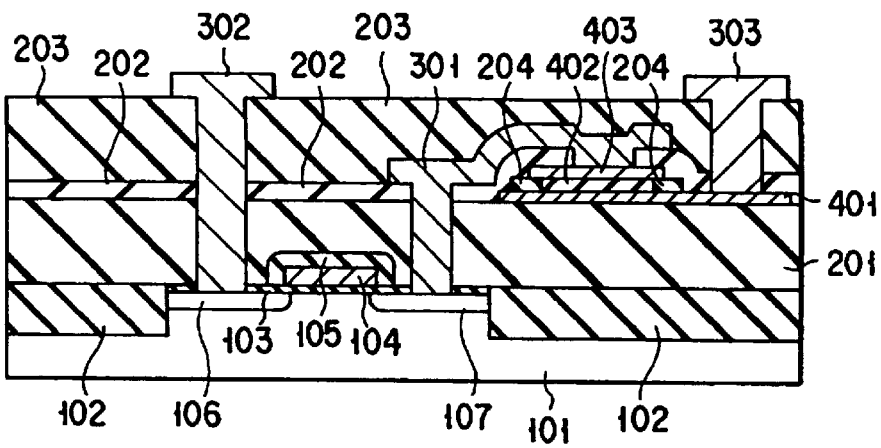

Next, as shown in FIG. 2H, a third inter-layer insulation film 203 is deposited, and, through the third inter-layer insulation film 203, there are bored contact holes leading to the source-drain portions 106 and 107 and the lower electrode 401.

Further, a wiring material (such as, e.g. AlSiCu) is deposited by the use of the sputtering method and patterned by a photolithography step, and the metal wiring is etched by anisotropic etching, whereby a transistor contact and wiring layer 302 and a capacitor contact and wiring layer 303 are formed. Further, through not shown in FIG. 2H, a contact to the gate can also be formed at the same time.

That is, according to the above-described first embodiment of the method for the manufacture of a semiconductor device, the capacitor comprising the ferroelectric film 402 sandwiched between the lower electrode 401 and the upper electrode 403 is formed in such a manner that, before the ferroelectric film 402 is deposited on the lower electrode film 401, an insulation material comprising an SixNy or $TiO_2$ is deposited to form the insulating film 204, and, only in the portion of this insulating film material in which the ferroelectric film 402 needs to be buried is bored by etching. Thereafter, the ferroelectric film 402 is deposited, and the unnecessary ferroelectric portion is removed, whereby a wall composed of an insulation film is formed on the side of the ferroelectric film 402.

In other words, the side face of the ferroelectric is not exposed, so that the there is no fear that a substance such as hydrogen, water or the like may infiltrate through the side face of the ferroelectric film 402; and thus, the characteristics of the ferroelectric film 402 which are apt to be affected by substances such as hydrogen, water, etc. and, more particularly, the amount of remanent polarization can be prevented from being deteriorated.

Figure 3:
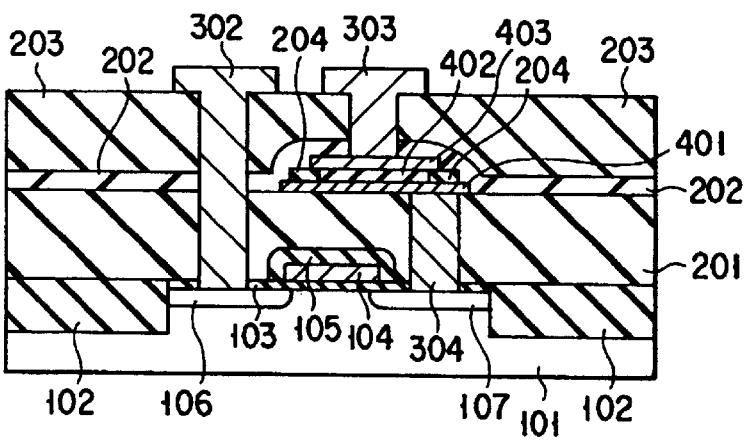
FIG. 3 is a sectional view showing another manufacturing step which is a modification of the manufacturing step shown in the sectional view of FIG. 2H.

Further, in the case of the first embodiment described above, there is provided the step of forming the local wiring 301 between the transistor and the capacitor after the formation of the capacitor, but this step has its limit on the area reduction of the cell. However, by the use of the step of previously forming, after the formation of the transistor, the buried contact 304 for the formation of the local wiring between the transistor and the capacitor as shown in FIG. 3, it becomes possible to form the capacitor, for instance, directly above the transistor, which is effective for the reduction of the cell area.

Next, a second embodiment of the semiconductor device according to the present invention will be described by reference to FIGS. 4A to 4H.

Figure 4A:
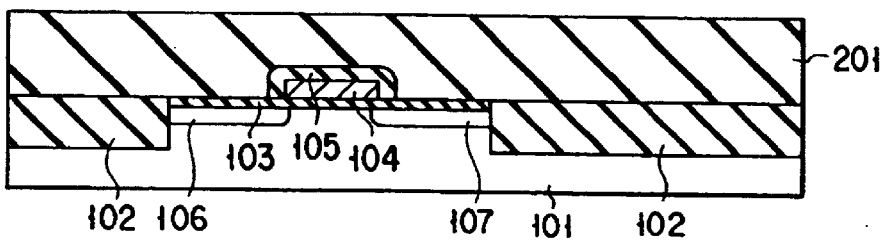
FIGS. 4A to 4H are sectional views showing in due order the manufacturing steps according to a second embodiment of the method for the manufacture of a semiconductor device according to the present invention.
Figure 4B:
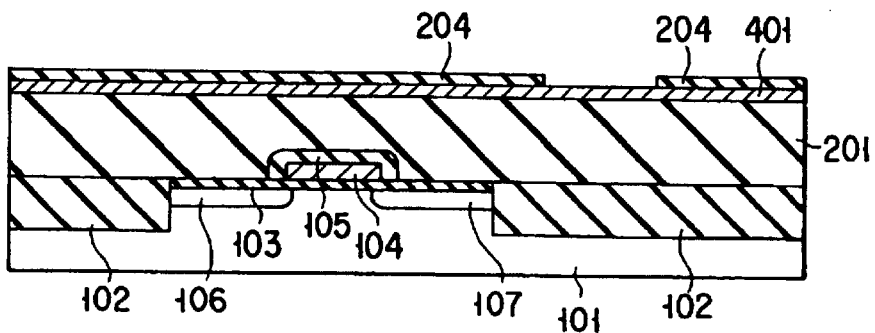

After, by steps similar to those in the first embodiment, a transistor is formed on the silicon substrate 101 as shown in FIGS. 4A, and 4B, the insulation film 204 comprising SixNy or $TiO_2$ is formed by deposition, patterned by photolithography and etched.

Figure 4C:
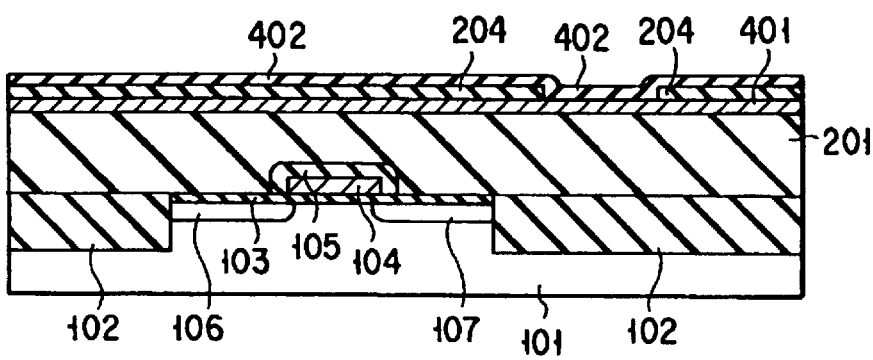
Figure 4D:
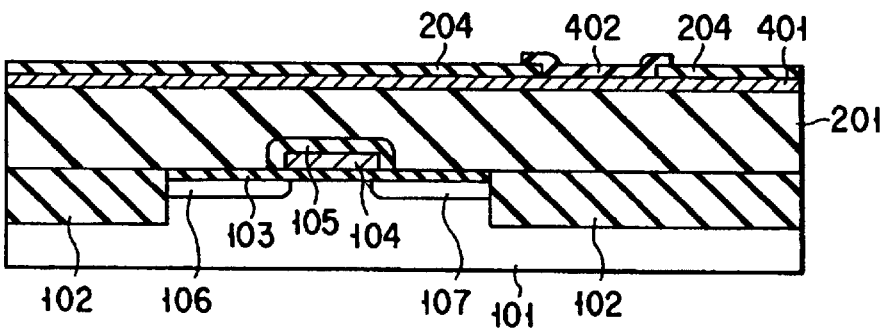

Next, as shown in FIGS. 4C and 4D, after the ferroelectric film 402 is deposited, it is patterned by photolithography and etched. In this patterning, the ferroelectric film 402 is formed in the state in which the ferroelectric film 402 is stuck out as far as outside the hole of the insulation film 204.

Figure 4E:
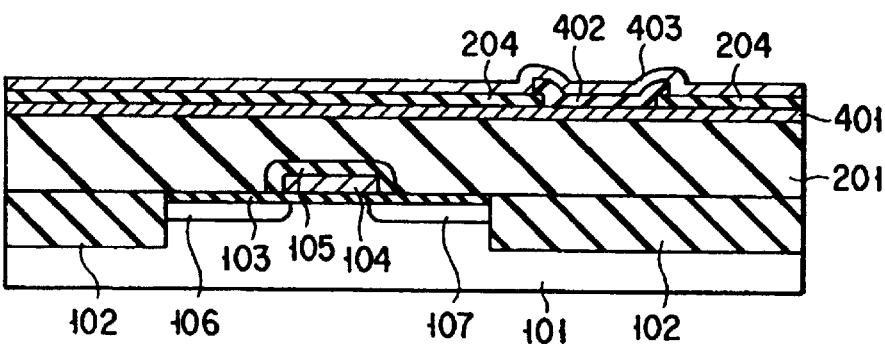
Figure 4F:
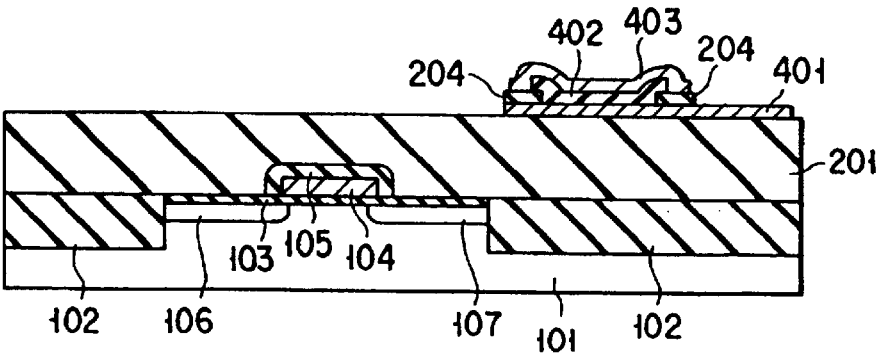

Next, as shown in FIG. 4E, the upper electrode 403 is deposited using the same material as that of the lower electrode 401. After this, as shown in FIG. 4F, the upper electrode 403 is patterned by a photolithgraphy step and etched by anisotropical etching.

Subsequently, the insulation film 204 is patterned by a photolithography step so as to enclose the ferroelectric film 401 within the insulation film 204 and etched by anisotropic etching.

Further, the lower electrode 401 is patterned by a photolithography step and etched by anisotropic etching. As a result, adjacent to the ferroelectric film 402 are the upper and lower electrodes and the insulation film 204 constituting the side wall; and thus, there is left no portion to be affected by the atmosphere from outside.

The etching of the insulation film 204 can alternatively be performed by self-alignment simultaneously when the upper electrode 403 is etched.

Figure 4G:
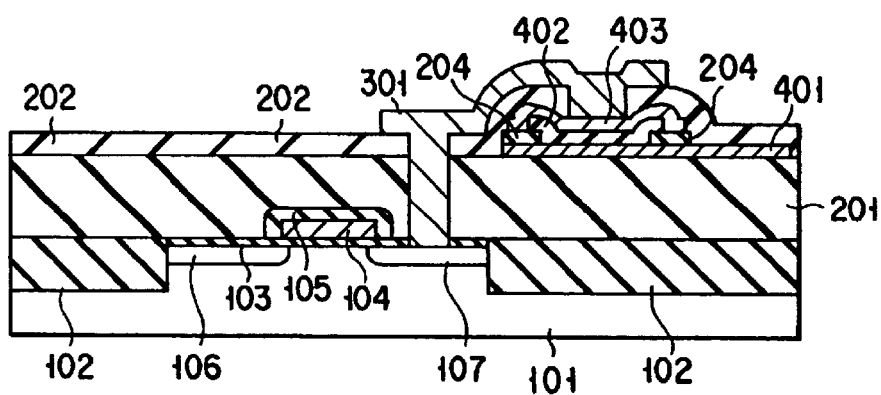
Figure 4H:
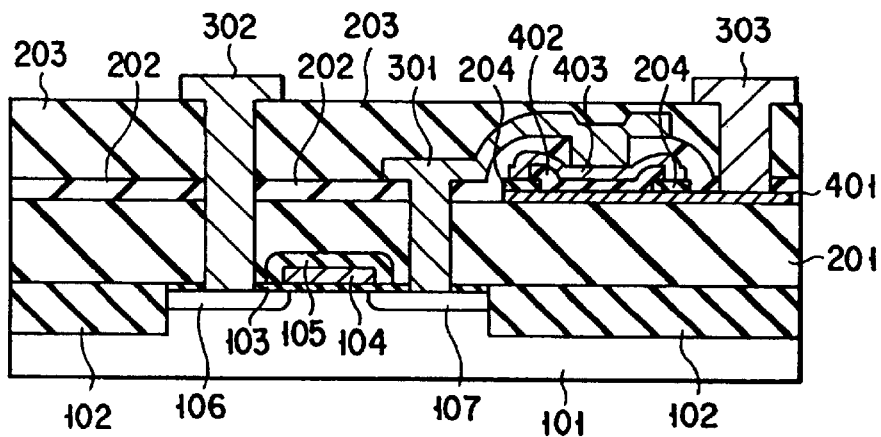
Figure 5:
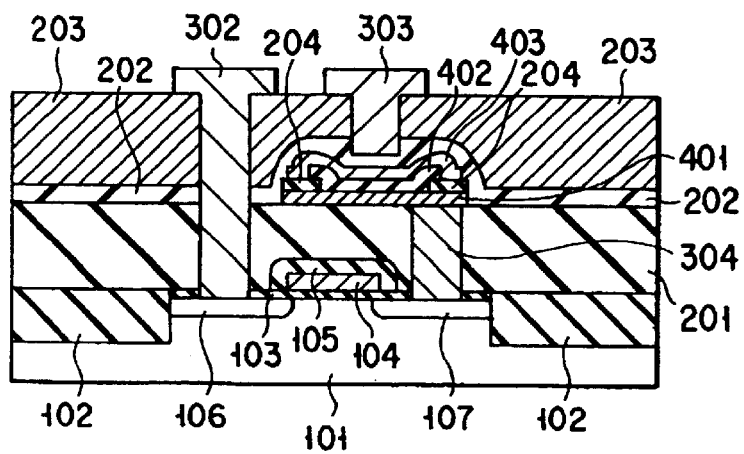
FIG. 5 is a sectional view showing another manufacturing step which is a modification of the manufacturing step shown in the sectional view of FIG. 4H.

After this, the steps ranging from the step of depositing the second inter-player film 202 to the step of forming the wiring are carried out, as shown in FIGS. 4G to 4H, by the use of the same steps as those in the first embodiment.

By the steps of forming the ferroelectric memory cell according to the second embodiment, approximately the same effect as the effect of the forming steps according to the first embodiment can be obtained.

Further, if, as in the case of the modification of the first embodiment shown in FIG. 3, a buried contact 304 which constitutes the local wiring between the transistor and the capacitor is formed beforehand after the formation of the transistor, it is effective for the reduction of the cell area.

Next, a third embodiment of the semiconductor device according to the present invention will be described by reference to FIGS. 6A to 6F.

The third embodiment is characterized in that, directly above the ferroelectric capacitor, an insulation film comprising SixNy or $TiO_2$ is formed by deposition.

Figure 6A:
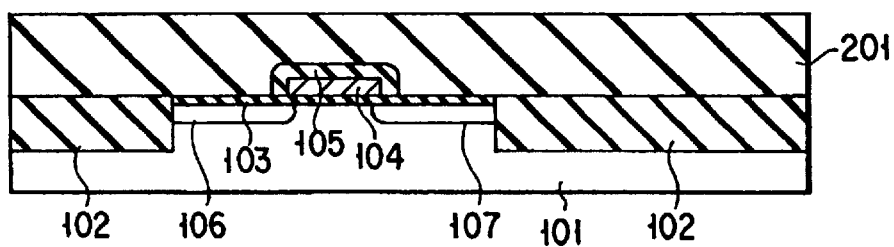
FIGS. 6A to 6F are sectional views showing in due order the manufacturing steps according to a third embodiment of the method for the manufacture of a semiconductor device according to the present invention.

First, as shown in FIG. 6A, on a P-type silicon substrate 101 having the orientation of [001], an element isolation region 102 comprising an oxide film is formed. In this case, the element isolation region may be of an element isolation structure formed by the use of STI method or of an element isolation structure formed by the use of the LOCOS method, and, as the silicon substrate 101, an N-type substrate can be used, instead, depending on the requirement for the characteristics of the element.

Next, after ion implantation is performed into the channel portion for threshold adjustment, a gate oxide film 103 is formed, an N-type polycrystalline silicon is deposited thereon, and further, a metal silicide such as WSi is deposited thereon to form a gate material. As required by the characteristics of the element, it is possible to deposit P-type polycrystalline silicon or omit the step of depositing silicide, depending on the requirement for the characteristics of the element.

Next, by the use of a photolithograpy step, a gate (word line) is patterned, and a gate 104 is formed by anisotropical etching. Subsequently, the surface of the polycrystalline silicon or silicide constituting the gate is oxidized to form a protective film 105, in which case a depositing step is performed as required.

Thereafter, by the use of the gate 104 as a mask, an N-type or P-type impurity is ion-implanted into the silicon substrate 101 for the formation of a source region 106 and a drain region 107, and a first inter-layer insulation film 201 is deposited.

Figure 6B:
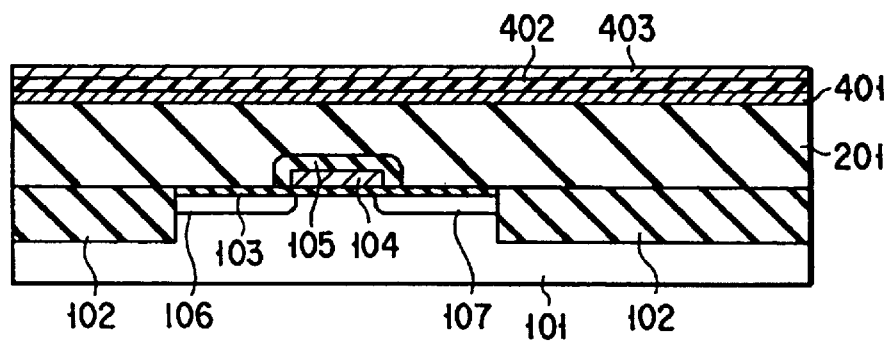

Next, as shown in FIG. 6B, a lower electrode 401 with respect to the ferroelectric is deposited. As the material of this lower electrode 401, for instance Pt or Ir is effective, but it is desirable to deposit Ti and TiN immediately before the deposition of Pt. This is because, in case Pt is deposited as the lower electrode directly on the oxide film, the Pt does not well adhere to the oxide film, so that phenomena such the peeling-off of the film are caused; and thus, the deposition of Ti and TiN is performed to prevent the occurrence of such phenomena. Thereafter, a ferroelectric film 402 is deposited by sputtering, in which case PZT or SBT is effective as the material of the ferroelectric film 402. Next, by the use of the same material as that of the lower electrode 401, an upper electrode 403 is deposited.

Figure 6C:
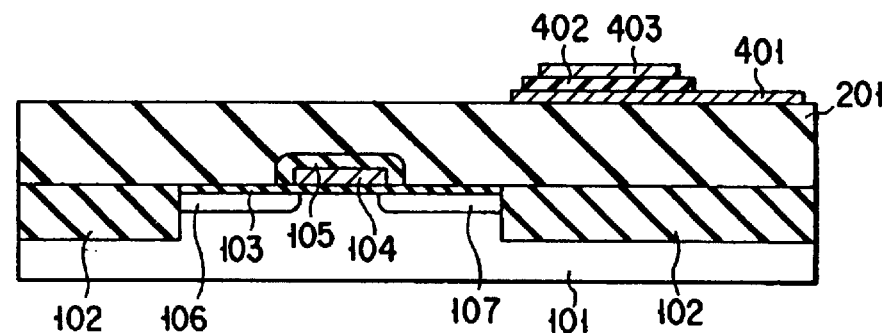

Subsequently, as shown in FIG. 6C, the upper electrode 403 is patterned by a photolithography step and etched by anisotropic etching. Subsequently, the ferroelectric 402 is patterned by a photolithography step and etched by anisotropic etching. Further, the lower electrode 401 is patterned by a photolithography step and etched by anisotropic etching. The etching of the ferroelectric 402 can alternatively be performed by self-alignment at the same time when the upper electrode 403 is etched.

Figure 6D:
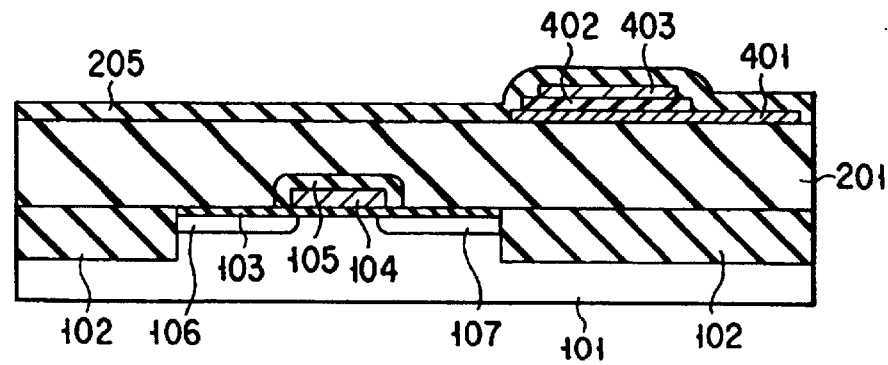

Next, as shown in FIG. 6D, a silicon nitride film (particularly, SixNy by sputtering) or an titanium oxide film (TiO₂) is deposited as a second inter-layer insulation film 205.

It has been empirically clarified that, by this step, the amount of remanent polarization can be improved to 30% of the value immediately after the formation of the capacitor as compared with the conventional case where the ferroelectric capacitor formed by depositing the silicon oxide film by, e.g. plasma TEOS, the amount of remanent polarization fell down to 10% of the value immediately after the formation of the capacitor.

Figure 6E:
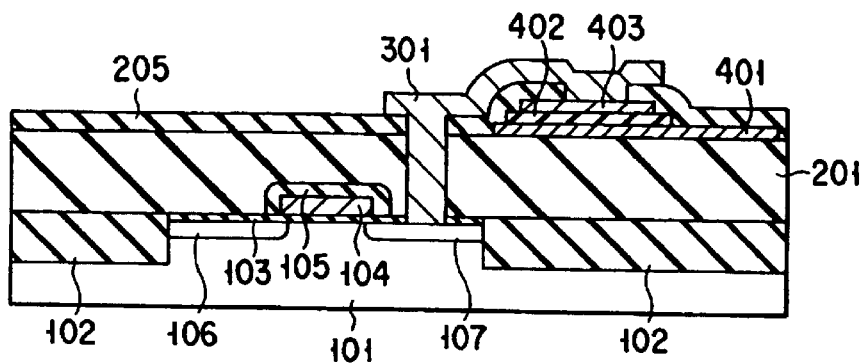

Next, as shown in FIG. 6E, contact holes leading to the source-drain portion 106, 107 and the upper electrode 403 are patterned by a photolithography step and etched by anisotropic etching. Thereafter, a material (such as, e.g. Ti/TiN) for the local wiring between the transistor and the capacitor is deposited. Subsequently, by a photolithography step, the local wiring is patterned, and, by anisotropical etching, a local wiring 301 is formed.

Figure 6F:
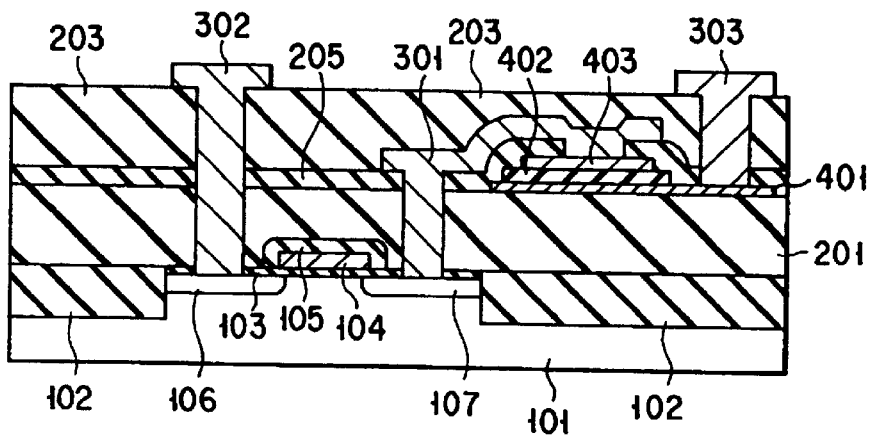

Next, as shown in FIG. 6F, a third inter-layer insulation film 203 is deposited, and contacts leading to the source-drain portions 106 and 107 and the lower electrode 401 are bored. Further, a wiring material (such as, e.g. AlSiCu) is deposited by sputtering and patterned by a photolithography step; and the metal wiring is etched by anisotropic etching to form a contact and wiring layer 302 to the transistor and a contact and wiring layer 303 to the capacitor.

Further, though not shown in FIG. 6F, in the portion other than the cell, a contact to the gate is also formed at the same time.

According to the ferroelectric memory cell formation process under the third embodiment described above, there can be obtained approximately the same effects as those obtained in the case of the formation processes according to the first and second embodiments, and in addition, since a wall comprising the insulation film composed of SixNy or TiO₂ is formed on the upper surface of the ferroelectric capacitor, there is eliminated the fear that substances such as hydrogen, water, etc. may penetrate inward through the upper surface of the ferroelectric 402; and thus, the characteristics and, more particularly, the-amount of remanent polarization of the ferroelectric film which is apt to be affected by substances such as hydrogen, water, etc. can be prevented from being deteriorated.

In the case where, in the first, second and third embodiments of the present invention, the ferroelectric film is replaced by a high-permittivity dielectric film having a dielectric constant of 50 or higher and, more concretely, a high-permittivity dielectric film composed of a substance having the perofskite structure or the lamellar perofskite structure such as strontium titanate (SrTiO₃), BST (Ba, Sr) TiO₃), etc., the present invention is also effective.

Next, a fourth embodiment of the semiconductor device according to the present invention will be described by reference to FIGS. 7A to 7S.

Figure 7A:
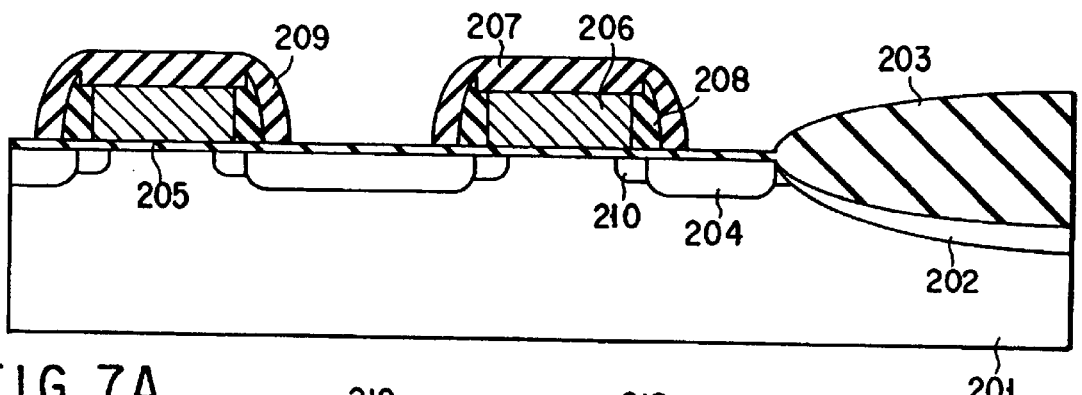
FIGS. 7A to 7S are sectional views showing in due order the manufacturing steps according to a fourth embodiment of the method for the manufacture of a semiconductor device according to the present invention.

First, as shown in FIG. 7A, on an e.g. P-type Si substrate 201, an element isolation oxide film 203 is formed to a thickness of about 400 nm. Thereafter, by ion implantation, an element isolation region (channel stopper) 202 is formed. Thereafter, a gate insulation film 205 is formed to a thickness of about 14 nm. Thereafter, by thermal oxidation, a gate insulation film 205 is formed to a thickness of about 14 nm.

Next, tungsten silicide (WSi) which will constitute a gate wiring layer 206 is deposited to a thickness of about 200 nm; and then, SixNy which will constitute a gate electrode protecting film 207 is deposited to a thickness of about 200 nm; and thereafter, by the use of the photolithography method and anisotropical etching, the gate wiring layer 206 and the gate wiring protecting film 207 are formed.

In this case, if the gate electrode protecting film 207 is formed by the use of a dense film material comprsiing a nitride-based film such as the SixNy, then the characteristics, as a wiring, of the gate wiring layer 206 are not spoiled without being affected by the thermal oxidation performed at a later step.

Thereafter, by ion implantation, a diffused layer 210 is formed. Subsequently, a gate side-wall protecting oxide film 208 is formed.

Further, SixNy which will constitute a gate side-wall protecting film 209 is deposited to a thickness of about 50 nm, and thus, the gate side-wall protecting film 209 is formed by anisotropic etching. In this case, the gate side-wall protecting film 209 had better be composed of a dense nitride-based film material such as the SixNy since it will not be affected by the thermal oxidation performed at a later step; and thus, the characteristics as a wiring of the gate wiring layer 206 are not spoiled. Thereafter, by ion implantation, a diffused layer 204 is formed.

Figure 7B:
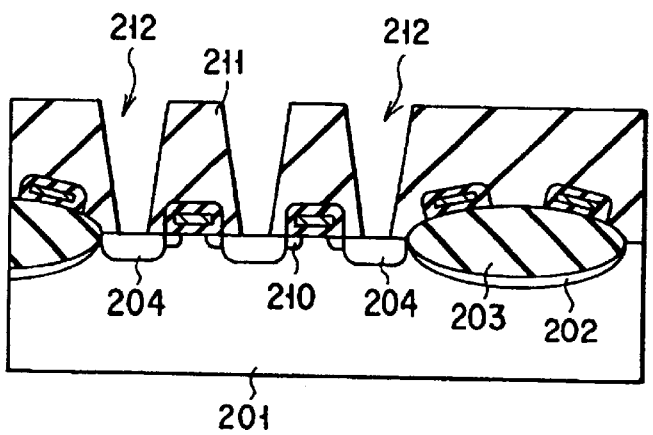

Next, as shown in FIG. 7B, an oxide film which will constitute an inter-layer insulation film 211 is deposited to a thickness of about 400 nm. Thereafter, a groove which will constitute a wiring layer is formed by the use of the photolithography method and anisotropic etching. Further, contact holes 212 are bored in the inter-layer insulation film 211 so as to be lead to the diffused layer 204.

Figure 7C:
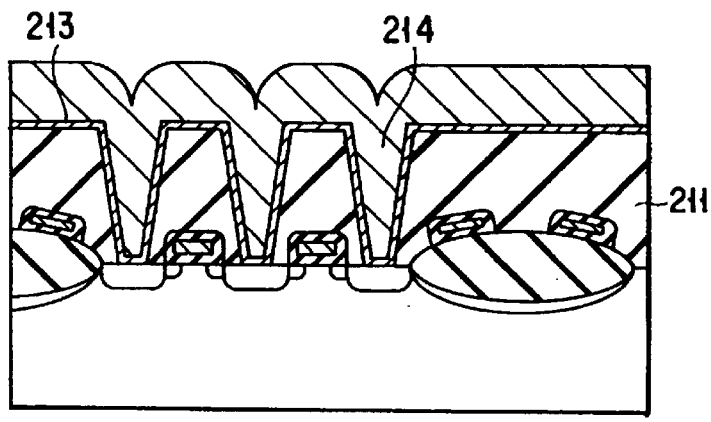

Next, as shown in FIG. 7C, a wiring layer which will constitute contact wiring layers and a wiring layer is formed by depositing TiN to a thickness of about 20 nm, and then, tungsten (W) is deposited to a thickness of about 400 nm for forming a wiring layer 214 which will constitute contact wiring layers and a wiring layer.

Thereafter, by the photolithography method and anisotropic etching, a buried wiring layer 213 and a buried wiring layer 214 are formed.

The wiring layer 213 is composed of TiN for preventing the abnormal oxidation of the tungsten (W) wiring layer 214 by the thermal oxidation performed at a later step and improving the close adhesion of the wiring layer 213, but, in case attention is paid only to the prevention of an abnormal oxidation of the tungsten (W) wiring layer 214 by the thermal oxidation performed at a later step, an insulation film such as a nitride film (such as, e.g. SixNy), a titanium oxide film, or the like which is dense and thus hard for oxygen to penetrate therethrough can be used as an oxygen barrier film in substitution for the TiN film.

In this case, in order to ensure the electric connection of the diffused layer 204 and the buried wiring layer 214 it is necessary to remove, by anisotropic etching, the oxidation barrier film which comprises the insulation film only in its contact bottom portion, but the insulation film is composed of the same material as that of the protective film on the wiring layer 214 to be described alter, so that the matching therebetween is good.

Figure 7D:
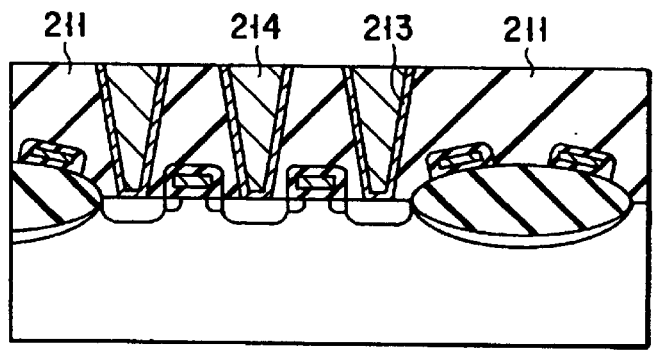

Next, as shown in FIG. 7D, the surface is polished by CMP until the inter-layer insulation film 211 comes to be exposed, and a contact wiring and a wiring layer (such as, e.g. a bit line BL) to be described alter are formed.

Figure 7E:
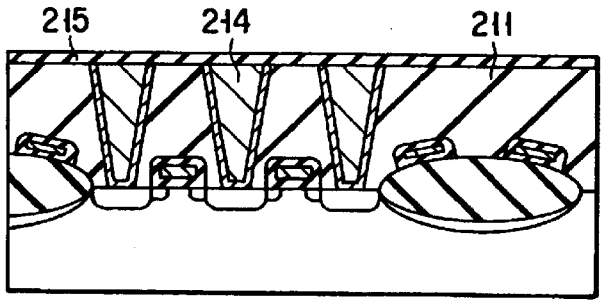
Figure 7F:
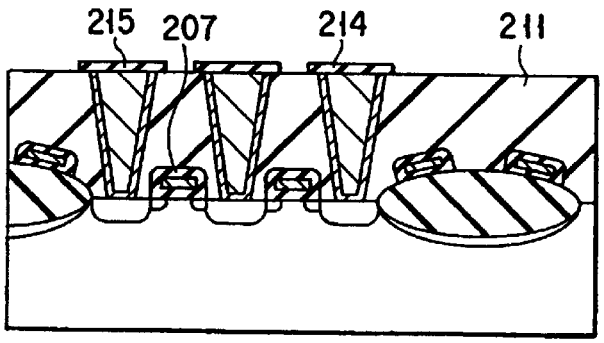
Figure 7G:
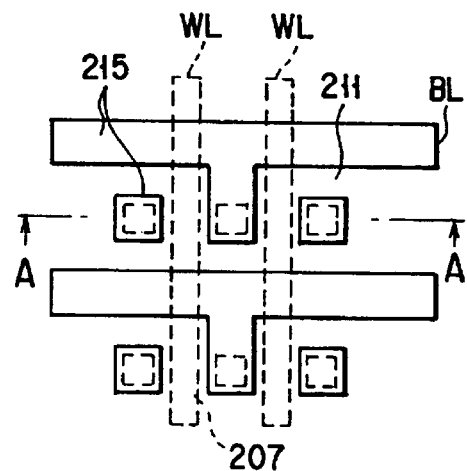
Figure 7H:
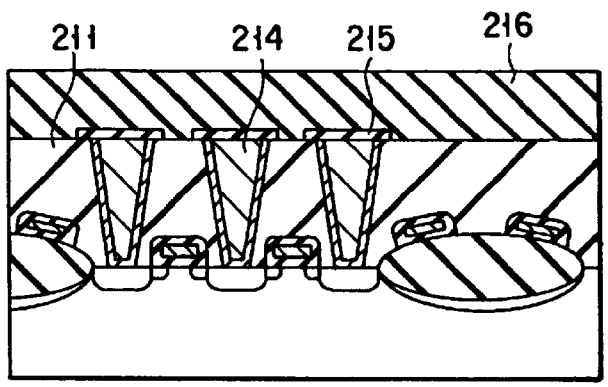
Figure 7I:
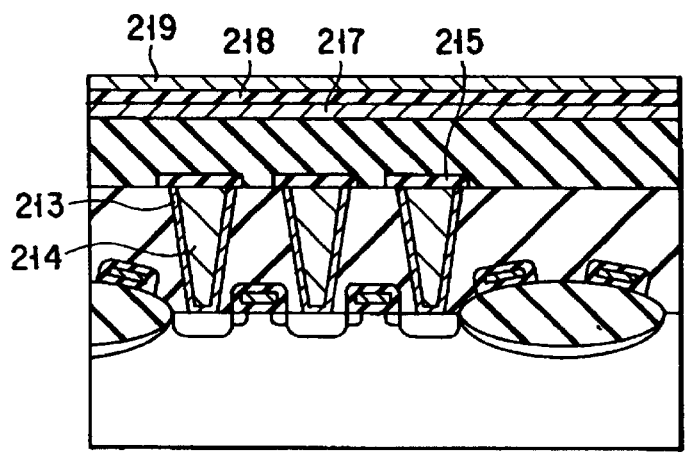
Figure 7J:
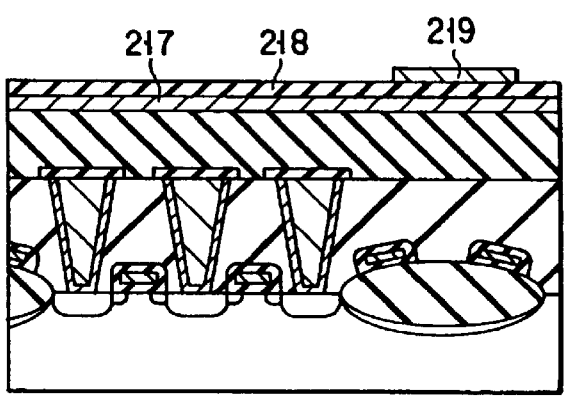
Figure 7K:
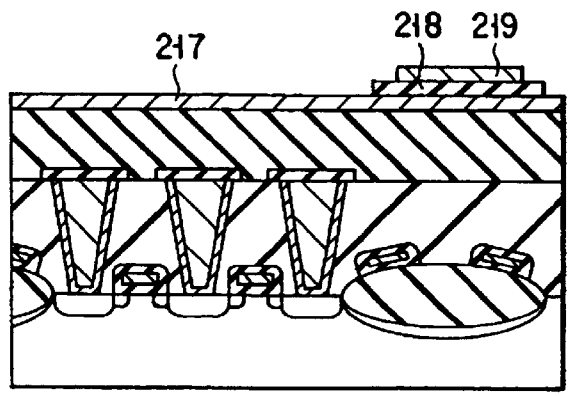
Figure 7L:
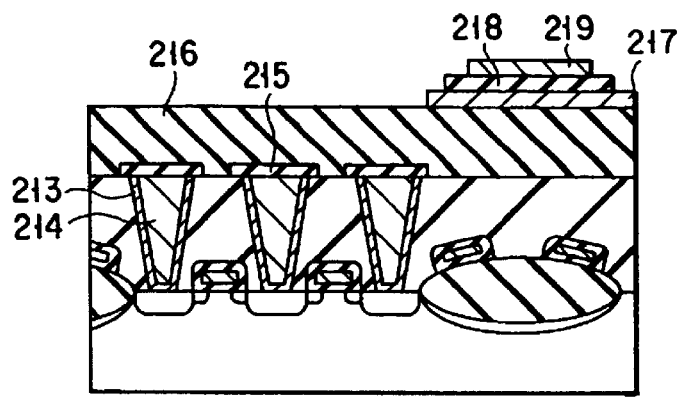
Figure 7M:
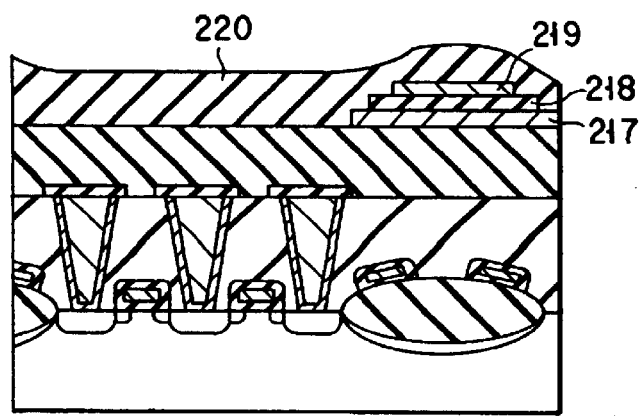
Figure 7N:
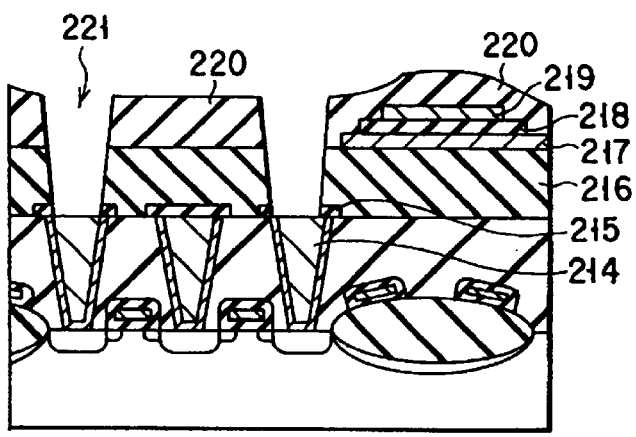
Figure 7O:
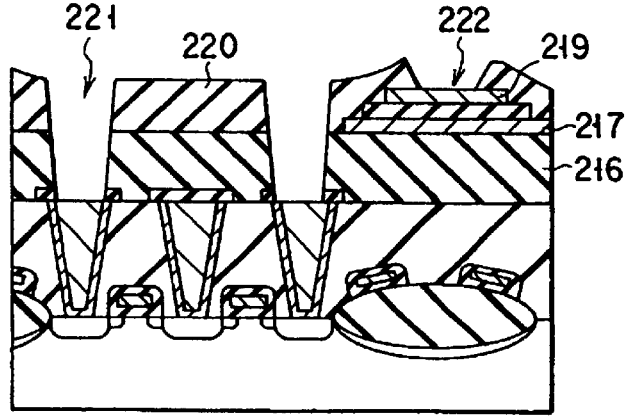
Figure 7P:
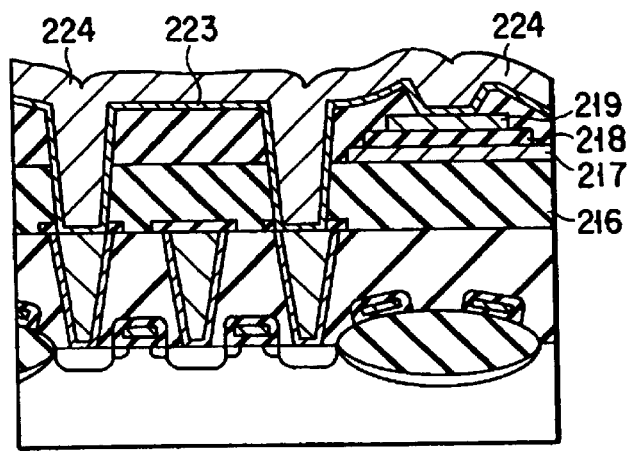
Figure 7Q:
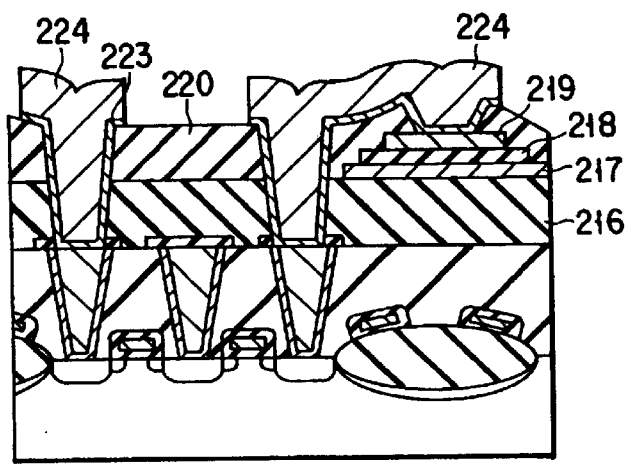
Figure 7R:
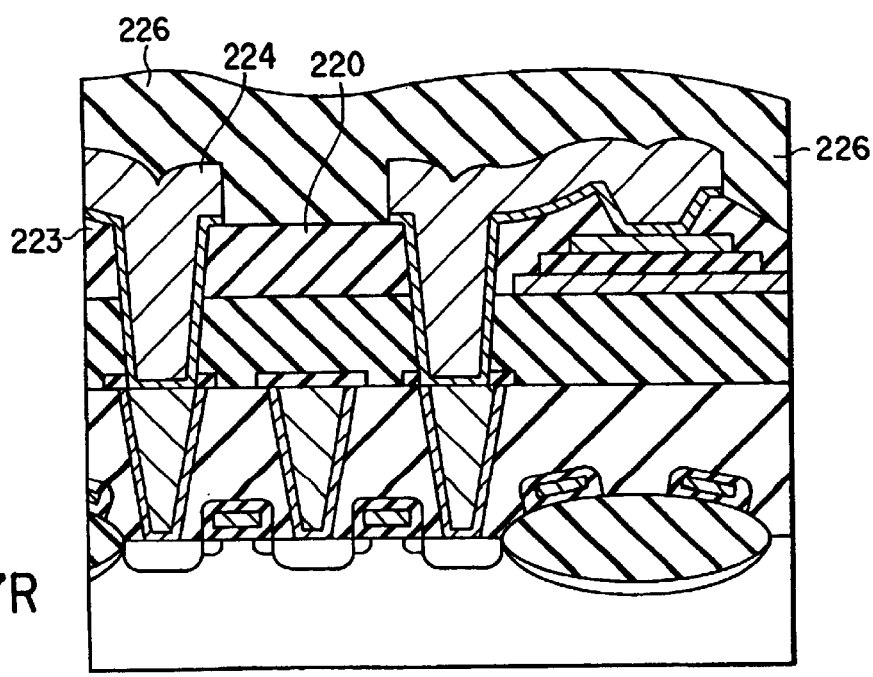
Figure 7S:
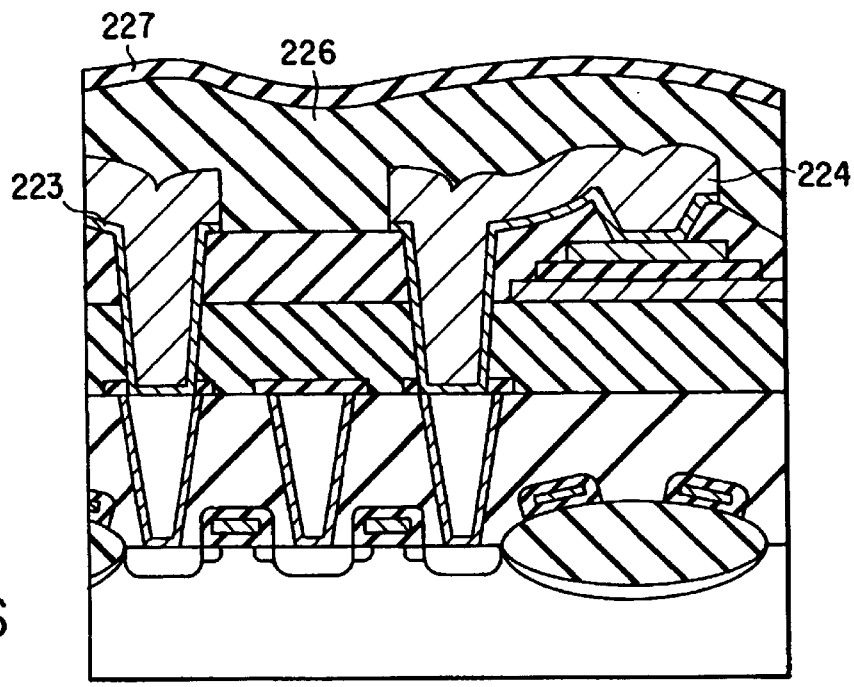

As for the bit line BL (as shown in FIG. 7G), only the portion thereof which lies within the contact hole is shown by a solid line in FIGS. 7A to 7S, and the portion of the insulation film 211 which is positioned behind the sectional view shown is not shown.

Thereafter, as shown in FIG. 7E, SiN which will constitute a protective film 215 for the contact wirings and the wiring layer is deposited to a thickness of about 100 nm. The protective film 215 for the contact wirings and the wiring layer may be composed of any material which is dense so that oxygen can hardly pass therethrough at the time of performing thermal oxidation at a later step; in this embodiment, the material is an insulating material.

Next, as shown in FIG. 7F, the protective film 215 for protecting the contact wirings and the wiring layer is patterned, by the photolithography method and anisotropic etching, so as to completely cover the contact wirings and the wiring layer.

An example of this patterned shape is shown in FIG. 7G, and a sectional view taken along the line A—A in FIG. 7G and seen in the direction indicated arrows corresponds to FIG. 7F. Here, the protective film 215 is a protective film patterned so as to cover the contact plug and the bit line, and square regions shown by dotted lines in FIG. 7G are contact wirings, and numeral 207 denotes a portion of the word lines (WL) positioned in a lower part.

If a sintering step for recovering the characteristics of the element formed on the substrate is not performed at a later step, the protective film 215 for protecting the contact wirings and the wiring layer need not be patterned.

Next, as shown in FIG. 7H, an oxide film which will constitute an inter-layer insulation film 216 is deposited to a thickness of about 300 nm. Thereafter, sintering is performed in order to improve the characteristics of the element, in which case the forming gas passes between the portions of the protective film 215 for the patterned contact plug and the wiring layer, reaching the interface to the substrate. Further, if sintering is performed after this, then the ferroelectric film will be deteriorated, and therefore, sintering cannot be performed.

Subsequently, as shown in FIG. 7I, a Pt film which will become a capacitor electrode 217 is deposited to a thickness of about 200 nm, and, on the Pt film, a PZT film which will constitute a capacitor insulation film 218 is deposited to a thickness of about 300 nm. Thereafter, thermal oxidation is carried out in an oxidizing atmosphere at 850° C. for about 30 minutes so that good ferroelectric characteristics can be obtained.

In this case, due to the fact that the protective films 213 and 215 for protecting the contacts and the wiring layer exist, the wiring layer 214 is not subjected to abnormal oxidation and thus can maintain the characteristics thereof. Thereafter, a Pt film which will constitute a capacitor electrode 219 is deposited to a thickness of about 200 nm.

Subsequently, as shown in FIG. 7J, the capacitor electrode 219 is patterned by the use of the photolithography method and anisotropic etching. Thereafter, as shown in FIG. 7K, the capacitor insulation film 218 is patterned by the use of the photolithography method and anisotropic etching.

Further, as shown in FIG. 7L, the capacitor electrode 217 is patterned by the use of the photolithography method and anisotropic etching.

Thereafter, the whole is subjected to thermal oxidation in an oxidizing atmosphere at 850° C. for about 30 minutes so as to recover from the damage caused when the anisotropic etching was carried out and to obtain good ferroelectric characteristics.

In this case, due to the existence of the protective films 213 and 215 for protecting the contacts and the wiring layer, the wiring layer 214 can maintain the characteristics thereof without being abnormally oxidized. Then, as shown in FIG. 7M, an oxide film which will constitute an inter-layer insulation film 220 is deposited to a thickness of about 400 nm.

Thereafter, as shown in FIG. 7N, by the use of the photolithography method and anisotropic etching, contact holes 221 are bored through the inter-layer insulation film 220, the inter-layer insulation film 216 and the protective layer 215 for protecting the contacts and the wiring layer in such a manner that at least the center portion of the interface of the respective contact wiring layer 214 is exposed. As a result, the protective film 215 is brought into a state covering at least a portion (peripheral portion) of the upper surface of the contact wiring layer 214.

On the other hand, a shown in FIG. 7O, by the use of the photolithography method, a contact hole 222 is bored immediately above the contact portion of the capacitor electrode 219.

Thereafter, as shown in FIG. 7P, TiN which will constitute a wiring layer 223 is deposited to a thickness of about 20 nm, and further, Al which will constitute a wiring layer 224 is deposited to a thickness of about 300 nm. As a result, the contact hole 221 constitutes a contact wiring layer perfectly buried an electrically conductive material. Thereafter, as shown in FIG. 7Q, by the use of the photolithography method and anisotropic etching, the wiring layer 223 and the wiring layer 224 are patterned.

Thereafter, as shown in FIG. 7R, an oxide film which will constitute an inter-layer insulation film 226 is deposited to a thickness of about 400 nm. Further, as shown in FIG. 7S, SixNy which will constitute a final protective film 227 is deposited to a thickness of about 150 nm. Thereafter, by the use of the photolithgraphy method and anisotropic etching, a pad portion is bored by the use of the photolithography method and anisotropic etching.

Next, a fifth embodiment of the semiconductor device according to the present invention will be described by reference to FIGS. 8A to 8S.

Figure 8A:
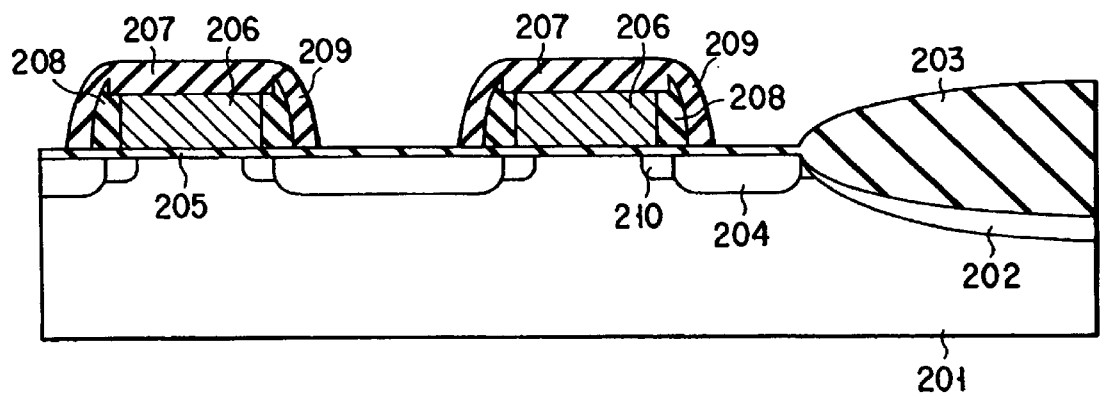
FIGS. 8A to 8S are sectional views showing in due order the manufacturing steps according to a fifth embodiment of the method for the manufacture of a semiconductor device according to the present invention.

First, as shown in FIG. 8A, an element isolation oxide film 203 is deposited to a thickness of about 400 nm on an, e.g. P-type Si substrate 201. Thereafter, by ion implantation, an element isolation region (channel stopper) 202 is formed. Subsequently, by thermal oxidation, a gate insulation film 205 is formed to a thickness of about 14 nm. Thereafter, WSi which will constitute a gate wiring layer 206 is deposited to a thickness of about 200 nm, and further, SixNy which will constitute a gate electrode protecting film 207 is deposited to a thickness of about 200 nm.

Next, by the use of the photolithography method and anisotropic etching, the gate wiring layer 206 and the gate wiring layer protecting film 207 are formed. If, in this case, the gate electrode protecting film 207 is formed by the use, as its material, of a dense film composed of a nitride-based material such as the SixNy, then the gate electrode protecting film 207 will not be affected by the thermal oxidation performed at a later step, so that the characteristics of the gate wiring layer 206 will not be spoiled; for instance, the low resistance value thereof will be maintained.

Thereafter, by ion implantation, a diffused layer 210 is formed. Then, by thermal oxidation, a gate side-wall protecting oxide film 208 is formed. Further, SixNy which will constitute a gate side-wall protecting film 209 is deposited to a thickness of about 50 nm, and a gate side-wall protecting film 209 is formed by anisotropic etching. In this case, the gate side-wall protecting film 209 had better be composed by the use, as its material, of a dense film composed of a nitride-based material such as SixNy, since, if so, the gate side-wall protecting film 209 will not be affected by the thermal oxidation performed at a later step and thus, the characteristics thereof as a wiring of the gate wiring layer 206 will not be spoiled.

Figure 8B:
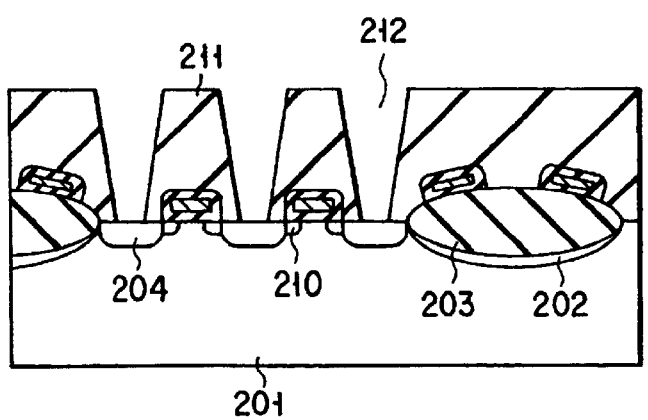

Next, by ion implantation, a diffused layer 204 is formed. Thereafter, as shown in FIG. 8B, an oxide film which will constitute an inter-layer insulation film 211 is deposited to a thickness of about 400 nm. Subsequently, by the use of the photolithography method and anisotropic etching, grooves which constitute wiring layers are formed by the use of the photolithography method and anisotropic etching.

Further, contact holes are bored in the inter-layer insulation film 211 so as to connect to the diffused layer 204.

Figure 8C:
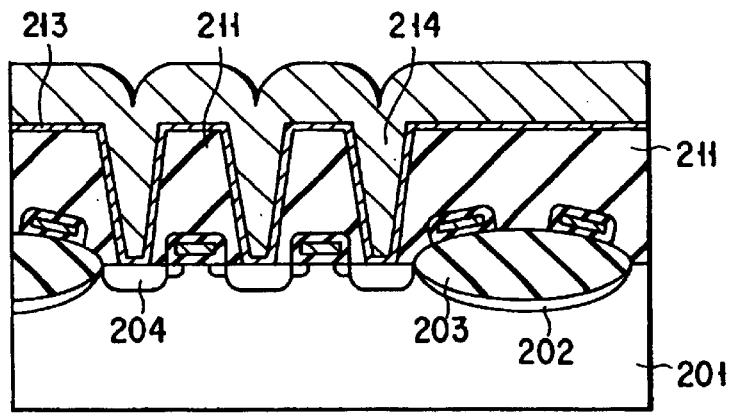

Subsequently, as shown in FIG. 8C, TiN is deposited to a thickness of about 20 nm for formation of a wiring layer 214 which will constitute contact wiring layers and a wiring layer, and subsequently, tungsten (W) is deposited to a thickness of about 400 nm for formation of a wiring layer 214 which will constitute a contact wiring layer and a wiring layer. Thereafter, by the use of the photolithography and anisotropic etching, a buried wiring layer 213 and a buried wiring layer 214 are formed.

In this case, the wiring layer 213 is composed by the use of TiN in order to prevent the abnormal oxidation of the tungsten (W) wiring layer 214 by the thermal oxidation performed at a later step and to improve the adhesion of the contact buried layers, but, in case of attention is drawn only to the prevention of the abnormal oxidation of the tungsten (W) wiring layer 214, an insulation film such as a nitride film (such as, e.g. SixNy), a titanium oxide ($T_iO_2$) or the like which is dense so that oxygen can hardly pass therethrough can be used as an oxygen barrier film in place of the TiN film. In this case, in order to ensure the electric connection of the diffused layer 204 and the wiring layer 214, the oxygen barrier film which is composed of an insulation film only in its bottom portion must be removed, but since the same material as the material of a protective film—which will be described later—on the wiring layer 214 is used, the matching between them is good.

Figure 8D:
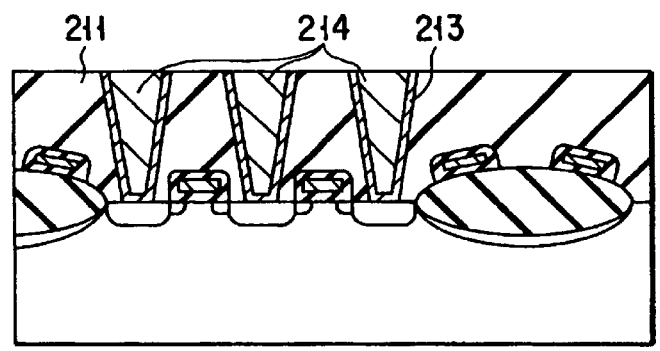

Next, as shown in FIG. 8D, by the use of the CMP method, the surface is polished until the inter-layer insulation film 211 comes to be exposed, whereby the contact wiring layer and wiring layer 214 is formed.

Figure 8E:
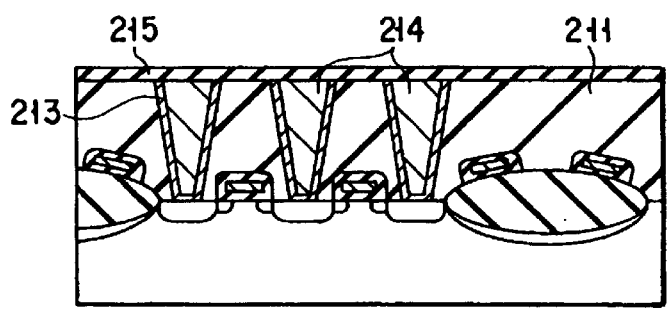

Thereafter, as shown in FIG. 8E, SixNy which will constitute a protective film for the contact wiring layer and wiring layer 214 is deposited to a thickness of about 100 nm. The protective film 215 for the contact wiring layer and wiring layer may be composed of a dense material, regardless of whether it is electrically insulating or conductive, through which oxygen can hardly pass when thermal oxidation is performed at a later step.

Figure 8F:
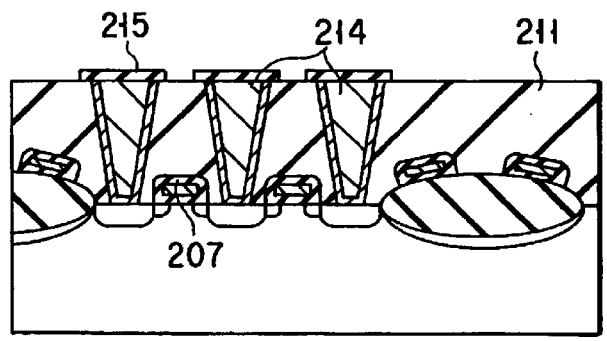

Further, as shown in FIG. 8F, by the use of the photolithography method and anisotropic etching, the protective film 215 is patterned so as to completely cover the contact wiring layer and wiring layer 214.

Figure 8G:
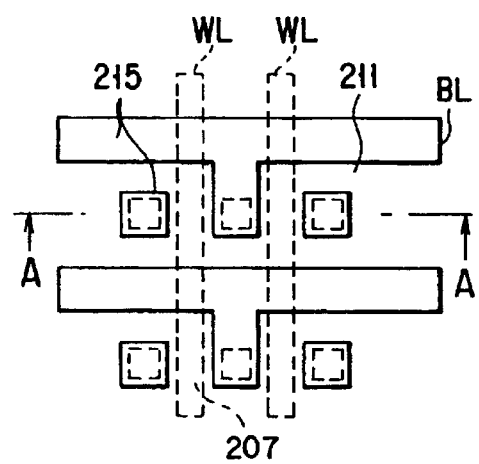

FIG. 8G shows an example of this patterned shape, wherein a sectional view taken along the line A—A in FIG. 8G and seen in the direction indicated by arrows corresponds to FIG. 8F. Here, the reference numeral 215 denotes the protective film patterned so as to cover the contact plug and the bit line, wherein the square regions shown by dotted lines are contact plugs, and a region 207 is a portion of a word line (WL) disposed as a lower layer.

Figure 8H:
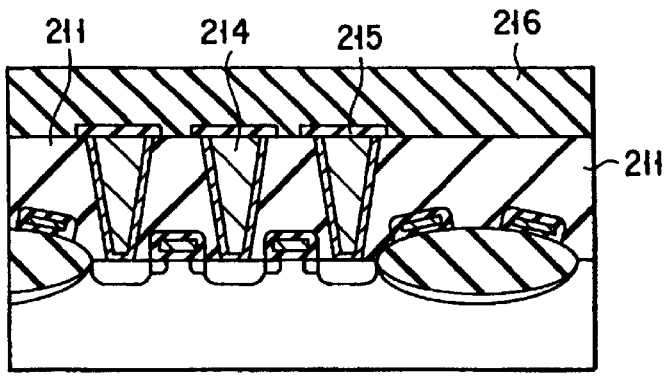
Figure 8I:
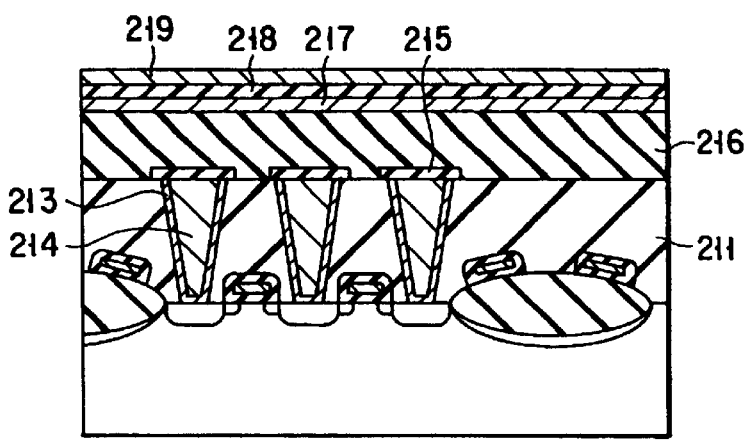

Next, as shown in FIG. 8H, an oxide film which will constitute an inter-layer insulation film 216 is deposited to a thickness of about 300 nm. Thereafter, as shown in FIG. 8I, Pt which will constitute a capacitor electrode 217 is deposited to a thickness of about 200 nm, and a PZT film which will constitute a capacitor insulation film 218 is deposited to a thickness of about 300 nm.

Thereafter, in order to obtain good ferroelectric characteristics, thermal oxidation is carried out in an oxidizing atmosphere at 850° C. for about 30 minutes. In this case, due to the existence of the protective films 213 and 215 for protecting the contact wiring layers and the wiring layer, the wiring layer 214 can maintain its characteristics without being abnormally oxidized. Thereafter, a Pt film which will constitute a capacitor electrode 219 is deposited to a thickness of about 200 nm.

Figure 8J:
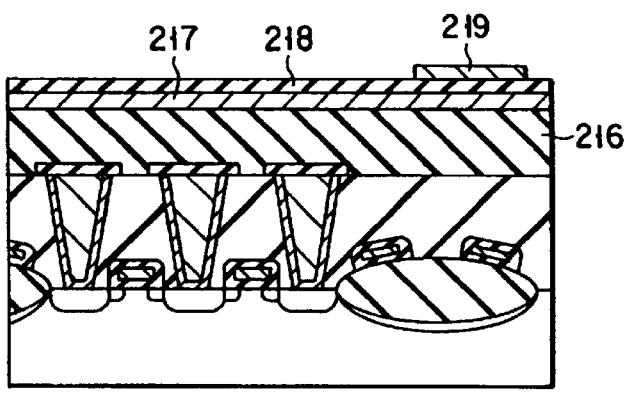
Figure 8K:
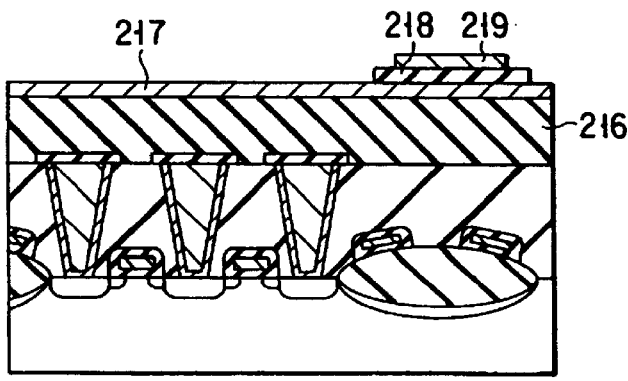

Next, as shown in FIG. 8J, by the use of the photolithography method and anisotropic etching, the capacitor electrode 219 is patterned. Thereafter, as shown in FIG. 8K, by the use of the photolithography method and anisotropic etching, the capacitor insulation film 218 is patterned.

Figure 8L:
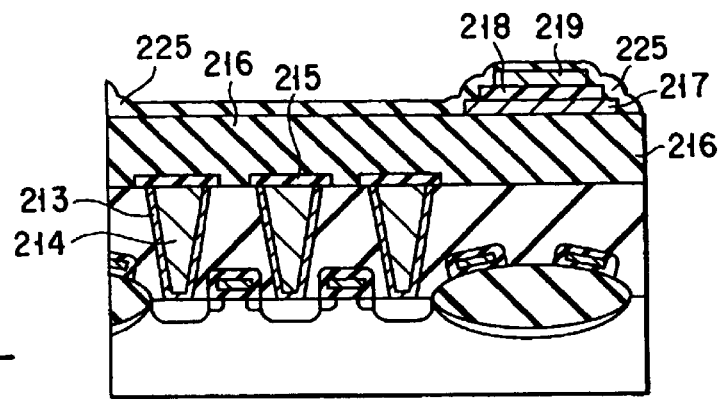

Subsequently, as shown in FIG. 8L, by the use of the photolithography method and anisotropic etching, the capacitor electrode 217 is patterned. Thereafter, thermal oxidation is performed in an oxidizing atmosphere at 850° C. for about 30 minutes so as to recover from the damage caused by the anisotropic etching and to obtain good ferroelectric characteristics. In this case, due to the existence of the protective films 213 nd 215 for protecting the contact wiring layer and the wiring layer, the wiring layer 214 can maintain its characteristics without being abnormally oxidized.

Thereafter, by the use of the puttering method, SixNy which will constitute a capacitor protecting film 225 is deposited to a thickness of about 100 nm. This is because it is ensured that, when sintering is carried out at a later step, the PZT film is protected from being reduced; the $TiO_2$ set forth in connection with the third embodiment can be used similarly. In this connection, it is added that, if the SixNy is deposited by the use of any film forming method other than the sputtering method, then there is the fear that the PZT may be reduced by the gas—which contains much hydrogen—when the film is formed.

Figure 8M:
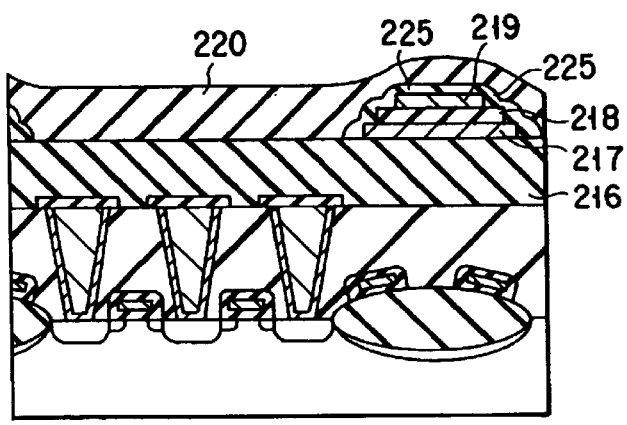

Next, as shown in FIG. 8M, by the sue of the photolithography method and anisotropic etching, the extra SixNy existing in the portions other than the capacitor portion is eliminated by etching. Thereafter, an oxide film which will constitute an inter-layer insulation film 220 is deposited to a thickness of about 400 nm.

Figure 8N:
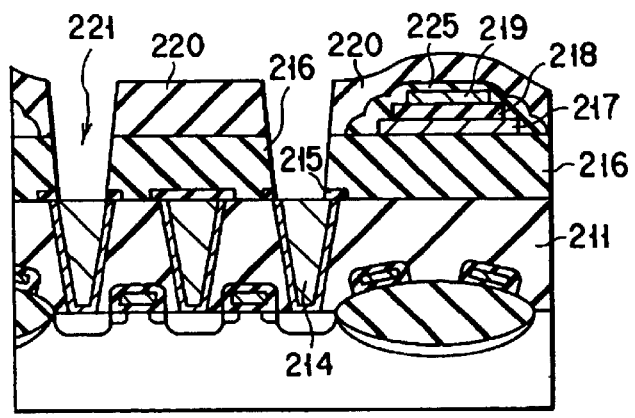

Subsequently, as shown in FIG. 8N, a contact hole 221 is bored in the inter-layer insulation film 220, the inter-layer insulation film 216 and the protective film 214 for protecting the contact wiring layer and the wiring layer, by the use of the photolithography method and anisotropic etching so that the interface of the contact wiring layer 214 may be exposed.

Figure 8O:
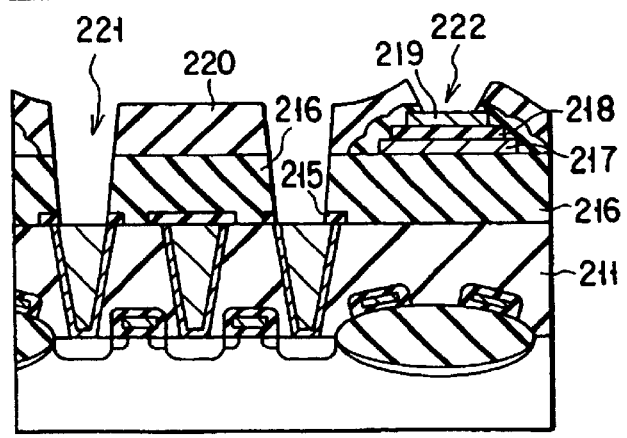

On the other hand, as shown in FIG. 8O, a contact hole 222 is bored directly above the contact portion of the capacitor electrode 219 by the use of the photolithography method.

Figure 8P:
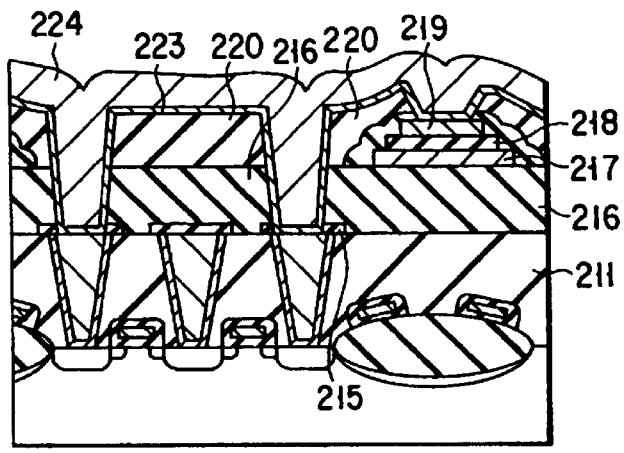

Thereafter, as shown in FIG. 8P, TiN which will constitute a wiring layer 223 is deposited to a thickness of about 20 nm, and further, Al which will constitute a wiring layer 224 is deposited to a thickness of about 300 nm. As a result, the contact hole 221 is rendered into a contact wiring layer completely filled up with and buried in an electrically conductive material.

Figure 8Q:
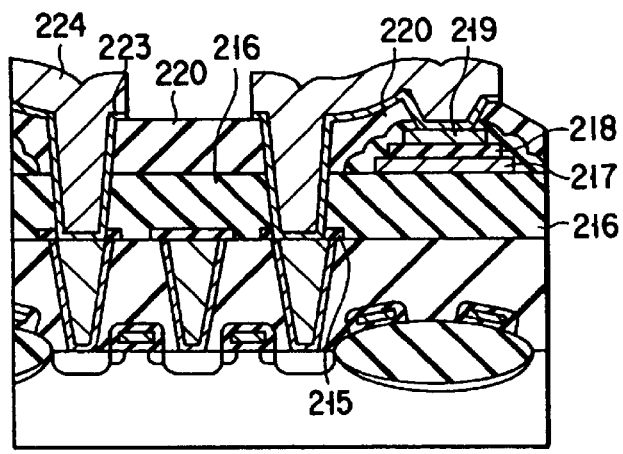

Subsequently, as shown in FIG. 8Q, the wiring layer 223 and the wiring layer 224 are patterned. Thereafter, sintering is carried out in order to improve the characteristics of the element formed on the Si substrate. In this case, the forming gas reaches the interface of the substrate, passing through the portions of the protective film 215 for the patterned contact wiring layer and wiring layer.

Figure 8R:
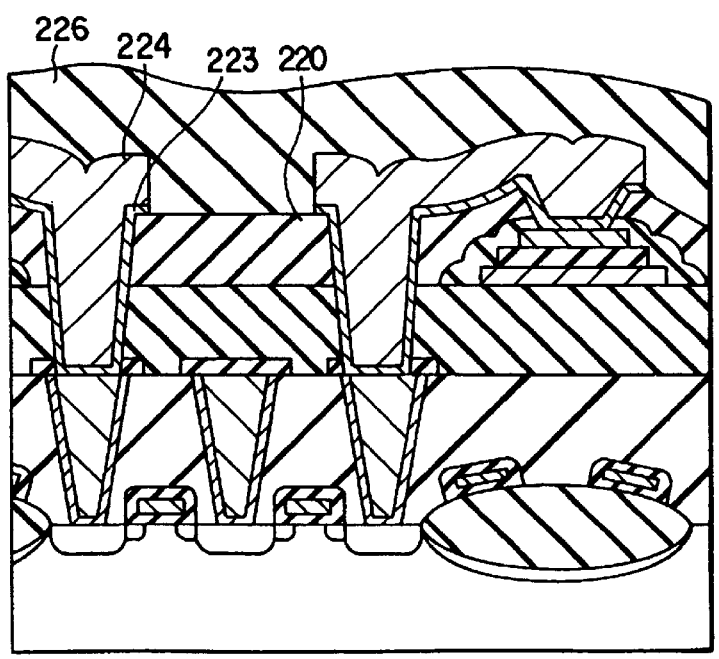
Figure 8S:
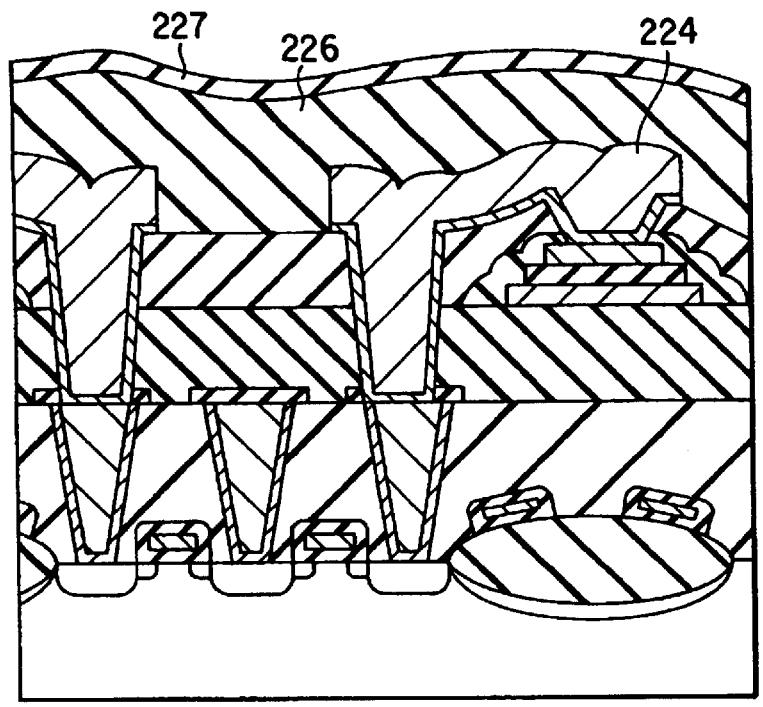

Next, as shown in FIG. 8R, an oxide film which will constitute an inter-layer insulation film 226 is deposited to a thickness of about 400 nm. Further, a shown in FIG. 8S, by sputtering, SixNy which will constitute a final protective film 227 is deposited to a thickness of about 150 nm. Since there is the fear that the gas used for depositing this SixNy may reduce the PZT film, it is desirable to form the SixNy into a film by sputtering. Thereafter, by the use of the photolithography method and anisotropic etching, a pad portion (not shown) is bored.

In the case where, in the fourth and fifth embodiments described above, in place of the ferroelectric film, a high-permittivity dielectric film having a dielectric constant of 50 or higher is used; more concretely, in the case where a high-permittivity dielectric film comprising a substance having the perofskite structure or the lamellar perofskite structure such as strontium titanate ($SrTiO_3$), BST (Ba, Sr) $TiO_3$) or the like is used, the present invention is also effective.

Further, in the cases of the fourth embodiment and the fifth embodiment, the following effects can be obtained in accordance with the structure of the semiconductor device, the manufacturing process thereof or partial alterations thereof:

(1) By covering the contact side wall with a nitride compound or a $TiO_2$ film, it is possible to prevent the penetration of oxygen into the contact from the side wall and thus to prevent the penetration of oxygen into the contact from the side wall so as to prevent the contact resistance from increasing and to prevent the contact wiring from being abnormally oxidized to cause cracks in the device.

(2) By covering the upper surface of the contact and the wiring layer with a nitride compound or $TiO_2$ film, it is possible to prevent the penetration of oxygen into the contact and the wiring layer from the upper direction and thus to prevent the contact resistance and the wiring resistance from increasing and to prevent the contact wiring and the wiring layer from being abnormally oxidized to cause cracks in the device.

(3) By flattening, by the use of the CVD method, the upper surfaces of the inter-layer insulation films in which the contact window is bored and, further, covering the upper surfaces of the contact and the wiring layer with a nitride compound or $TiO_2$ film, it is possible to improve the adhesion of the inter-layer films and the nitride compound films and the nitride compound films in which the contact window is bored and to prevent the penetration of oxygen into the contacts and the wiring layer from above and thus to prevent the contact resistance and the wiring resistance from increasing and to prevent the contact wiring and the wiring layer from being abnormally oxidized to cause cracks in the device.

(4) By covering the upper surface of the contact and the wiring layer with a nitride compound or $TiO_2$ film and patterning the nitride compound or $TiO_2$ film so as to leave them in a state covering the upper surface of the contact, the upper surface and the side wall of the wiring layer, it is made possible to prevent the penetration of oxygen into the contact and the wiring layer from above and to prevent the contact resistance and the wiring resistance from increasing and to prevent the contact wiring and the wiring layer from being abnormally oxidized to cause cracks in the device. Further, it is also possible to make it hard for cracks to be caused in the nitride compound or $TiO_2$ wiring protecting film due to the stress based on the deformation of the film due to the heat at a later step. In addition, the forming gas at a later step can reach the substrate, passing through between the portions of the patterned wiring protecting film, and thus a sufficient effect can be exhibited.

(5) By covering the upper surface and side wall of the contact and the side wall and the upper surface of the wiring layer with a nitride compound or $TiO_2$ film, it becomes possible to prevent the penetration of oxygen into the contact and the wiring layer from the upper and lateral directions and thus to prevent the contact resistance and the wiring resistance from being increased due to the thermal oxidation performed at high temperature and for a long time and to prevent the contact wiring and the wiring layer from being abnormally oxidized to cause cracks in the device.

(6) By covering the upper surface of the contact and the wiring layer with a nitride compound or $TiO_2$ film and, thereafter, forming a high-permittivity dielectric film or ferroelectric film and, thereafter, performing contact connection with the multi-layer wirings, it becomes possible to prevent the penetration of oxygen—the oxygen at the thermal oxidation step when the high-permittivity film or the ferroelectric film is formed—into the contact and the wiring layer from the upper direction and thus to prevent the contact resistance and the wiring resistance from being increased and thus to prevent the contact wiring and the wiring layer from being abnormally oxidized to cause cracks in the device.

In addition, the contact connection with the multi-layer wiring is facilitated.

(7) By covering the upper surface of the contact and the wiring layer with a nitride compound or $TiO_2$ film, forming a wiring protecting film, patterning the wiring protecting film, and thereafter, forming a high-permittivity dielectric film or ferroelectric film, and thereafter, performing the contact connection with the multi-layer wiring, it becomes possible to prevent the penetration of oxygen—the oxygen at the thermal oxidations step when the high-permittivity film or the ferroelectric film is formed—into the contact and the wiring layer from the upper direction, thus to prevent the contact resistance and the wiring resistance from being increased, and to prevent the contact wiring and the wiring layer from being abnormally oxidized to cause cracks in the device. Further, the forming gas at the sintering step immediately before the formation of the high-permittivity film or the ferroelectric film passes through the portions of the patterned wiring protecting film, reaching the substrate, whereby the effect of the sintering can be sufficiently exhibited.

(8) By covering the high-permittivity dielectric or ferroelectric capacitor with a wiring layer protecting film comprising a nitride film or $TiO_2$ film after the formation of the high-permittivity dielectric or ferroelectric capacitor, the forming gas at a later sintering step can pass between the portions of the patterned wiring protecting film and reach the substrate, whereby the effect thereof can be sufficiently exhibited, and the ferroelectric or high-permittivity dielectric capacitor is not exposed to the reducing atmosphere, so that it becomes possible to perform sintering without deteriorating the characteristics of the capacitor.

The above-mentioned effects of the fourth and fifth embodiments can be summarized as follows:

(1) Before formation of the ferroelectric or high-permittivity dielectric film, a wiring layer composed of a high-melting metal can be formed without being brought into a high resistance.

(2) In forming a contact having a high aspect ratio, the contact can be led out from the substrate before the formation of the ferroelectric or high-permittivity dielectric film.

(3) The formation of the wiring in a semiconductor device using ferroelectric or high-permittivity dielectric film which device cannot but be of the lay-up type cell structure under the existing technical condition is made easy.

(4) A dense film composed of a nitride film or TiO2 is used as a protective material for the contact, the wiring layer and the high-permittivity dielectric or ferroelectric film, whereby the influence given on the substrate and the elements therearound by oxygen and other pollution substances transmitted from the wiring layer can be prevented.

(5) By patterning the wiring layer protecting film composed of a nitride film or $TiO_2$, sintering can be performed immediately before the formation of the ferroelectric or high-permittivity dielectric film, so that the characteristic of the element on the substrate can be maintained in a good condition.

(6) By covering the ferroelectric or high-permittivity dielectric capacitor with a wiring layer protecting film composed of a nitride film or $TiO_2$, sintering can be performed after the formation of the ferroelectric or high-permittivity dielectric capacitor, so that the characteristics of the element on the semiconductor substrate can be maintained in good condition.

Next, a sixth embodiment of the semiconductor device according to the present invention will be described by reference to FIGS. 9 to 12.

The sixth embodiment is almost the same as the fourth and fifth embodiments but has a feature in respect of the structure of the array of ferroelectric cells; and an example of the structure will be described in detail below.

Figure 9:
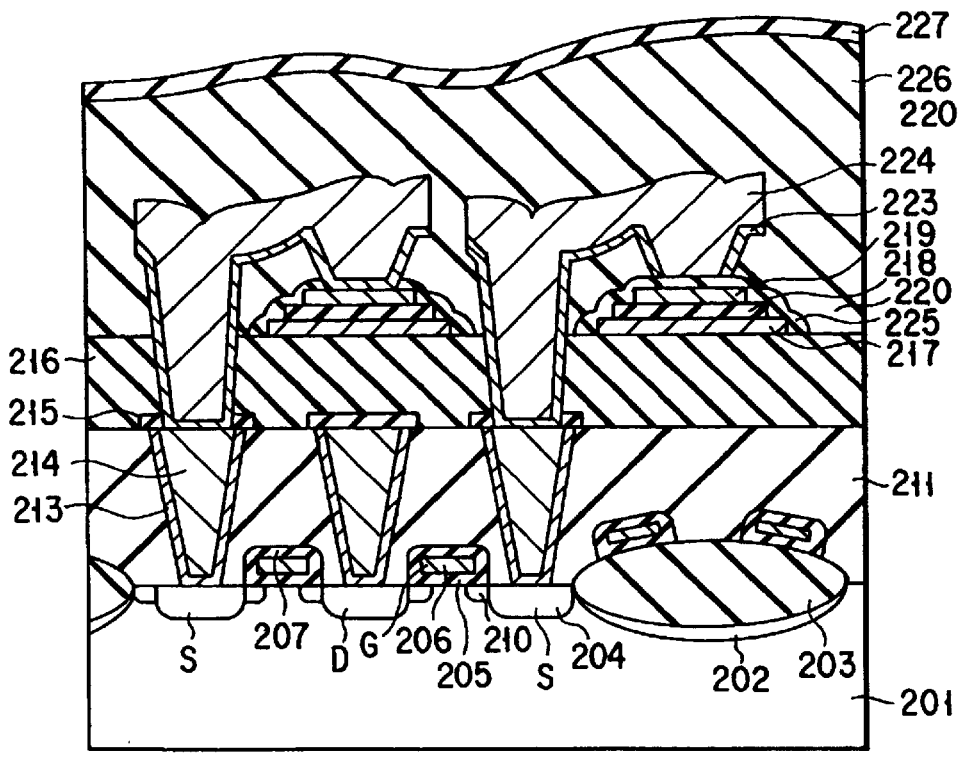
FIG. 9 is a sectional view showing a part of the cell array of the FRAM according to a sixth embodiment of the method for the manufacture of a semiconductor device according to the present invention.

FIG. 9 shows a sectional structure of a portion of the cell array of an FRAM composed in such a manner that one charge transfer MOS transistor (pass transistor) and one information storage ferroelectric capacitor are connected in series to form a unit cell, and such unit cells are arranged in a matrix state to constitute a memory cell array.

Figure 10:
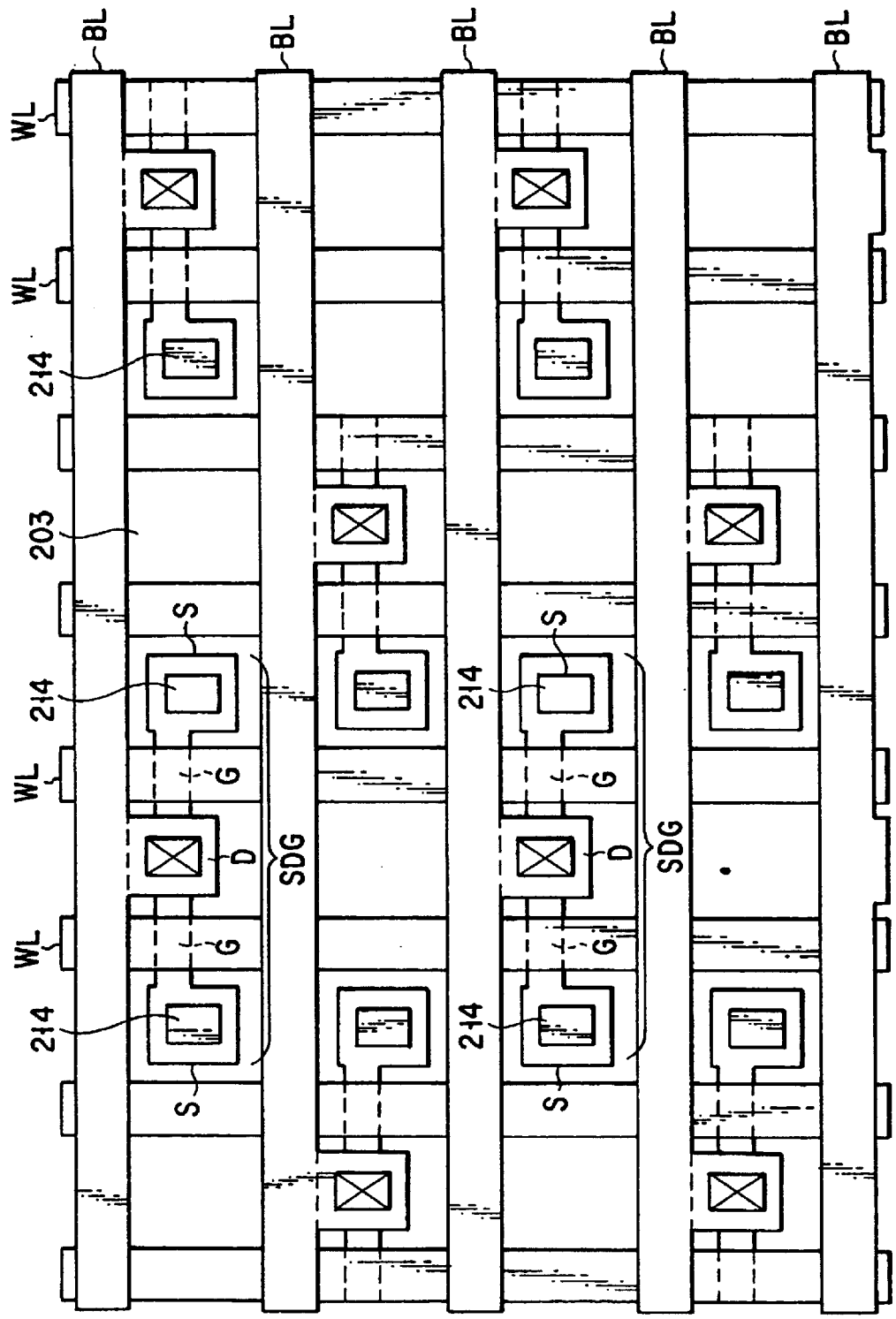
FIG. 10 is a diagram showing a part of a plane pattern corresponding to the manufacturing step of the FRAM cell array shown in FIG. 9.
Figure 11:
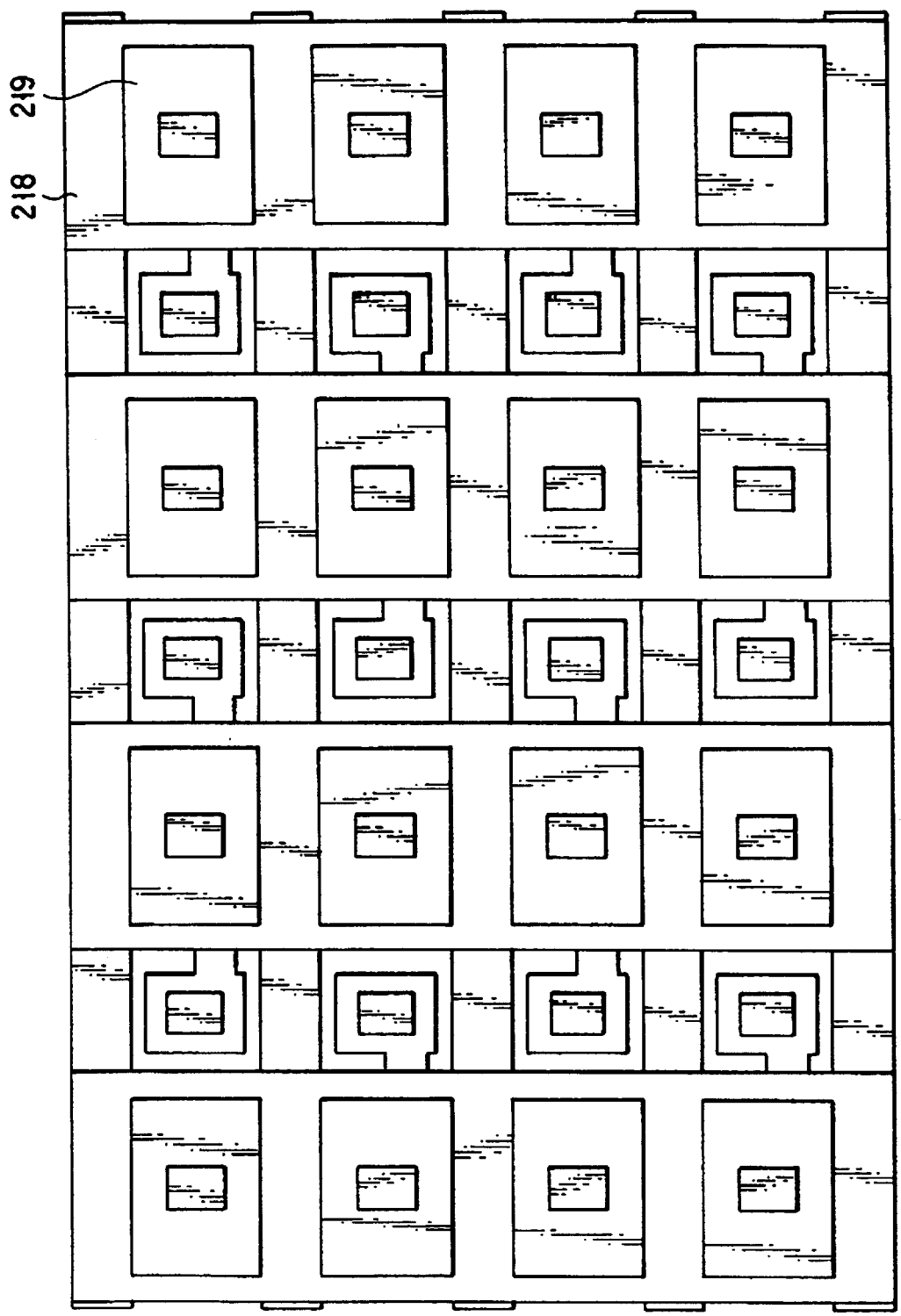
FIG. 11 is a diagram showing a part of a plane pattern corresponding to the manufacturing step—following the step shown in FIG. 10—of the FRAM cell array.
Figure 12:
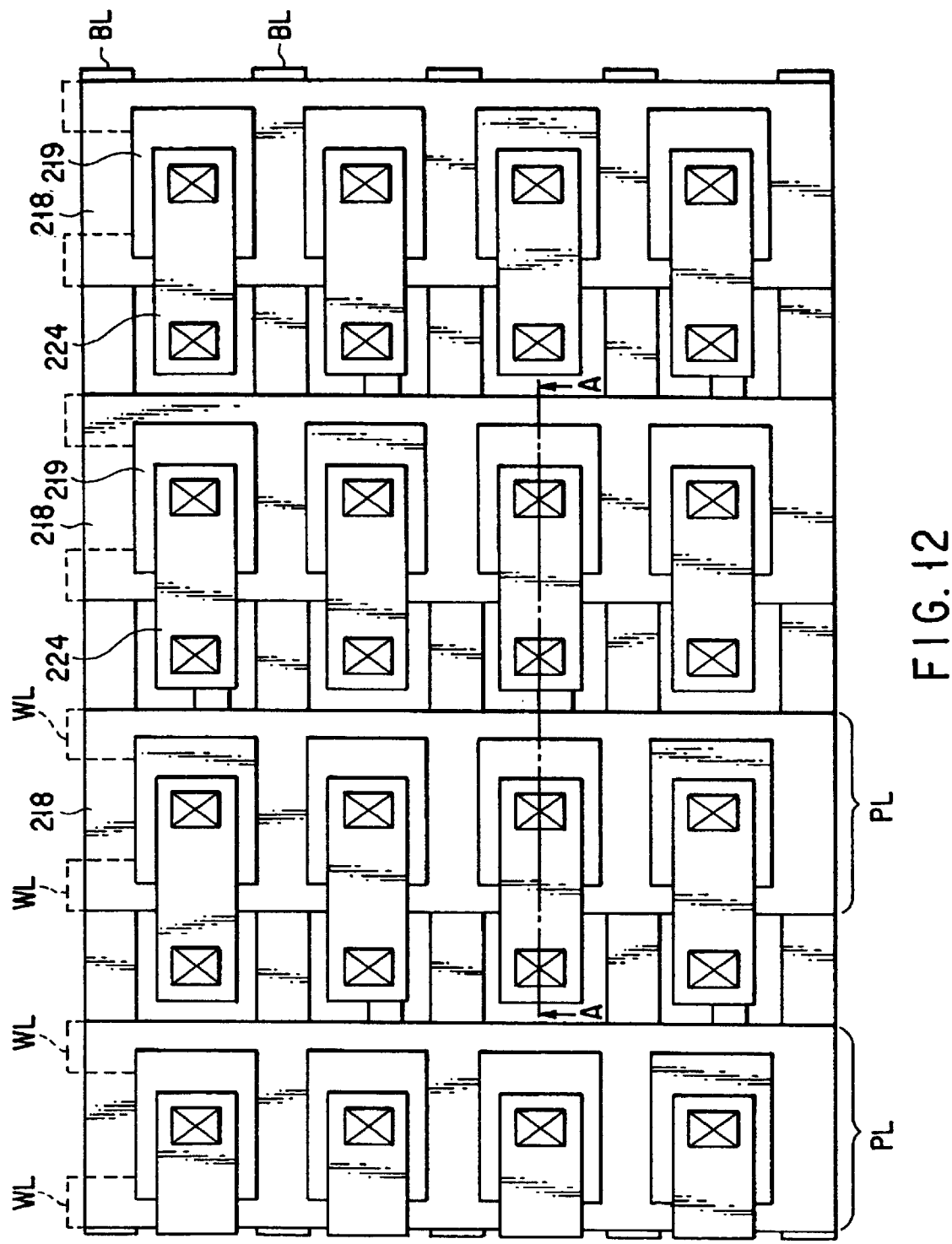
FIG. 12 is a diagram showing a part of a plane pattern corresponding to the FRAM cell array manufacturing step following the manufacturing step shown in FIG. 11.

FIGS. 10 to 12 exemplarily and roughly show a portion of the plane pattern of the above-mentioned FRAM cell array in the order of the manufacturing steps, wherein the sectional view taken along the line A—A in FIG. 12 and seen in the direction indicated by arrows corresponds to FIG. 9.

For simplification of the description, the respective word lines are denoted by WL, the respective bit lines are denoted by BL, and the respective plate lines are denoted by P1.

Referring to FIGS. 9 to 12, on the upper layer portion of a silicon substrate 201, a plurality of element regions (activated regions) SDG are formed in an approximately straight line in a direction (in a direction parallel to the direction in which the bit lines BL are formed) approximately orthogonal to the direction in which the respective word lines WL are formed, and further, (sid SDG) are plane-wise formed in a matrix-like arrangement. Further, between the respective element regions SDG, an oxide film 203 for inter-element isolation and a region of an inter-element isolation (channel stopper) 202 under the oxide film 203 are formed.

Here, the SDG regions on the respective lines are displaced by a length (one pitch) corresponding to the length of one SDG region, and the respective element regions SDG as a whole are disposed in a checkered pattern (a zigzag arrangement unlike a regular lattice).

The respective element regions SDG are each constituted in such a manner that, in the area extending from the center portion to one side, a first drain, a first gate and a first source regions constituting a first MOS transistor are formed in a straight line state, and in the area extending from the center portion to the other side, a second drain, a second gate and a second source regions constituting a second MOS transistor are formed in a straight line state, wherein the center portion constitutes the common drain region D for the first and the second MOS transistors.

On the channel region of the respective MOS transistor, the gate electrode portion G is formed through a gate oxide film 205; and the plurality of gate electrode portions G existing along the same line are continuously connected to one another to form a word line WL; and the group of word lines WL are formed in parallel to one another.

In this case, each word line WL (gate electrode portion G) 206 is of a two layer structure consisting of, e.g. P-doped polycrystalline silicon and WSi and is protected by a surface insulation film 207 and a side wall insulation film.

Further, on the surface insulation film 207 and the side wall insulation film, a flattening inter-layer insulation layer 211 is formed, and, on the inter-layer insulation film 211, a group of bit lines BL are formed in a state extending in the direction orthogonal to the direction in which the group of word lines WL are formed.

In this case, in the inter-layer insulation film 211, a contact hole is bored correspondingly to and above the region (drain region) D in which an impurity of the second conductivity type (n type in this embodiment) has been diffused, in the center portion of each element region SDG; and, on the inter-layer insulation film 211 and at a position a little shifted from the contact hole, there is formed a bit line BL consisting of a barrier metal film 213 and an electrically conductive film 214; and each bit line BL is contacted, in the contact hole, with the respective drain regions D of the plurality of element regions SDG on the same line.

Further, in the inter-layer insulation film 211, a contact hole is bored correspondingly to and above the region (source region) S, at one end of each element region SDG, in which an impurity of the second electric conductivity type (n type in this embodiment) has been diffused; and in the contact hole of the inter-layer insulation film 211, a capacitor contact wiring consisting of a barrier metal 213 and an electrically conductive film 214 is formed.

Further, in a portion of the upper surface of the bit line BL and the upper surface of the capacitor contact wiring, a silicon nitride film (or a titanium oxide film) 215 is formed. Further, on the substrate containing the silicon nitride film (or the titanium oxide film) 215, there is formed a flattening inter-layer insulation film 216. On the inter-layer insulation film 216, an ferroelectric capacitor of the stack structure (a lower electrode 217, a ferroelectric insulation film 218 and an upper electrode 219) is formed for each unit cell.

Further, on the ferroelectric capacitor, a silicon nitride film (or a titanium oxide film) is formed as a capacitor protecting insulation film 225, and, on the insulation film 225, an inter-layer insulation film 220 is formed, and a passivation film 227 is formed.

In this case, the lower electrodes 217 of the plurality of ferroelectric capacitors on the same line are each formed so as to cover the upper surface of the center portion of the SDG region containing the corresponding MOS transistor or the upper surface of the adjacent element separation oxide film 203 and continuously in a direction parallel to the direction in which the group of word lines WL is formed (that is, in a direction orthogonal to the bit line BL), constituting a capacitor plate line PL.

Further, the upper electrode 219 of the ferroelectric capacitor in each unit cell is formed in, e.g. a square shape above the corresponding lower electrode 217 through the ferroelectric insulation film 218.

Further, the upper electrode 219 of the ferroelectric capacitor is connected, through a local connection electrode wiring 224, to the capacitor contact wiring contacted with the impurity-diffused region (source region) S—in which an impurity of the second conductivity type (the n type in this embodiment) has been diffused—at one end of the corresponding MOS transistor.

Next, a seventh embodiment of the semiconductor device according to the present invention will-be described by reference to FIGS. 13 to 15.

Figure 13:
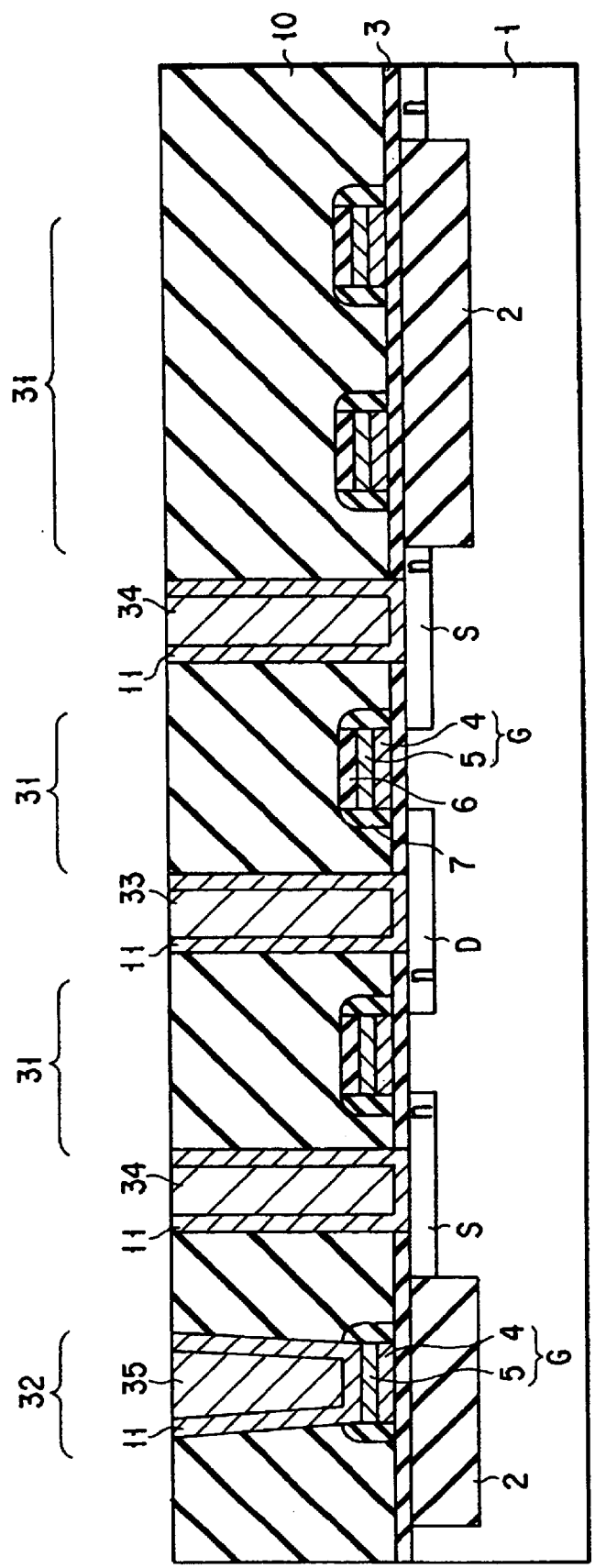
FIG. 13 is a sectional view showing the manufacturing step showing a seventh embodiment of the method for the manufacture of a semiconductor device according to the present invention.
Figure 14:
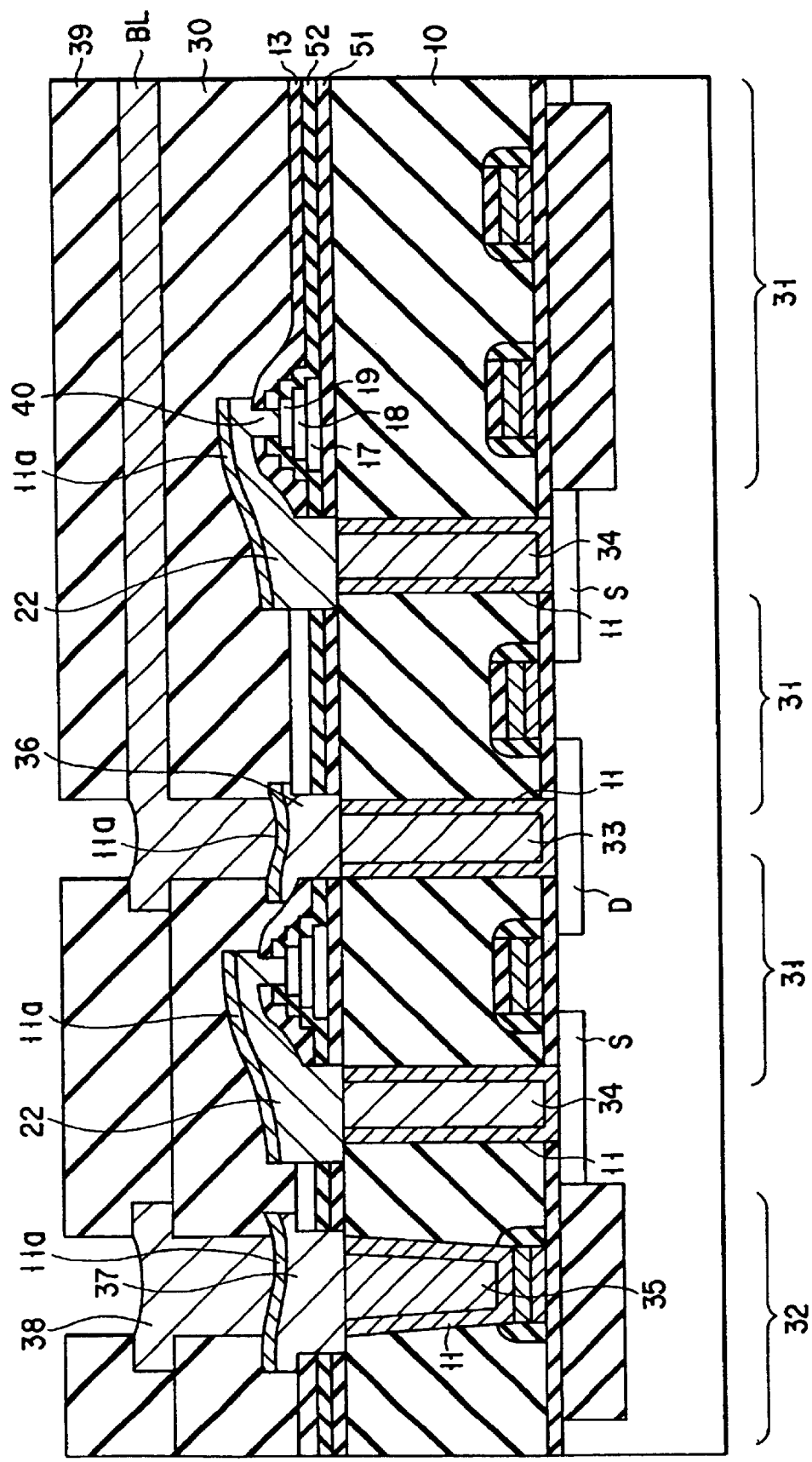
FIG. 14 is a sectional view showing the manufacturing step following the manufacturing step shown in FIG. 13.

FIG. 13 and FIG. 14 roughly show a portion of the sectional structure, during the manufacturing process, of the FRAM cells and elements in another FRAM.

The process of manufacturing the semiconductor device according to the seventh embodiment is characterized in that at least one of the materials, Al, AlCu, AlCuSi, WSi$_2$, and Cu (aluminum in this embodiment) is made to reflow in order to fill up via holes for performing the connection of the second layer wiring (bit line or another wiring) in a two-layer wiring structure.

Figure 15:
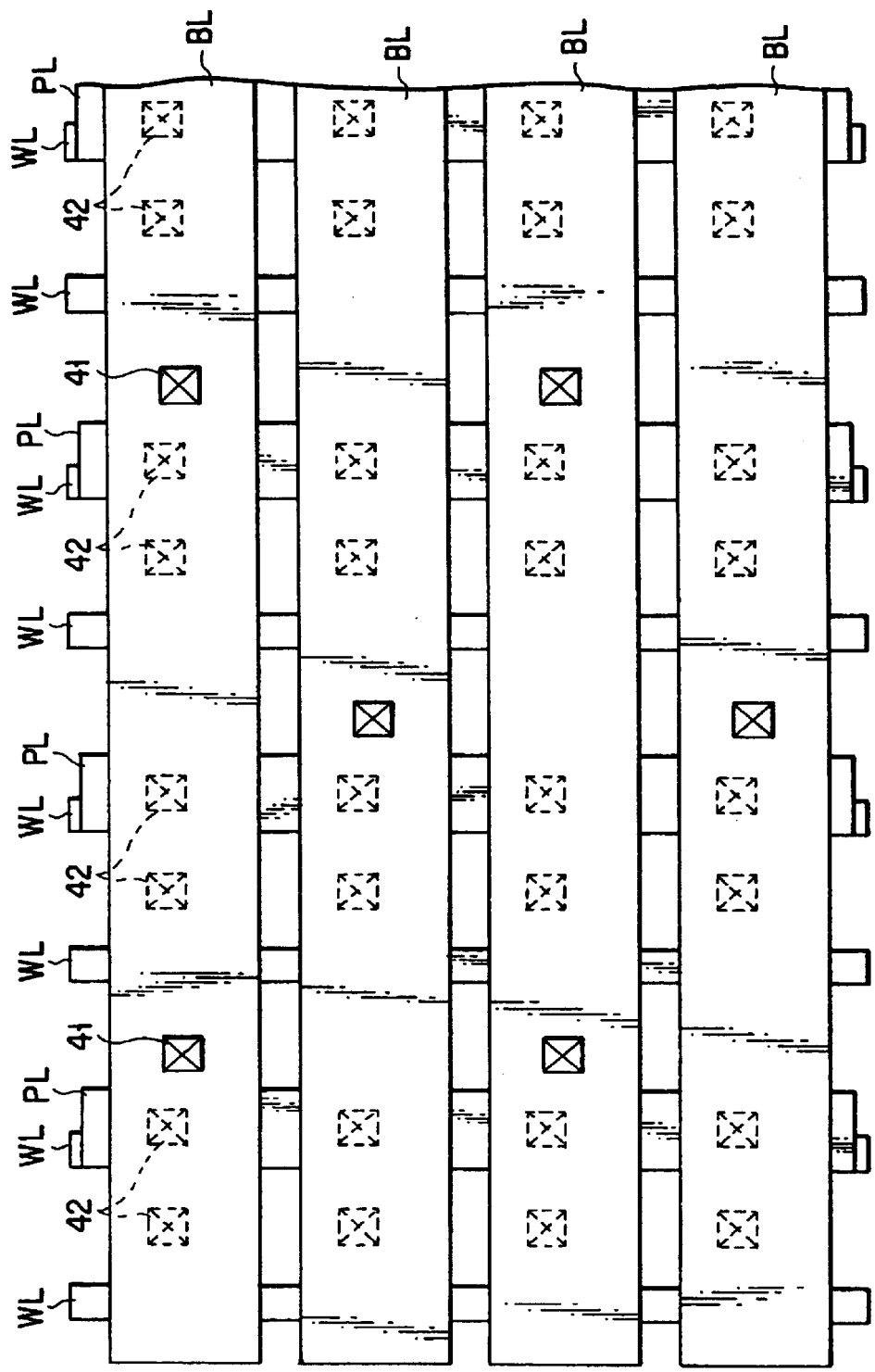
FIG. 15 is a diagram showing a part of a plane pattern corresponding to the sectional view showing the manufacturing step shown in FIG. 14.

FIG. 15 roughly shows an example of the plane pattern of a portion of the FRAM cell array.

Referring to FIG. 13 and FIG. 14, switching MOS transistors 31 for the memory cells and a MOS transistor 32 for compositely mounted devices other than the memory cells are formed on a semiconductor substrate 1.

In a first insulation layer 10 which covers the upper surfaces of the transistors and the surface of which is flattened (that is, the underlying undulations have been flattened), bit line contact wirings 33 connected to the drain regions D and the source regions S of the switching transistors 31 through barrier metal layers 11 and capacitor contact wirings 34 are formed in a buried state; and further, a contact wiring 35 connected to the gate G of the other MOS transistor 32 for the compositely mounted devices through a barrier metal layer 11 is formed in a buried state.

Further, on the first insulation layer 10, a first SixNy film (or a TiO$_2$ film) 51 is formed (FIG. 14).

On the first SixNy film (or TiO2 film) 51, lower electrodes 17, ferroelectric films 18 and upper electrodes 19 are formed in this order, and a second SixNy film (or a TiO$_2$ film) 52 is formed so as to cover the substrate containing the lower electrodes 17, the ferroelectric films 18 and the upper electrodes 19, and further, on the second SixNy film 52, a second insulation layer 13 is formed.

Further, in the second insulation layer 13, the second SixNy film (or TiO$_2$ film) 52 and the first SixNy film (or TiO$_2$ film) 51, holes are selectively formed corresponding to and positioned above the bit line contact wiring contact wirings 33, the capacitor contact wirings 34 and the contact wiring 35 for compositely mounted device. In the second insulation layer 13 and the second SixNy film (or TiO$_2$ film) 52, holes are selectively formed corresponding to and positioned above the upper electrodes 19.

Further, through the holes, there are formed bit line buried plug connection wirings (bit line connecting contact pattern) 36 connected to the bit line contact wirings 33, upper electrode leading-out wirings (capacitor electrode winnings) 22 connected to the capacitor contact wirings 34 and the upper electrodes 29, and first layer wirings 37 connected to the contact wiring 35 for the compositely mounted device.

The upper electrode leading-out wirings 22 and the bit line buried connection wirings 36 are composed of at least one of the materials, Al, AlCusi, AlCu, W metal, TiN metal, and Ti metal and are constituted of the same wiring layer as the first wirings 37. Further, on the upper surface side of the upper electrode leading-out wirings 22, the bit line buried connection wirings 36 and the first wirings 37, a metal layer 11a composed of one of tungsten (W) metal, TiN metal, and Ti metal is selectively formed; these can be formed by the use of the high-frequency magnetron sputtering method or the MOCVD method which does not inflict damage on the ferroelectric film 18.

In a third insulation layer 30 which covers the upper surface of the substrate containing the respective wirings mentioned above and the surface of which is flattened, via holes are selectively formed corresponding to and positioned above the bit line buried plug connection wirings 36 and the first layer wiring 37. Further, at least one (aluminum in this embodiment) of the materials, Al, AlCu, AlCuSi, Wsi$_2$ and Cu, is made to reflow so as to fill up the interiors of the via holes. A bit line BL connected to the bit line buried plug connection wiring 36 through the via hole portion and a second layer wiring 38 connected to the first wiring 37 through the via hole portion are formed. Further, a passivation film 39 is formed, and in a pad portion, a hole is bored.

As for the manufacture of the memory cells which each have an information storage capacitor using a ferroelectric film composed of a material having the perofskite structure or the lamellar perofskite structure and a switching transistor as mentioned above and the ferroelectric memory having a multi-wiring structure consisting of more than two layers, there is used the step of reflowing one (aluminum in this embodiment) of the materials, Al, AlCu, AlCuSi, WSi$_2$, and Cu, in order to fill up the via holes in the multi-layer structure at the bit line forming step.

In connection with the reflow of aluminum, in case the ground wiring is composed of an aluminum-based material, there is the fear that the aluminum-based wiring may be melted or voids may be produced due to the temperature when deposited by sputtering. Due to this, as the ground wiring which is directly contacted with the via metal, W metal, TiN metal or Ti metal layer is deposited by the use of the high-frequency magnetron sputtering method or the MOCVD method, whereby the metal layer 11a is selectively formed immediately below the areas which are used as the via portions of the multi-layer wiring; the layer thus formed is used as a film for preventing the formation of melt voids is formed.

Next, the steps of manufacturing the semiconductor device mentioned above by reference to the sectional views and the plane pattern shown in FIGS. 13 to 15.

First, as shown in FIG. 13, by the use of a step similar to the step of forming an ordinary CMOS type DRAM cells, the memory cell transistors 31 and the transistor 32 for the other device are formed.

Here, the reference numeral 2 denotes an element isolation region selectively formed in the surface layer portion of the substrate, D and S denote the drain region and the source region selectively formed in the element forming area of the surface portion of the substrate and having the opposite conductivity with reference to the conductivity of the substrate, numeral 3 denotes a gate oxide film for a MOS transistor formed in the surface of the substrate, G denotes a gate electrode portion (a portion of the word line WL)—formed on the gate oxide film 3—for the MOS transistor. The gate electrode portion is of a two-layer structure consisting of a polycrystalline silicon layer 4 and a WSi layer 5.

The element isolation region 2 may be formed into an optional structure such as the LOCOS film (selective oxide film), STI (Shallow Trench Isolation) or the like.

Next, on the surface of the substrate containing the surfaces of the gate electrodes G, the flattening first inter-layer insulation film (such as, e.g. a BPSG film) 10 is deposited, and then, the surface thereof is flattened by the use of the CPM method.

Next, contact holes are selectively formed in the first inter-layer insulation film 10.

Concretely, above the drain region D, a bit line contact hole is formed, and a contact hole for the capacitor plug and a contact hole for the other wiring are formed in the corresponding portions above the source regions.

Further, by the use of the sputtering method, the barrier metal film (Ti, TiN) 11 is vapor-deposited on the interiors of the contact holes and on the first inter-layer insulation film 10, and thereafter, by the use of the CVD method, a tungsten (W) film is deposited, whereby contact plugs 33, 34 and 35 are formed in the contact holes.

Next, by the use of the etch-back method or the CMP method, the surface of the first inter-layer insulation film 10 is exposed. Thereafter, as shown in FIG. 14, by the use of the sputtering method, the first SixNy film (or $TiO_2$ film) 51 is deposited over the whole surface of the first inter-layer insulation film 10.

Next, on the first inter-layer insulation film 10 containing the respective contact plugs 33, 34 and 35, Pt/Ir/IiN is vapor-deposited by sputtering to form an electrically conductive film for the capacitor lower electrode 17 (capacitor plate line PL) through the first SixNy film (or $TiO_2$ film) 51.

Further, on the capacitor lower electrode 17, a PZT film is formed as the capacitor insulting ferroelectric film 18. On this ferroelectric film 18 for a capacitor insulating film, the capacitor upper electrode 19 is formed by the use of Pt.

Then, by the use of the RIE, the capacitor upper electrode 19, the ferroelectric film 18 and the capacitor lower electrode 17 are patterned in this order to form a ferroelectric capacitor.

In this case, if the ferroelectric film 18 is damaged, it can be recovered by performing a heat treatment in an oxygen atmosphere at a temperature of 500° C. or below.

Thereafter, by the use of the sputtering method, the second SixNy film (or a $TiO_2$ film) 52 is deposited to a thickness of 100 nm.

Next, by the use of the plasma CVD, the second inter-layer insulation film 13 is deposited on the second SixNy (or $TiO_2$ film) 52, and, by the use of the chemical dry etching (CDE) method and the RIE method, the respective contact wirings 33, 34 and 35 extending to the second inter-layer insulation film 13 and the lower second SixNy (or $TiO_2$ film) 52 or the first SixNy film (or $TiO_2$ film) 51 are selectively formed, and the contact hole for connection with the upper electrode 19 is selectively formed.

Further, by the sputtering method, aluminum and tungsten (W) are deposited successively to form the capacitor electrode wiring 22 for connection between the capacitor wiring 34 and the capacitor upper electrode 19, and at the same time, the bit line connecting contact pattern 36 and the first layer wiring 37 for the compositely mounted device other than the memory cells are formed. The tungsten (W) deposited on the aluminum film is used as a tungsten film for suppressing the oxidation of the contact surface when the via filling/burying is effected.

Further, the third inter-layer insulation film 30 is formed, and, after the surface thereof is flattened by the sue of the CMP method, the via hole for connection with the bit line connecting contact pattern 36 is formed. Further, the via hole for effecting the connection of the third inter-layer insulation film 30 to the first layer wiring 37 of the compositely mounted device other than the memory cells is formed and, the second wiring layer is deposited so as to fill up the interior of the via hole by the use of the high-frequency magnetron sputtering method—performed in an argon atmosphere at 400 to 470° C.—(the aluminum reflowing method according to which aluminum is melted at high temperature to fill up the via hole migratorily), and thereafter, the second wiring layer is patterned to form the bit line BL and the second wiring 38 for the compositely mounted device.

In this way, the bit lines BL is connected to the drain regions D of the switching MOS transistor 31 of the memory cell through the via hole portion, the bit line connecting contact pattern 36 and the bit line contact plug 33.

The second layer wiring 38 for the compositely mounted device is connected to the MOS transistor 32 for the compositely mounted device other than the memory cells, through the first layer wiring 37 and the contact plug 35.

The second layer wiring 38 may be formed by directly using or patterning the film deposited through the reflow of aluminum, but can alternatively be formed in such a manner that the aluminum-based metal in the portion other than the via portions is polished, removed and flattened by CMP, and a metal which constitutes the second layer wiring 38 is deposited again and patterned.

Thereafter, in case of a semiconductor integrated circuit having the tow-layer wiring structure, a top passivation insulating film 39 is deposited, and a pad portion is bored. In case of a semiconductor integrated circuit having a wiring structure comprising three layers, four layers, or more layers, after the formation of an inter-layer insulation film 30 as mentioned above, a wiring layer is deposited by the use of aluminum reflow method, a patterning step is carried out repeatedly a required number of times, and thereafter, the top passivation insulating film 39 is deposited, and the pad portion is bored.

In this embodiment, a part of the first wiring layer when the first layer wiring 37 was formed may be used as the pad portion of the first wiring layer.

Further, in FIG. 13, there is shown the case where a hole is selectively bored, in the third inter-layer insulation film 30, above and correspondingly to the bit line contact plug 33; and thus, the bit line is contacted with the bit line connecting contact pattern 36, but it is also possible to contact the bit line with the bit line connecting contact pattern 36 at a different position by suitably drawing around, on the first insulation layer 10, the bit line connecting contact pattern 36. Therefore, the process margin can be increased, which is advantageous, particularly, in respect of enhancing the degree of freedom in design of the cell array.

In case there is employed the structure in which, at the upper layer side of the ferroelectric capacitor, the bit line BL is disposed as shown in FIG. 13 and FIG. 14, and the bit BL is formed of the second wiring layer, the degree of freedom in design of the memory cell portion is increased to a substantial degree, whereby the reduction of the cell area becomes possible, and thus, the limitation on the bit line width is reduced.

Here, description will be made by reference to the plane pattern shown in FIG. 15, The structure shown in FIG. 15 is formed in such a manner that the bit lines BL are formed with a foxed width and in a state extending above the word lines WL and in the direction orthogonal to the word lines WL; the arrangement, width, contact portions, etc. of the bit lines BL differ from those in the plane pattern of the FCOB (Ferroelectric Capacitor on Bitline) shown in FIGS. 9 to 12, but the remaining portion of the structure is identical with that of the FCOB structure.

That is, referring to FIG. 15, numeral 41 denotes a contact portion at which each bit line BL-is connected to the bit line connecting contact pattern (denoted by numeral 36 in FIG. 14) disposed in a layer lower than the bit line, and numeral 42 denotes contact portions at which a local connecting electrode wiring (denoted by numeral 22 in FIG. 14) formed in the intermediate layer between the word line WL and the bit line BL is connected to the upper electrode (denoted by numeral 19 in FIG. 14) of the stack structure capacitor formed in each unit cell and the capacitor contact-plug (denoted by numeral 34 in FIG. 14). PL denotes capacitor plate lines formed so that the lower electrodes (denoted by numeral 17 in FIG. 14) of the capacitors continue to one another.

That is, if the structure in which, at the upper layer side of the ferroelectric capacitor as shown in FIG. 13 and FIG. 14 the bit lines are disposed is adopted, then it becomes possible to form a cell array as shown in FIG. 15; and thus, it is possible to set the width of the respective bit line BL so as to be large as compared with the FCOB structure; and thus, the bit line resistance can be lowered, so that this structure is very advantageous in respect of the memory operation.

Accordingly, in case a FRAM memory and another LSI are mounted compositely or jointly, it is more advantageous to form the bit lines BL in or a layer after the second wiring layer than to form the bit lines BL below the ferroelectric capacitor or in the first layer as in the case of the FCOB structure.

Further, according to the process of manufacturing FRAM cells according to the seventh embodiment, the SixNy films (or $TiO_2$ films) 51 and 52 formed by the use of the sputtering method contain no hydroxyl group and is hard for the hydroxyl group to pass therethrough. That is, even if, at a later step, a hydroxyl group reached a point in the vicinity of the ferroelectric capacitor, it does not directly reach the ferroelectric capacitor, so that the deterioration of the ferroelectric characteristics (amount of polarization) can be minimized.

In addition, in case of forming the ferroelectric capacitor, under the oxygen atmosphere used when the ferroelectric film 18 is formed or it is annealed, the upper surfaces of the contact plugs 33, 34 and 35 are all covered with the SixNy film (or $TiO_2$ film) 51, the increase in resistance and the abnormal oxidation of the contact wirings due to thermal oxidation can be effectively prevented.

According to the conventional contact wiring technique, in case a semiconductor device constituted in such a manner that the height of a wiring layer and a wiring layer to be connected is large, and contacts having narrow widths are needed, contact wiring layers having an aspect ratio of only about 2 can be supplied, which have often turned out to be an obstacle to the realization of multi-layer structures.

Further, if attempts are made to form a wiring layer comparable to a high-aspect contact wiring layers by laying several contact wiring layers one upon another, there is the fear that a mis-alignment may occur between the connected portions of the contact wirings; and thus, there are many disadvantages such as the disadvantage that wiring layers only for connection of such contact wirings are formed.

In order to give a solution to such a problem, various techniques have been devised as techniques for forming of tapered contact holes. In Patent Laid-Open No. (Hei) 6-21238, there is disclosed the method for the manufacture of semiconductor device according to which an untapered contact and a tapered contact are electrically conducted to each other, and further, electrical conduction is effected by the use of a wiring layer and an untapered contact.

However, the above-mentioned manufacturing method goes through complicated steps, so that there is the fear that a mis-alignment may occur between the patterns to increase the contact resistance, and thus, the wiring layers may not function as good wiring layers. Further, contact wirings having an aspect ratio up to about 3 to 4 can be realized, but, from now on, in proportion as the miniaturization is more and more advanced, so that the aspect ratio becomes higher and higher exceeding 4, the manufacturing steps become more and more complicated; and thus, the buried contact wiring layers become more complicated and become harder to realize.

Figure 16A:
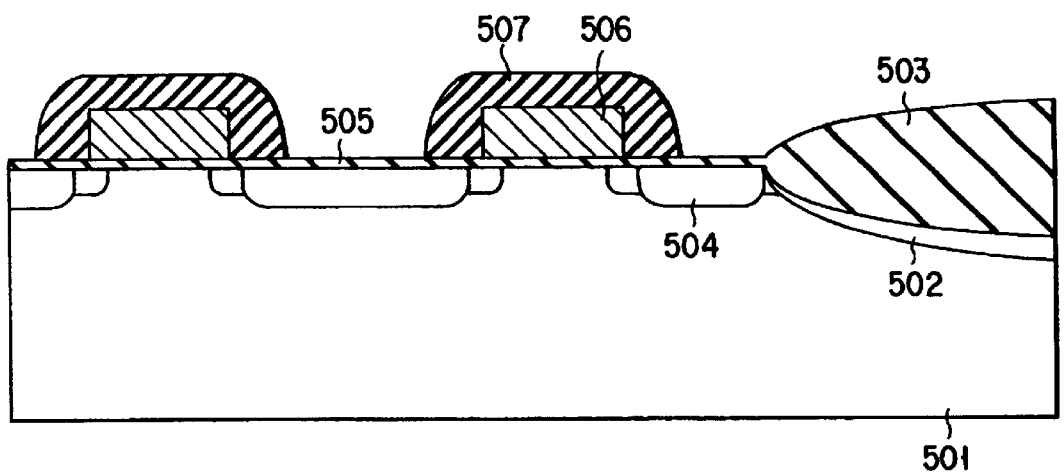
FIGS. 16A to 16F are sectional views showing in due order the manufacturing steps according to an eighth embodiment of the method for the manufacture of a semiconductor device according to the present invention.
Figure 16B:
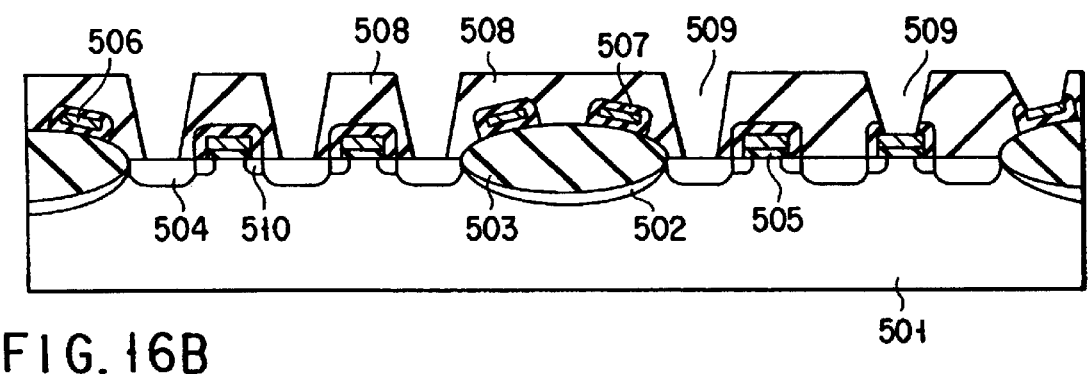
Figure 16C:
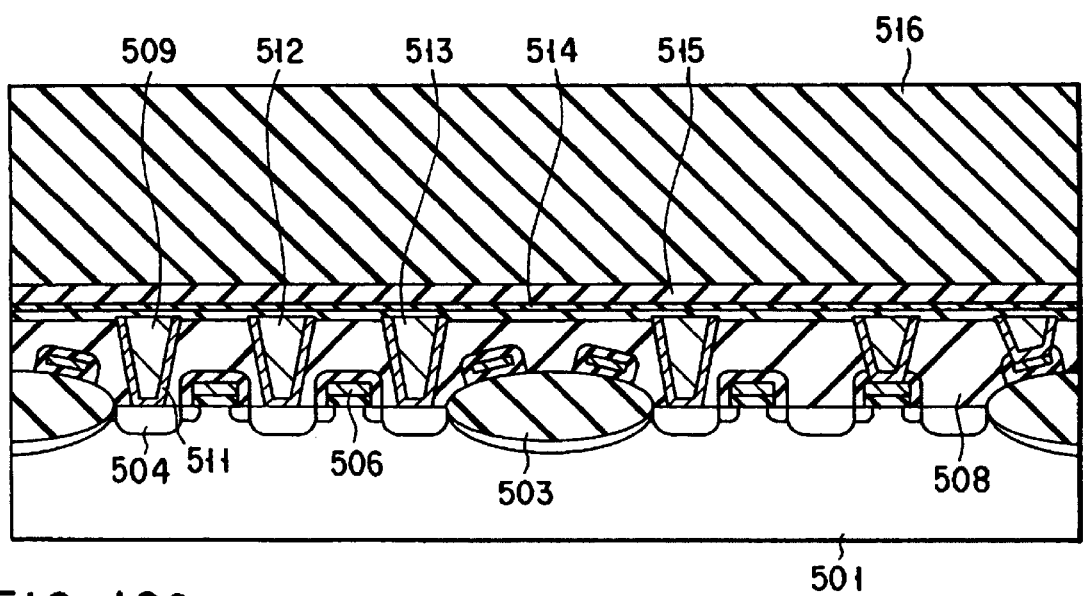
Figure 16D:
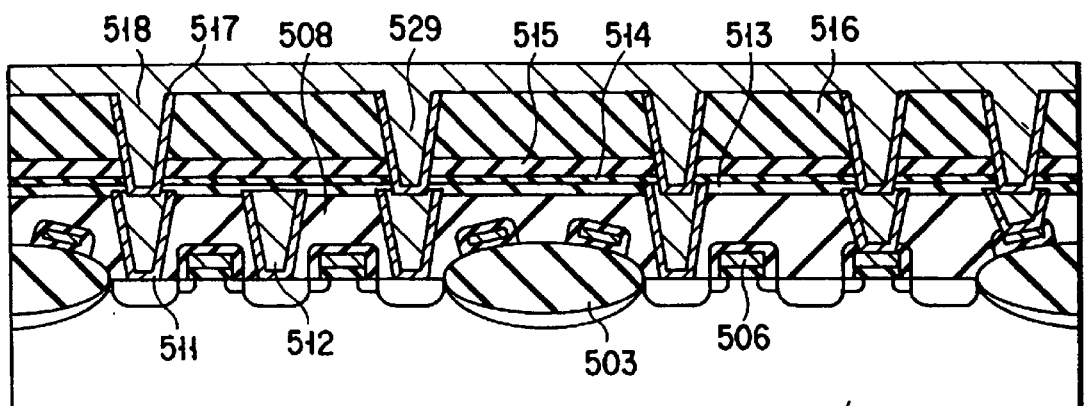
Figure 16E:
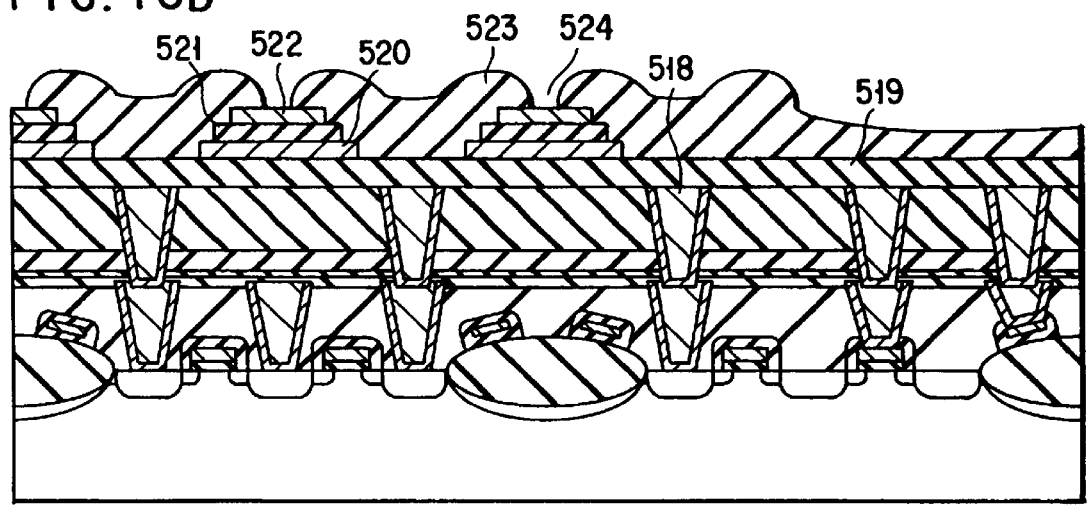
Figure 16F:
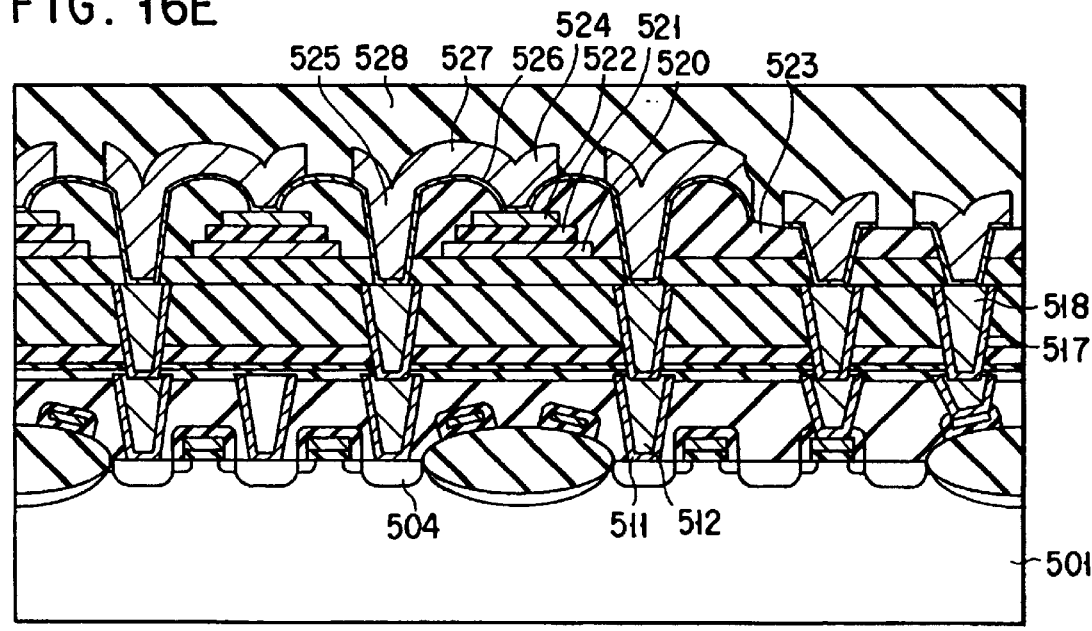
Figure 17A:
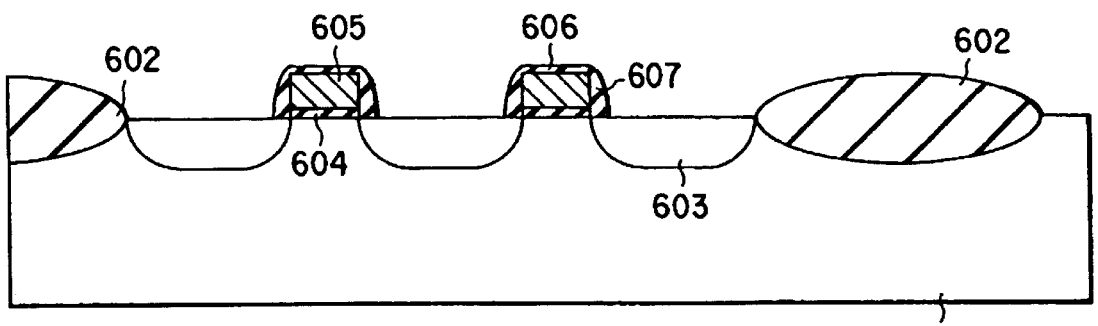
FIGS. 17A to 17O are sectional views showing in due order the manufacturing steps according to a ninth embodiment of the method for the manufacture of a semiconductor device according to the present invention.
Figure 17B:
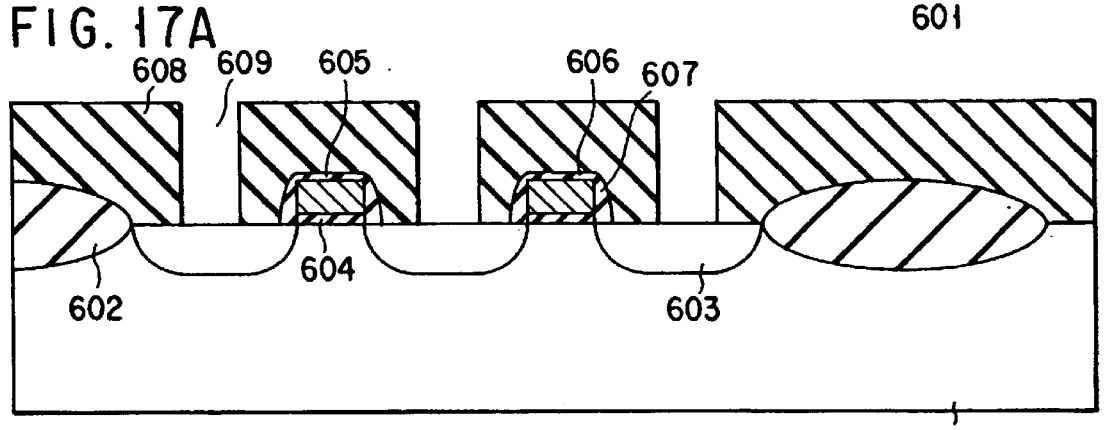
Figure 17C:
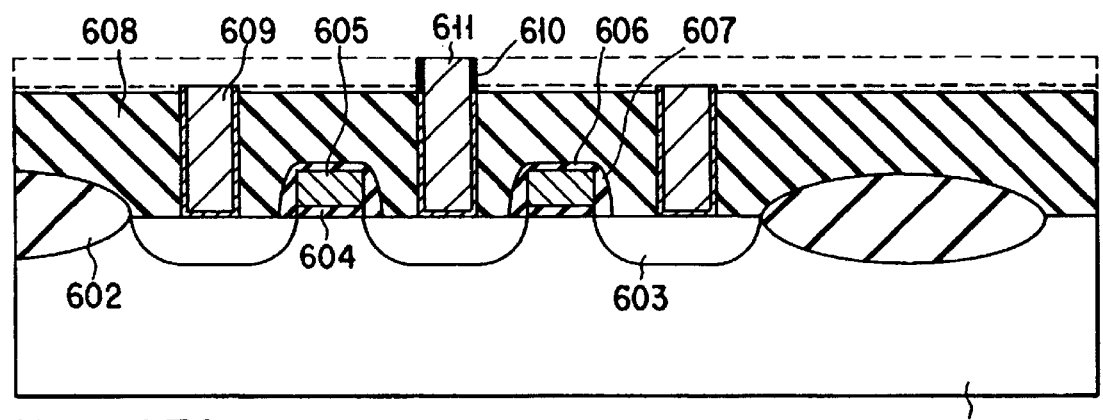
Figure 17D:
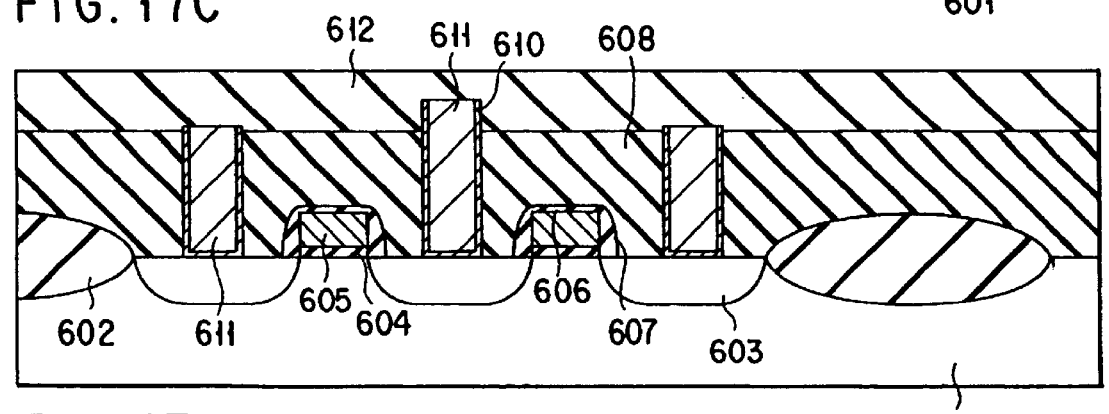
Figure 17E:
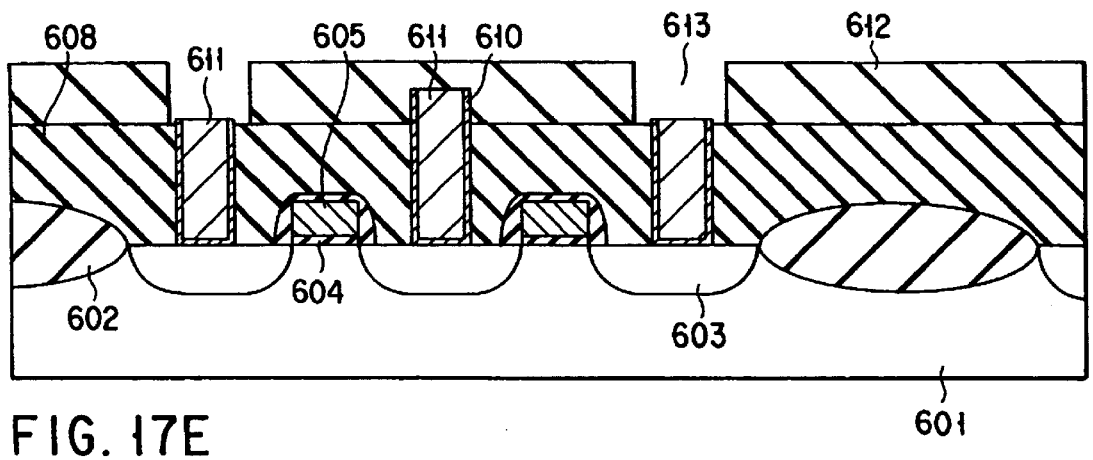
Figure 17F:
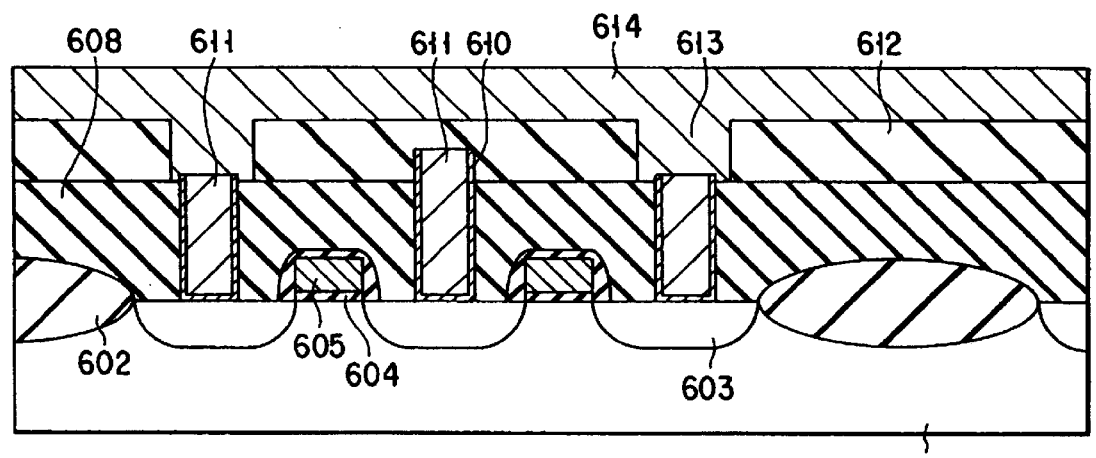
Figure 17G:
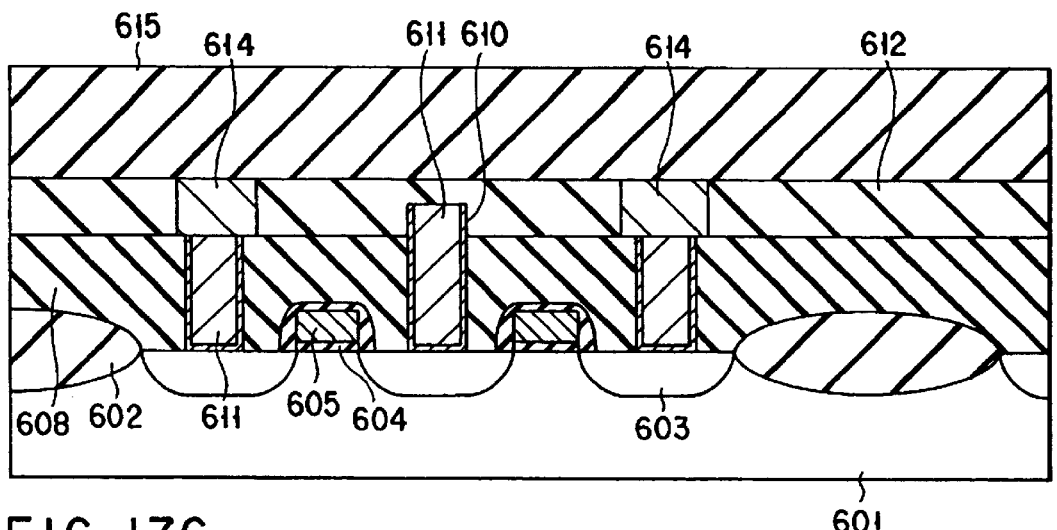
Figure 17H:
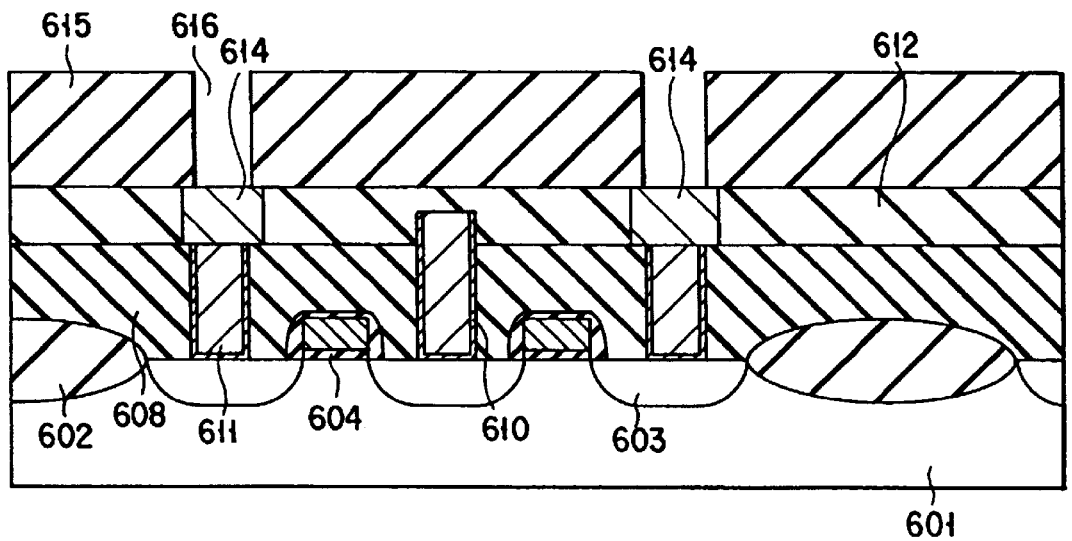
Figure 17I:
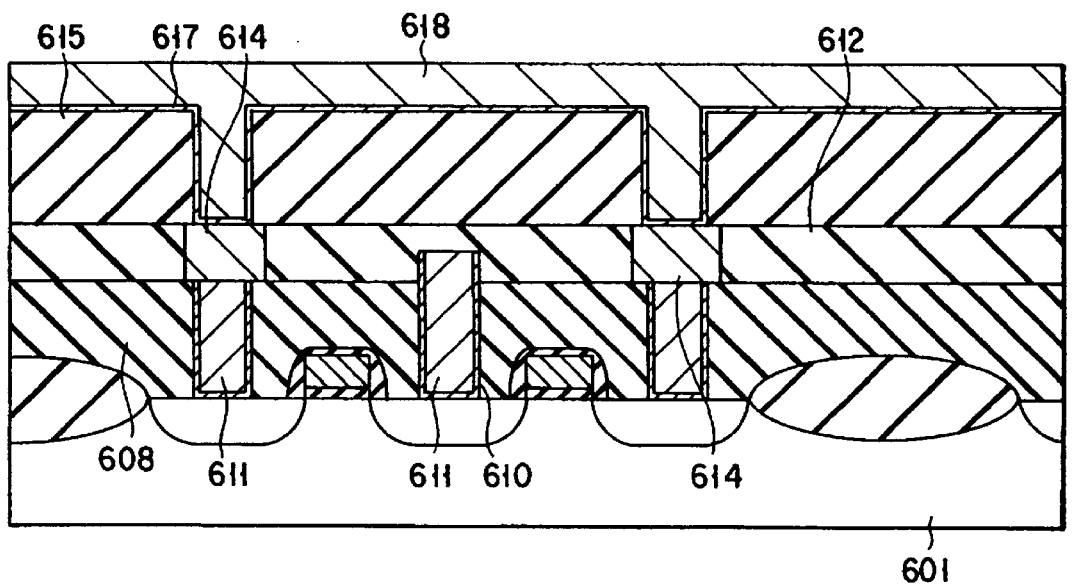
Figure 17J:
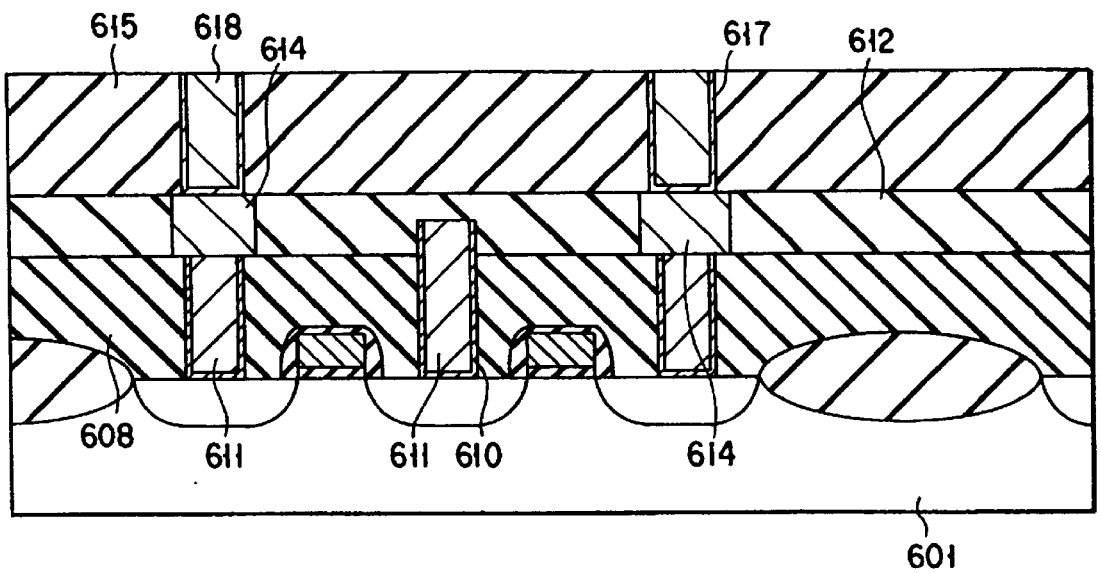
Figure 17K:
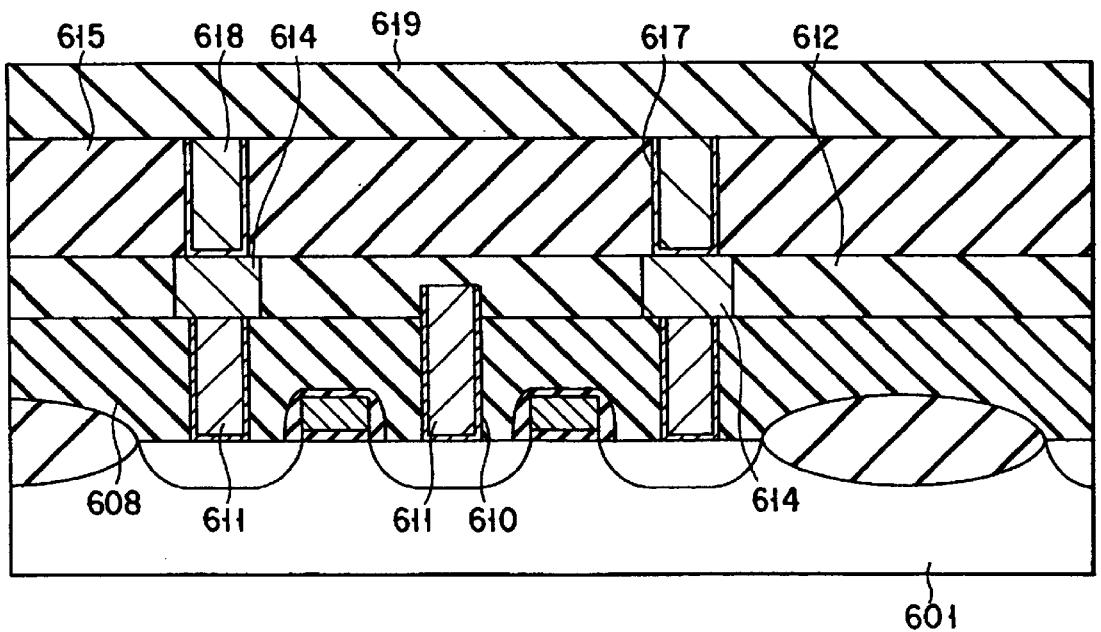
Figure 17L:
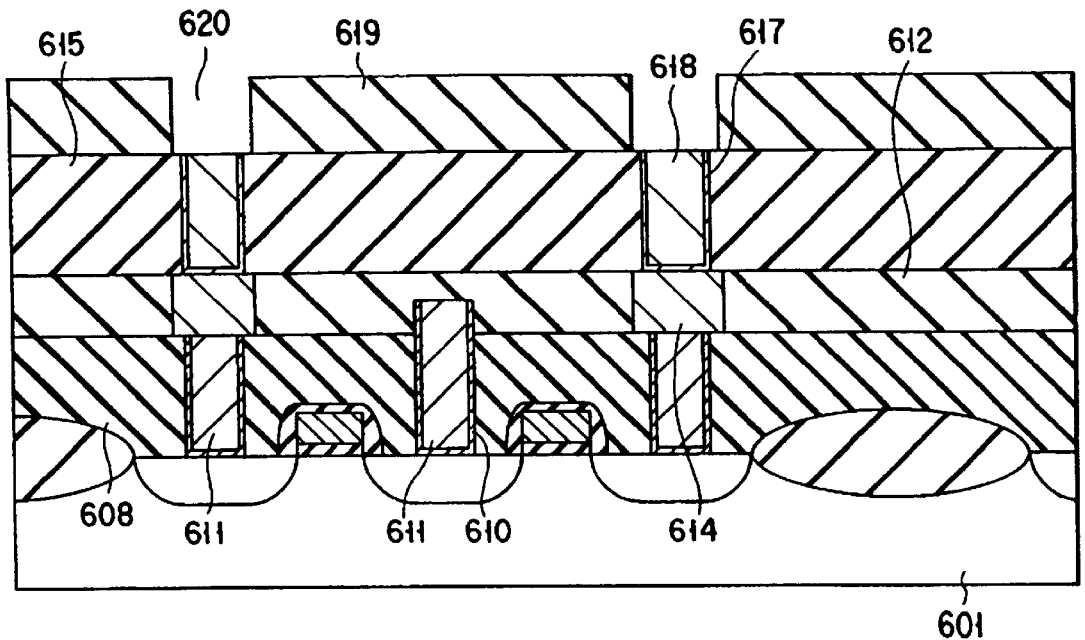
Figure 17M:
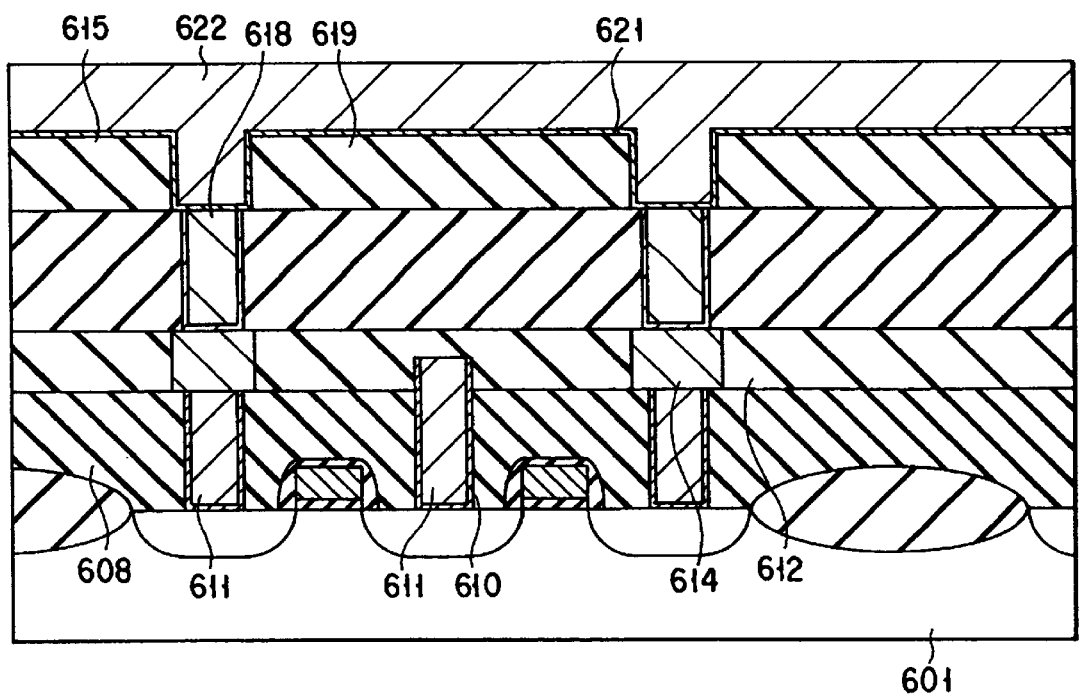
Figure 17N:
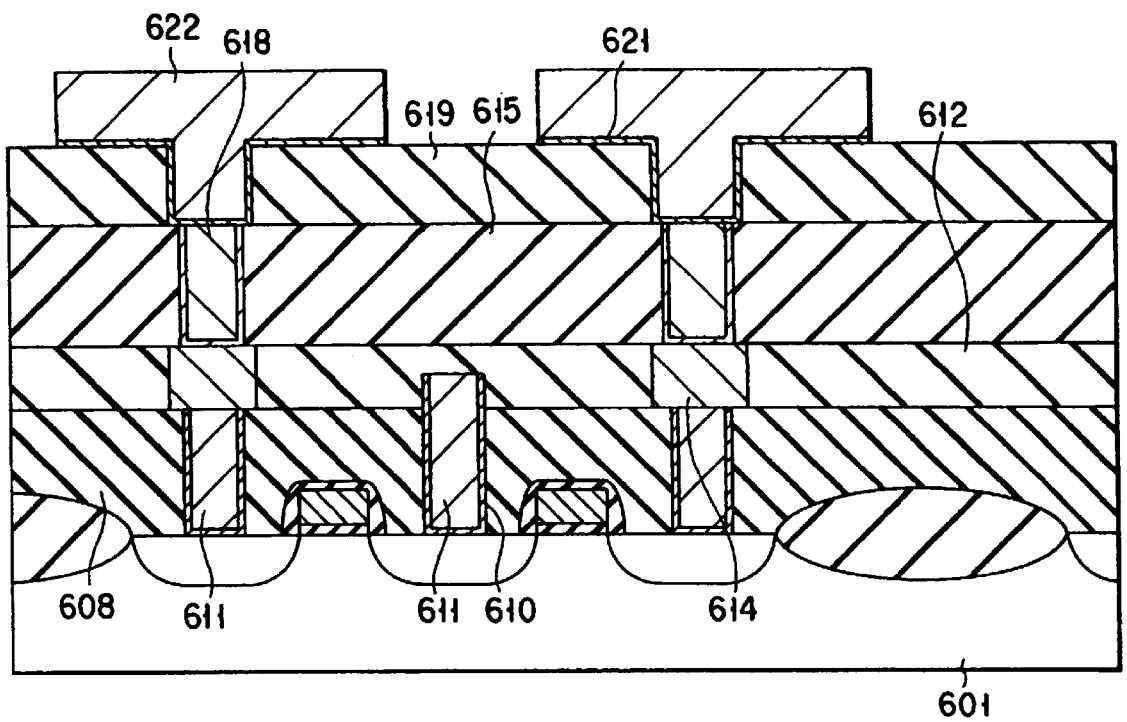
Figure 17O:
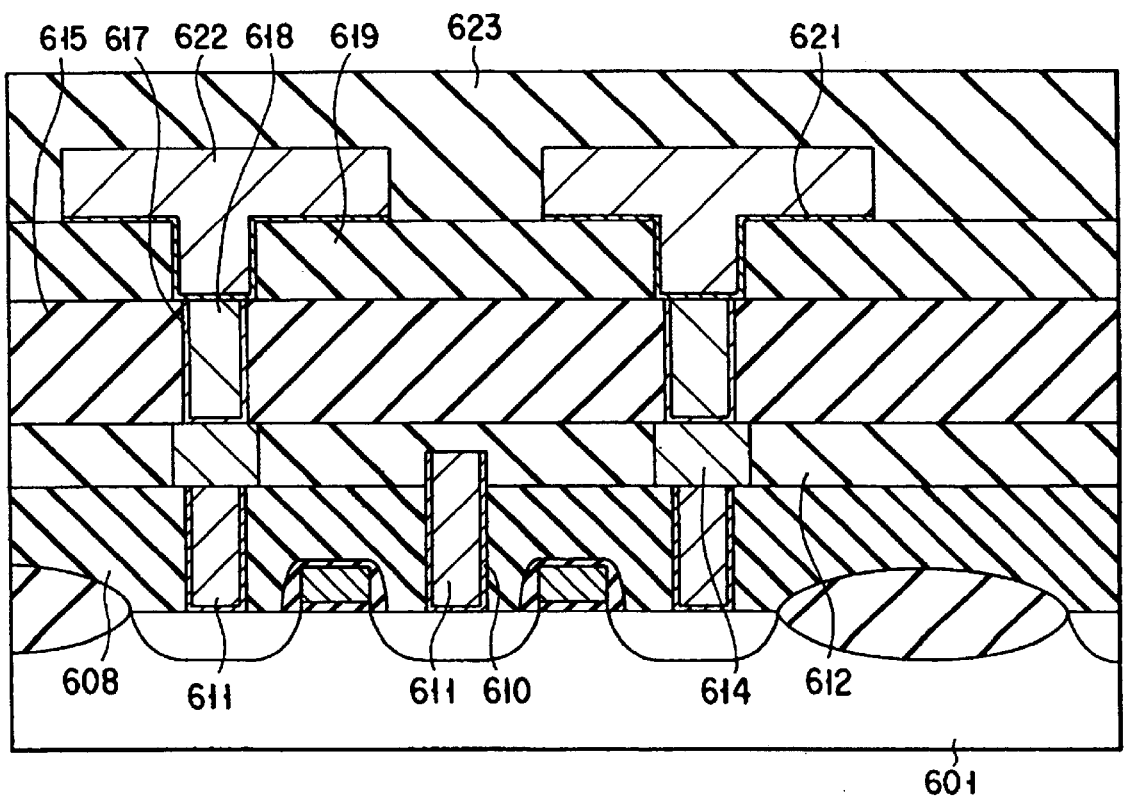

In contrast, if a contact wiring layer is constructed in such a manner that, as will set forth hereinunder in connection with an eighth embodiment of the present invention shown in FIGS. 16A to 16F and a ninth embodiment shown in FIGS. 17A to 17O, contact holes piled up in multiple stages are each formed into a shape made in such a manner that the opening portion thereof is wider than the bottom portion of the contact, or the upper contact has a larger diameter than that of the lower contact, and such contacts are piled up in multiple stages, whereby one electrically conducting contact wiring layer is formed, then it becomes possible to stably provide a contact wiring layer comparable to a contact having a far higher aspect ratio than the that of the contact wiring layer having a high aspect ratio which can be formed at the existing technical level; these embodiments are particularly effective in realizing contact wiring layers using high-melting metals Next, the eighth embodiment of the semiconductor device according to the present invention will be described by reference to FIGS. 16A to 16F.

For instance, as shown in FIG. 16A, on a P-type Si substrate 501, an element isolation reversion preventing region (channel stopper) 502 is formed by ion-implanting boron for instance at an acceleration energy of 30 Kev, at a density (dose) of about $2 \times 10^{11}$.

Thereafter, by the use of a thermal oxidation step, an element isolation region 503 is formed. Subsequently, a thin diffused layer 510 is formed by ion-implanting phosphorus for instance at an acceleration energy of 30 Kev and at a density of about $1 \times 10^{13}$, and thereafter, a gate oxide film 105 of a transistor is formed with a film thickness of, e.g. about 12 nm.

Next, a gate electrode 506 of the transistor is formed to a film thickness of about 200 nm by the use of, e.g. tungsten silicide, and, after a gate electrode protecting film 507 is formed to a thickness of about 50 nm by the use of, e.g. silicon nitride, a diffused region 504 having a high density is formed by ion implantation, for instance at an acceleration energy of 30 Kev and at a density of about $1 \times 10^{17}$.

Thereafter, as shown in FIG. 16B, an inter-layer insulation film 508 is deposited to a thickness of, e.g. 1000 nm; the inter-layer insulation film 508 is polished by the use of the CMP till the surface thereof becomes flat and the film thickness thereof becomes about 500 nm; and thereafter, in the inter-layer insulation film 508, a first contact hole 509 is bored by, for instance, anisotropic etching, on condition that oxygen is added, so that the inter-layer insulation film 508 can be tapered in such a manner that the opening portion of a first contact hole 509 becomes wider than the bottom portion thereof. In this case, the diameter of the contact is 800 nm in the opening portion thereof and 600 nm at the bottom thereof.

Subsequently, as shown in FIG. 16C, a wiring layer 511 is formed by depositing titanium nitride to a thickness of about 20 nm, and then, a wiring layer 512 is deposited to a thickness of about 300 nm by depositing for instance tungsten; and the wiring layer 511 and the wiring 512 are worked into wiring shapes as desired by anisotropic etching.

Thereafter, an inter-layer insulation film 513 is formed by depositing for instance BPSG to a thickness of 200 nm, an inter-layer insulation film 514 is formed by depositing plasma TEOS to a thickness of 100 nm, an inter-layer insulation film 515 is formed by depositing for instance TEOS to a thickness of 100 nm, and an inter-layer insulation film 516 is formed by depositing, for instance, plasma TEOS to a thickness of 1000 nm. Thereafter, the inter-layer insulation film 516 is polished by the CMP method so as to be flattened and brought to a film thickness of about 350 nm.

Next, as shown in FIG. 16D, second contact holes 529 are formed in the inter-layer insulation films 513 to 516 in such a manner that the opening portions thereof are wider than the bottom portions thereof. In this case, the second contact holes 529 each have a diameter of 800 nm in the opening portion thereof and a diameter of 600 nm at the bottom thereof and are bored by the use of the photolithographic mask which was used when the first contact holes 509 were bored—so that the second contact holes 529 may align, directly above, with the first contact holes 509 which were already bored and filled up with the wiring layer 512 and wiring layer 511.

The second contact holes 529 may be bored without using the same photolithographic mask used when the first contact holes 509 were bored, but, in order to ensure that the second contact holes 529 are positioned, without misalignment, on the desired first contact holes 509, the second contact holes 529 are bored by the use of photolithography and anisotropic etching.

Thereafter, a wiring layer 517 is formed by depositing for instance titanium nitride to a thickness of 20 nm, and then, a wiring layer 518 is formed by depositing for instance tungsten to a thickness of about 500 nm to completely bury the second contact holes 529 therein. Thereafter, the wiring layer 518 and the wiring layer 517 are polished by CMP until the surface of the inter-layer insulation film 516 comes to be exposed.

Subsequently, as shown in FIG. 16E, an inter-layer insulation film 519 is formed by depositing for instance plasma TEOS to a film thickness of about 200 nm, and then, an electrode wiring layer 520 is formed by depositing for instance PT to a thickness of about 20 nm, a capacitor insulation film 521 is formed by depositing for instance PZT to a thickness of about 200 nm, and an electrode wiring layer 522 is formed by depositing for instance Pt to a film thickness of about 200 nm.

Next, by photolithography and anisotropic etching, the electrode wiring layer 522 is patterned into an arbitrary shape. Further, by photolithography and anisotropic etching, the capacitor insulation film 521 is patterned into an arbitrary shape.

Next, by photolithography and anisotropic etching, the electrode wiring layer 520 is patterned into an arbitrary shape. Thereafter, an inter-layer insulation film 523 is formed by depositing for instance plasma TEOS to a thickness of about 300 nm.

Further, third contact holes 524 are bored, in those portions of the inter-layer insulation film 523 which lie on the electrode wiring layers 522. On the other hand, as shown in FIG. 16F, in those portions of the inter-layer insulation film 523 and the inter-layer insulation film 519 which lie on the second contact holes 529, fourth contact holes 525 are bored In this case, the diameter of the opening portion of the fourth contact holes 525 is 800 nm, and the diameter of the bottom portion thereof is 600 nm.

Thereafter, a wiring layer 526 is formed to a thickness of about 20 nm by deposition, and then, a wiring layer 527 is formed by deposition to a thickness of about 400 nm. Then, by photolithography and anisotropic etching, the wiring layer 527 and the wiring layer 526 are patterned to arbitrary shapes. Finally, a final protective insulation film 528 is formed by deposition to a thickness of for instance about 1000 nm.

In the case of the method for the manufacture of the above-mentioned semiconductor device according to the eighth embodiment, the first contact holes 509, which each have a diameter of 800 nm in the opening portion thereof and a diameter of 600 nm in its connection portion (at the bottom portion of the contact). Each contact hole constitutes a contact which has a diameter of 600 nm at the contact bottom, and a contact height of 712 nm; and thus, the aspect ratio thereof is about 1.19.

Further, the second contact holes 529, which each have a diameter of 800 nm in the opening portion thereof, a diameter of 600 nm in the connection portion and a contact height of 1050 nm; and thus, the aspect ratio thereof is about 1.75. Further, the fourth contact holes 525 each constitutes a contact which has a diameter of 600 nm at the bottom thereof, and a contact height of 1100 nm; and thus, the aspect ratio thereof is about 1.83.

The connection portions of the first, second and fourth contact holes 509, 529 and 525 have a margin against a lateral mismatch between the contacts since the upper surfaces of the respective contacts are smaller than the bottom portion of the contacts.

Further, as for the connection portions of the first, second and fourth contact holes 509, 529 and 525, the upper surface of each thereof is smaller than the contact bottom portion thereof, there is a margin pertaining to the lateral misalignment between the contacts.

Further, the first, second and fourth contact holes 509, 529 and 525 function as one contact wiring layer and, therefore, are equivalent to a vertically wired contact hole having an aspect ratio of 4.77 and thus very effective for miniaturization.

Further, the location where the contact bottom lies and parts subjected to a strict design rule gather can be finely worked to a contact diameter of about 600 nm.

According to the above-mentioned eighth embodiment, the following effects can be obtained:

(1) Since the area of the contact bottom portion is formed smaller than the area of the opening portion of the contact, micro-working becomes possible in spite of the bottom of the contact where the parts smallest in design rule gather, that is, in spite of the fact that the contact has a high aspect ratio in the vicinity of the connecting portion thereof.

(2) To the opening portion of a contact whose bottom portion area is smaller than the area of the opening portion thereof, the bottom portion of a contact of which (bottom portion) is smaller in area than the opening portion thereof, whereby it becomes possible to provide a margin for a mis-alignment without relaxing the design for connecting the contacts to each other.

(3) In case of connecting the contacts to each other, the wiring layer for connecting the contact wirings between the contact and the contact to be connected to each other is disused, and thus, the increase in area of the device due to the contact connection can be suppressed.

(4) It is possible to form a contact which is vertically disposed and has a very high aspect ratio can be formed, and the area necessary to form the contact can be determined depending on the diameter of the opening portion of the contact.

(5) By the use of two or more kinds of contact wiring burying materials, it becomes possible to prevent the deterioration of the characteristics of the contact wiring due to steps after the formation of the contact wiring and to improve the close adhesion when the contacts are connected to each other.

(6) By performing a contact burying step more than twice, it becomes possible to improve the covering of the contact wiring layer.

(7) Contacts which are each constituted in such a manner that the opening portion of the contact is larger than the bottom portion thereof and which each have a large aspect ratio are laid one upon another into one contact wiring layer, whereby the increase in size of the chip due to the fact that the contact connections are increased due to the multi-layer formation can be suppressed.

Next, a ninth embodiment of the present invention will be described by reference to FIGS. 17A to 17O.

First, as shown in 17A, on an, e.g. P-type Si substrate 601, an element isolation region 602 is formed, for instance, by an oxidation step. Thereafter, a gate oxidation film 604 of a transistor is formed to a film thickness of for instance about 12 nm, and then, a gate electrode 605 of the transistor is formed to a thickness of about 200 nm by the use of tungsten silicide.

Next, a gate protective film 606 of the transistor is formed, and, after a diffused layer region 603 is formed by ion implantation, for instance, at an acceleration energy of 30 Kev and at a density of about $1\times10^{17}$, a gate electrode protective film 607 is formed to a thickness of about 50 nm by the use of for instance silicon nitride.

Next, as shown in FIG. 17B, for instance TEOS is deposited to a thickness of 1000 nm to form an inter-layer insulation film 608, and thereafter, the inter-layer insulation film 608 is polished by CMP so that the surface thereof may become flat and the film thickness thereof may become about 500 nm, and then, by anisotropic etching, first contact holes 609 are bored in the inter-layer insulation film 608, in which case the diameter of the contacts is set to, e.g. 600 nm.

Subsequently, as shown in FIG. 17C, a wiring layer 610 is formed by depositing for instance titanium nitride to a thickness of about 20 nm, and then, a wiring layer 611 is formed by depositing, for instance, tungsten to a thickness of about 300 nm; and, by anisotropic etching, the wiring layer 610 and the wiring layer 611 are worked into desired wiring shapes at the same time.

Thereafter, as shown in FIG. 17D, an inter-layer insulation film 612 which can sufficiently provide the selection ratio of the anisotropic etching with respect to the inter-layer insulation film 608 is formed by depositing for instance SiN to a thickness of about 800 nm, and thereafter, by CMP, the inter-layer insulation film 612 is polished to flatten it until the surface thereof becomes flat and the film thickness thereof becomes, for instance, about 350 nm.

Next, as shown in FIG. 17E, second contact holes 613 are bored in the inter-layer insulation film 612 so that the second contact holes 613 may connect to the first contact holes 609 and may have a larger diameter than the diameter of the contract holes 609. In this case, the diameter of the second contact holes 613 is, for instance, 800 nm and thus opens so as to be positioned directly above and aligned with the wiring layers 611 already buried in the first contact holes 609.

Thereafter, as shown in FIG. 17F, a wiring layer 614 is formed by depositing, for instance, tungsten to a thickness of about 500 nm to completely bury the second contact hole 613 therein.

In this case, it is also preferable to bury TiN or the like to a thickness of about 20 nm as an electrically conductive material before the wiring layer 614 is provided, so that the close adhesion between the contacts can be improved.

Further, as shown in FIG. 17G, the wiring layer 614 is polished by CMP until the surface of the inter-layer insulation film 612 comes to be exposed. Thereafter, an inter-layer insulation film 615 is formed by depositing, for instance, a plasma TEOS film to a thickness of about 800 nm, and then, the inter-layer insulation film 615 is polished by CMP until it becomes flat and the film thickness thereof becomes for instance about 500 nm.

Subsequently, as shown in FIG. 17H, third contact holes 616 are bored in the inter-layer insulation film 615 so as to connect directly to the upper surfaces of the wiring layers 614 already buried in the contact holes 613. In this case, the diameter of the third contact holes 616 is set to, for instance, 600 nm.

Thereafter, as shown in FIG. 17I, a wiring layer 617 is formed by depositing for instance TiN to a thickness of about 20 nm, and a wiring layer 618 is formed by depositing for instance tungsten to a thickness of about 500 nm, theses films being formed by deposition in succession so as to completely bury the contact holes 616 therein.

Then, as shown in FIG. 17J, the wiring layer 618 and the wiring layer 617 are polished by CMP until the surface of the inter-layer insulation film 615 comes to be exposed. Thereafter, as shown in FIG. 17K, an inter-layer insulation film 619 is formed by depositing to a thickness of about 800 nm a material (such as, e.g. SixNy) which allows a sufficient provision of a selection ratio of the anisotropic etching with respect to the inter-layer insulation film 615.

Further, by CMP, the interlayer insulation film 619 is polished until it becomes flat and the film thickness thereof becomes for instance about 400 nm.

Next, as shown in FIG. 17L, in the inter-layer insulation film 619, fourth contact holes 620 are bored so as to connect directly to the very upper surfaces of the wiring layers 618 already buried in the third contact holes 616 and so as to have a diameter larger than the diameter of the third contact holes 616 shown in FIG. 17H. In this case, the diameter of the fourth contact holes 620 is set to 800 nm.

Thereafter, as shown in FIG. 17M, a wiring layer 621 is formed by depositing for instance TiN to a thickness of about 20 nm. Further, a wiring layer 622 is formed by depositing for instance aluminum to a thickness of about 500 nm so as to completely bury the contact holes 620 therein.

Subsequently, as shown in FIG. 17N, by anisotropic etching, the wiring layer 622 and the wiring layer 621 re worked into desired shapes at the same time. Thereafter, as shown in FIG. 17D, a final insulation film 623 is formed by deposition. Further, a charge storage capacitor (not shown) is suitably formed so as to be connected in such a manner that the upper electrode or the lower electrode thereof is connected the wiring layer 622.

As shown in the above-describe ninth embodiment, the contact holes 609 which have a small diameter, the contact holes 613 which have a large diameter, the contact holes 616 which have a small diameter, and the contact holes 620 which have a large diameter are vertically connected to each other, whereby, when the contact diameter is set to 600 nm, a contact wiring layer having an aspect ratio of about 3.82 can be realized.

The thick contact portion having a diameter of 800 nm which constitutes a multi-stage contact formed by a process as described above is formed in the portion which is not crowded with the wirings in the plane direction, so that it does not influence on the dimensional increase in the plane direction of the device.

Further, the inter-layer insulation film in which the contact holes of the contacts to be connected is formed by the use of an insulating material which can sufficiently provide a selection ratio at the time of etching with respect to the inter-layer insulation film formed in which the contact holes of the already formed contacts are formed, as a result of which the danger that, by an excessive etching when the contact holes are bored, the inter-layer insulation film may be deeply etched to reach another wiring, shorting may be caused by the subsequent wiring burying step, can be avoided.

Further, the contact constituting the contact wiring layers formed in multiple stages is formed in such a manner that, on a contact having a small diameter, a contact having a large diameter is connected, whereby there can be secured a margin for a mis-alignment in the plane direction when the contacts are connected to each other.

According to the ninth embodiment described above, the following effects can be obtained:

(1) The substrate surface which is crowded with parts which are smallest in design rules and the same hierarchical portions as the wiring layers can be micro-worked since a contact which has a small contact diameter and a high aspect ratio can be intentionally used.

(2) In case the contacts are connected to each other, it becomes unnecessary to provide a wiring layer for connecting the contact wirings between the contact and the contact to be connected, so that the increase in area of the device due to the connection of the contacts can be suppressed, and the manufacturing steps can be simplified.

(3) By connecting a contact having a small diameter onto a contact having a larger diameter, it becomes possible to provide a large margin for misalignment in the connection of the contacts. Further, by setting a sufficient selection ratio when the upper and lower inter-layer insulation films in which such contact holes are bored are etched, it becomes possible to avoid the shorting thereof with other wiring layers due to an excessive etching.

(4) By using two or more kinds of contact wiring burying materials, the deterioration of the contact wirings due to the steps performed after the formation of the contact wirings can be prevented, and the close adhesion between the contacts when they are connected together can be improved.

(5) By carrying out a contact burying step two or more times, the covering of the contact wiring layers can be improved.

(6) Contacts having large aspect ratios are almost vertically stacked in approximately multiple stages into one contact wiring layer, whereby the increase in size of the chip due to the increase in contact connections due to the multi-layer formation can be suppressed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of forming, in the upper layer portion of a semiconductor substrate, a switching transistor including a drain region and a source region which are comprised of an impurity-diffused layer;

forming a first insulation film above the semiconductor substrate containing the transistor;

forming, on the first insulation film, a first electrically conductive film for a lower electrode;

forming a second insulation film on the first electrically conductive film;

forming a dielectric-film burying opening in the second insulation film selectively;

forming a dielectric film on the second insulation film containing said dielectric-film burying opening, the dielectric film constituting an inter-electrode insulation film composed of one of ferroelectric and high-permittivity dielectric;

removing the portion, lying on the second insulation film, of the dielectric film which is other than the dielectric film portion buried in the dielectric-film burying opening, the dielectric film portion buried in the dielectric-film burying opening being for a charge storage capacitor;

forming a second electrically conductive film for the upper electrode, on the second insulation film and the dielectric film; and forming the charge storage capacitor by successively patterning the second electrically conductive film, the second insulation film and the first electrically conductive film.

2. A method for manufacturing a semiconductor device according to claim 1, wherein said step of removing the portion of the dielectric film lying on the second insulation film removes the portion of the dielectric film other than the dielectric film portion which is buried in the dielectric-film burying opening and the dielectric film portion which continues to the just-mentioned dielectric film portion and lies on the second insulation film potion in the vicinity of the peripheral edge of the opening.

\* \* \* \* \*